(12) United States Patent
Yoon et al.

(10) Patent No.: US 9,947,877 B2
(45) Date of Patent: Apr. 17, 2018

(54) ORGANIC LIGHT EMITTING DISPLAY DEVICE

(71) Applicant: LG DISPLAY CO., LTD., Seoul (KR)

(72) Inventors: Seunghee Yoon, Seoul (KR); Sunghoon Joo, Paju-si (KR); Jeongdae Seo, Incheon (KR); Hyoseok Kim, Daejeon (KR); Hyeseung Kang, Seoul (KR); Seonkeun Yoo, Gunpo-si (KR); Min Yun, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 2 days.

(21) Appl. No.: 15/079,757

(22) Filed: Mar. 24, 2016

(65) Prior Publication Data

US 2016/0285010 A1 Sep. 29, 2016

(30) Foreign Application Priority Data

Mar. 25, 2015 (KR) ........................ 10-2015-0041589

(51) Int. Cl.
*B32B 9/00* (2006.01)
*H01L 51/00* (2006.01)
*C09K 11/06* (2006.01)
*H01L 51/50* (2006.01)

(52) U.S. Cl.
CPC .......... *H01L 51/0072* (2013.01); *C09K 11/06* (2013.01); *H01L 51/0052* (2013.01); *H01L 51/0054* (2013.01); *H01L 51/0055* (2013.01); *H01L 51/5028* (2013.01); *H01L 51/5036* (2013.01); *H01L 51/5044* (2013.01); *H01L 51/5072* (2013.01)

(58) Field of Classification Search
CPC .. C07F 9/587; C07F 15/06; C09K 2211/1029; C09K 2211/1044; C09K 2211/187
See application file for complete search history.

(56) References Cited

U.S. PATENT DOCUMENTS

2012/0012794 A1* 1/2012 Fadhel ................. C07D 471/04
252/500

FOREIGN PATENT DOCUMENTS

| CN | 104282840 A | 1/2015 |
| EP | 2194055 A1 | 6/2010 |
| EP | 2833700 A1 | 2/2015 |
| KR | 10-2014-128653 A | 11/2014 |

* cited by examiner

*Primary Examiner* — Shane Fang
(74) *Attorney, Agent, or Firm* — Birch, Stewart, Kolasch & Birch, LLP

(57) ABSTRACT

An organic light emitting display device is discussed. The organic light emitting display device in one embodiment includes at least one light emitting part between an anode and a cathode, and including at least one organic layer and a light emitting layer, wherein the organic layer includes a compound having one or more nitrogen atoms and a substituent with relatively high electron mobility.

12 Claims, 5 Drawing Sheets

ORGANIC LIGHT EMITTING DISPLAY DEVICE

This application claims the priority benefit of Korean Patent Application No. 10-2015-0041589 filed on Mar. 25, 2015, which is hereby incorporated herein by reference for all purposes as if fully set forth herein.

BACKGROUND OF THE INVENTION

Field of the Invention

The present disclosure relates to an organic light emitting display device, and more particularly, to an organic light emitting display device which has reduced operating voltage and improved efficiency.

Discussion of the Related Art

Image displays used for displaying a variety of information on the screen are one of the core technologies of the information and communication era. Such image displays have been developed to be thinner, lighter, and more portable, and furthermore to have high performance. With the development of the information society, various demands for display devices are on the rise. To meet these demands, research on panel displays such as liquid crystal displays (LCD), plasma display panels (PDP), electroluminescent displays (ELD), field emission displays (FED), organic light emitting diodes (OLED), etc. is actively under way.

Among these types of panel displays, the OLED devices are a type of devices that emit light as electrons and holes are paired and then extinguished, when a charge is injected into an organic light emitting layer between an anode and a cathode. The OLED devices are advantageous in that they can be formed on a flexible transparent substrate such as plastic, can be driven at relatively low voltage, less power consumption, and excellent color sensitivity, as compared to plasma display panels or inorganic EL displays. Especially, white OLED devices are used for various purposes in lighting, thin light sources, backlights for liquid crystal displays, or full-color displays employing color filters.

In the development of white OLED devices, high efficiency, long lifetime, color purity, color stability against current and voltage variations, ease of manufacture, etc are important, so research and development are being done depending on which of these features should be taken into account. White OLED device structures may be roughly classified into a single-layer emitting structure and a multilayer emitting structure. Of these structures, the multilayer emitting structure having a blue fluorescent emitting layer and a yellow phosphorescent emitting layer stacked in tandem is mainly employed to realize white OLED devices with long lifetime.

Specifically, a phosphorescent emitting structure is used, which is a lamination of a first light emitting part using a blue fluorescent diode as a light emitting layer and a second light emitting part using a yellow phosphorescent diode as a light emitting layer. Such a white OLED device produces white light by mixing blue light emitted from the blue fluorescent diode and yellow light emitted from the yellow phosphorescent diode. A charge generation layer is between the first light emitting part and the second light emitting part to double the current efficiency generated in the light emitting layers and facilitate charge distribution. The charge generation layer comprises an N-type charge generation layer and a P-type charge generation layer.

However, the overall operating voltage of a device having the aforementioned multilayer emitting structure may be higher than the sum of the operating voltages of individual light emitting parts, or the multilayer emitting device may decrease in efficiency compared to a single-layer emitting structure. Especially, if the N-type charge generation layer is doped with an alkali metal or alkali earth metal, the lifetime of the device may be decreased. Also, the difference in LUMO (lowest unoccupied molecular orbital) energy level between the P-type charge generation layer and the N-type charge generation layer deteriorates the property of injecting electrons generated at the interface between the P-type charge generation layer and the hole transport layer into the N-type charge generation layer. Moreover, the difference in LUMO energy level between the electron transport layer and the N-type charge generation layer causes a rise in operating voltage when the electrons injected into the N-type charge generation layer move to the electron transport layer.

SUMMARY OF THE INVENTION

An aspect of the present disclosure is directed to an organic light emitting display device which has reduced operating voltage and improved light emission efficiency.

To achieve these and other advantages and in accordance with the purpose of the invention, as embodied and broadly described, an exemplary embodiment of the present disclosure provides an organic light emitting display device comprising at least one light emitting part between an anode and a cathode, and including at least one organic layer and a light emitting layer, wherein the at least one organic layer includes a compound having one or more nitrogen atoms and a substituent with relatively high electron mobility.

The at least one organic layer includes at least one electron transport layer or at least one N-type charge generation layer.

The compound includes at least three or more nitrogen atoms and the substituent with relatively high electron mobility includes at least one substituent, and the at least three or more nitrogen atoms or the at least one substituent with relatively high electron mobility enables electron transfer from the organic layer to the light emitting layer.

The at least one light emitting part comprises two or more light emitting parts, and any one of the two or more light emitting parts includes a blue light emitting part, and another one of the two or more light emitting parts includes a yellow-green light emitting part.

The at least one organic layer includes an electron transport layer that included in the yellow-green light emitting part.

The compound is represented by the following Chemical Formula 1:

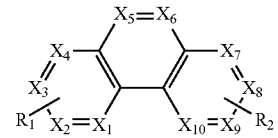

[Chemical Formula 1]

wherein $X_1$ to $X_{10}$ comprise at least three or more N atoms, and $X_1$ to $X_{10}$ with no corresponding N atoms include C atoms, and $R_1$ and $R_2$ include independently one among hydrogen, heavy hydrogen, a halogen atom, a cyano group, a nitro group, an amino group, an amidino group, hydrazine, hydrazone, a carboxyl group and a salt thereof, a sulfonic acid group and a salt thereof, a phosphate group and a salt thereof, a substituted or unsubstituted alkyl group with 1 to 60 carbon atoms, a substituted or unsubstituted alkenyl group with 2 to 60 carbon atoms, a substituted or unsubstituted alkynyl group with 2 to 60 carbon atoms, a substituted or unsubstituted alkoxy group with 1 to 60 carbon atoms, a substituted or unsubstituted cycloalkyl group with 3 to 60 carbon atoms, an aromatic ring compound with 5 to 50 carbon atoms or a heterocyclic compound having one or more atoms among N, S, O, or Si with 3 to 50 carbon atoms.

The compound includes one among the following compounds:

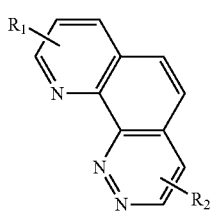

Pn-1

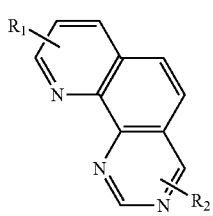

Pn-2

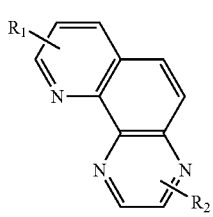

Pn-3

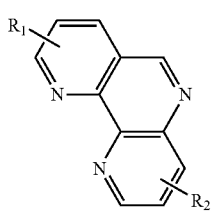

Pn-4

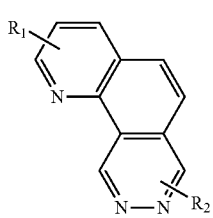

Pn-5

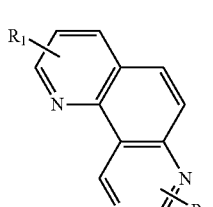

Pn-6

-continued

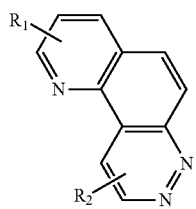

Pn-7

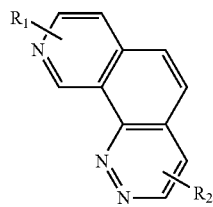

Pn-8

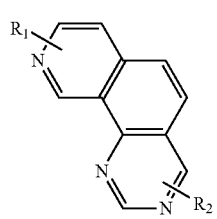

Pn-9

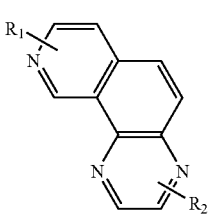

Pn-10

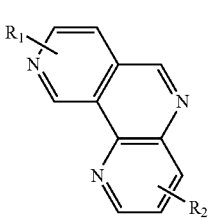

Pn-11

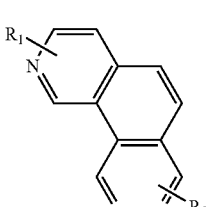

Pn-12

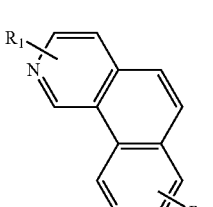

Pn-13

Pn-14 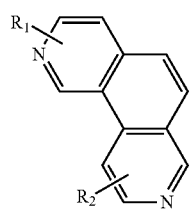
Pn-15 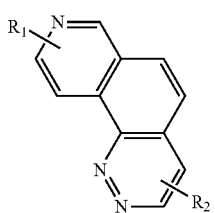
Pn-16 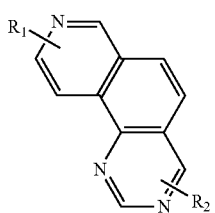
Pn-17 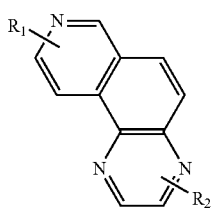
Pn-18 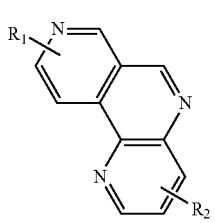
Pn-19 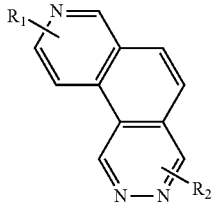
Pn-20 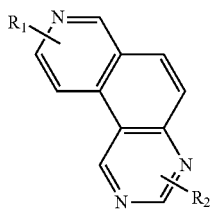
Pn-21 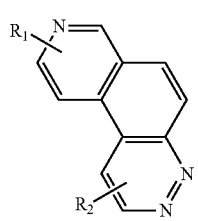
Pn-22 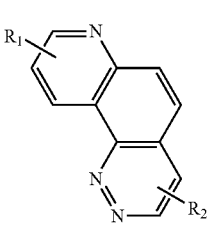
Pn-23 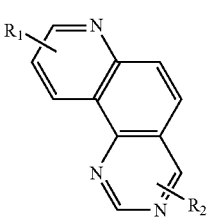
Pn-24 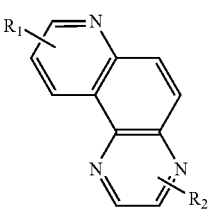
Pn-25 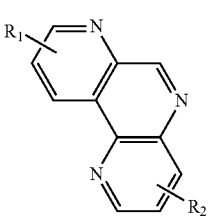
Pn-26 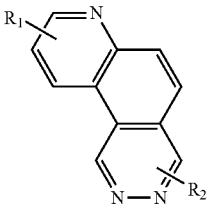
Pn-27 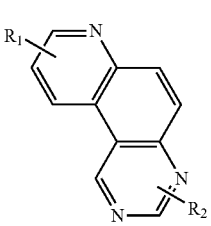

-continued
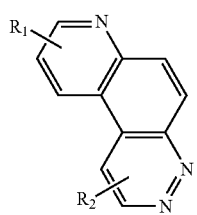
Pn-28
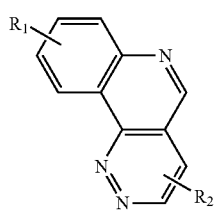
Pn-29
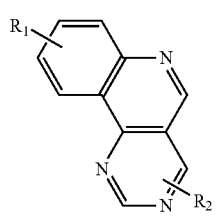
Pn-30
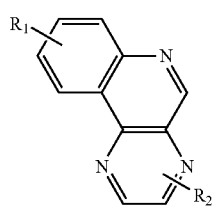
Pn-31
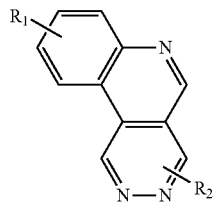
Pn-32
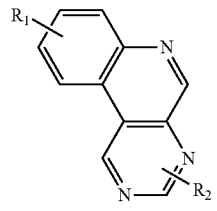
Pn-33
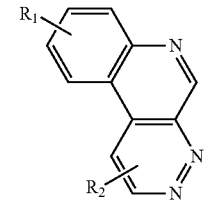
Pn-34
-continued
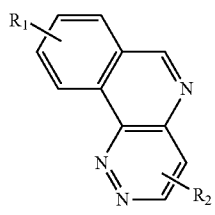
Pn-35
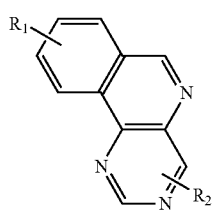
Pn-36
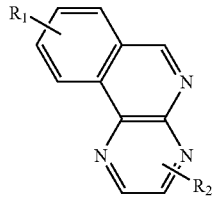
Pn-37
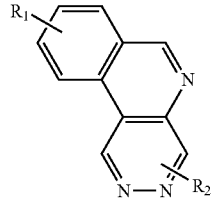
Pn-38
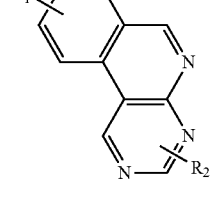
Pn-39
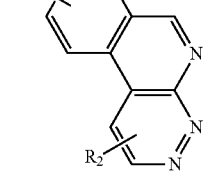
Pn-40
The compound includes one among the following compounds:
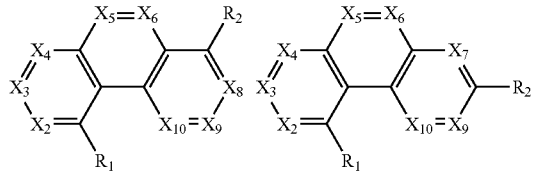

-continued
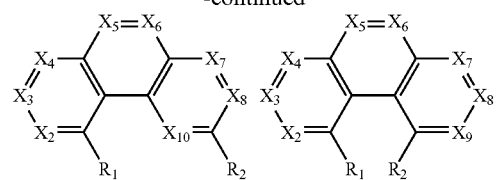
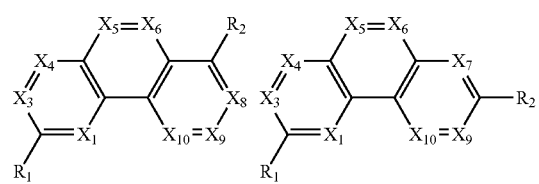
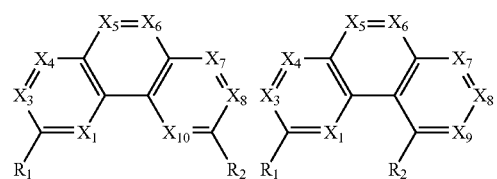
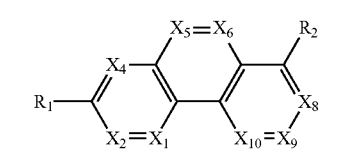
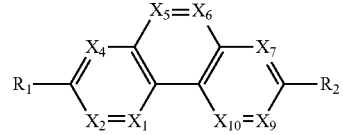
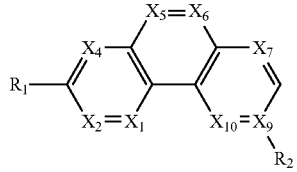
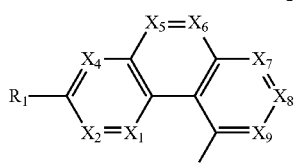
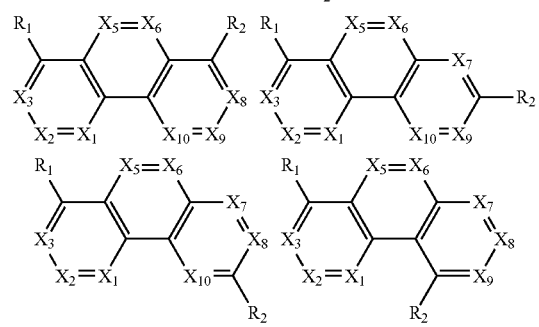
$R_1$ and $R_2$ include independently one among the following groups:
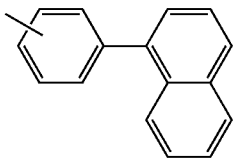
A-01
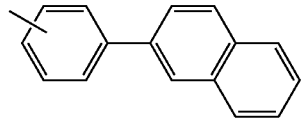
A-02
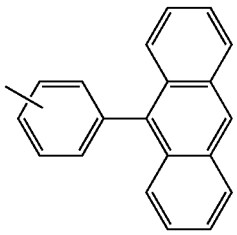
A-03
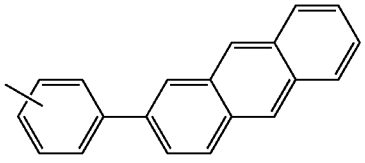
A-04
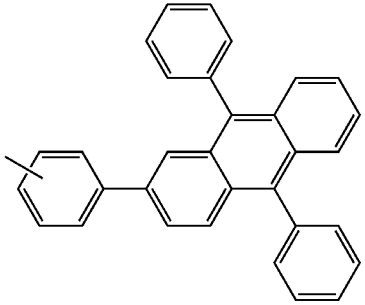
A-05
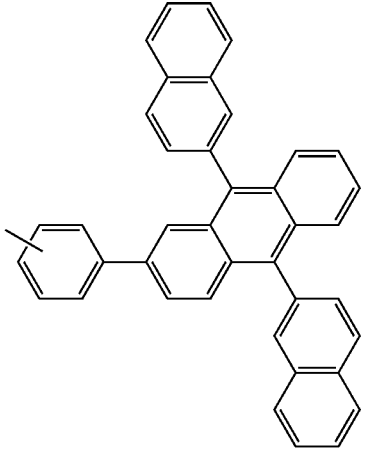
A-06

A-07
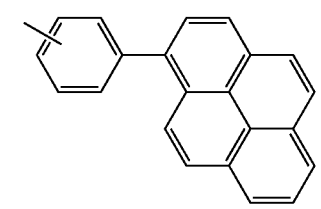
A-08
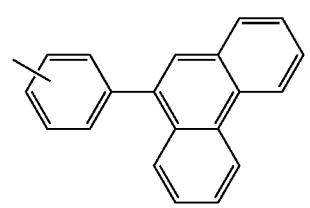
A-09
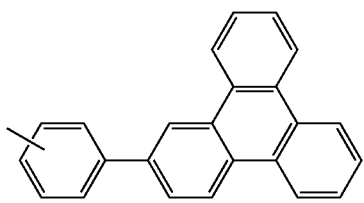
A-10
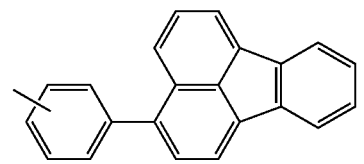
A-11
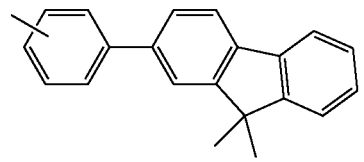
A-12
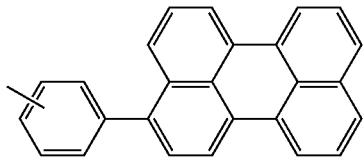
A-13
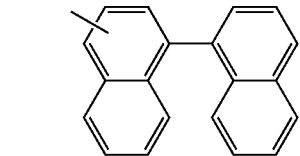
A-14
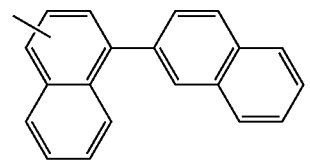
A-15
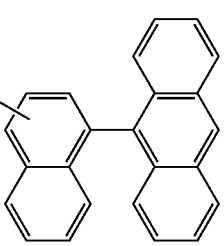
A-16
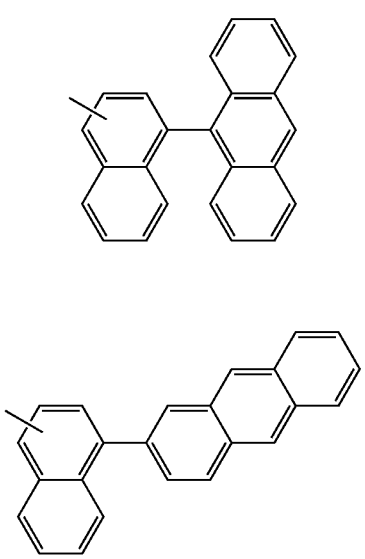
A-17
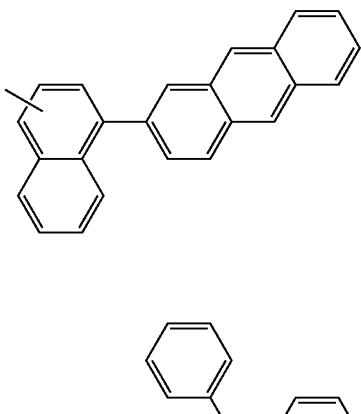
A-18
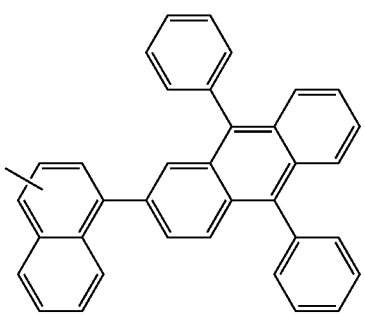
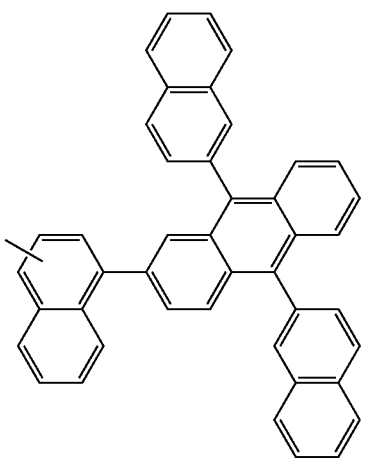
A-19
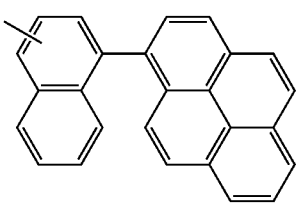

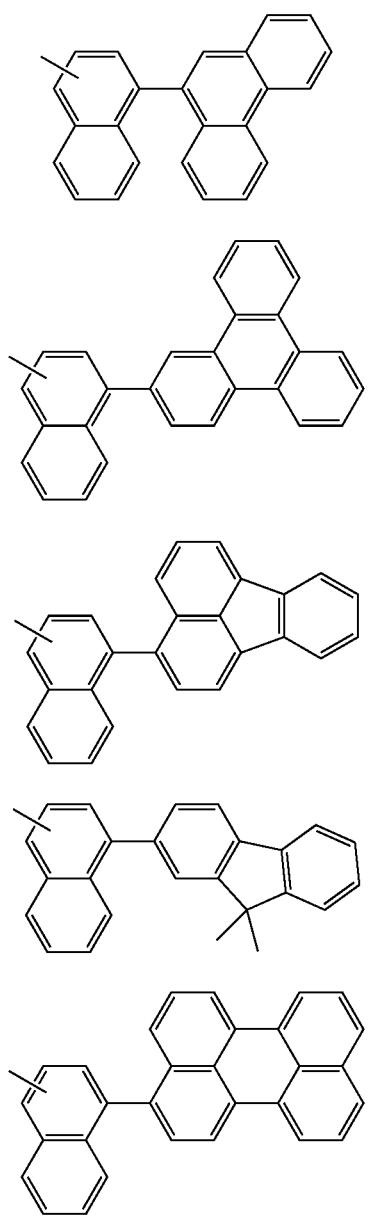
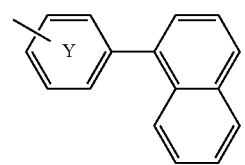
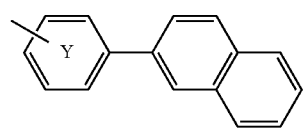
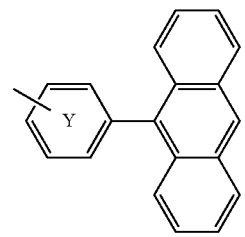
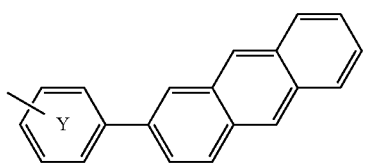
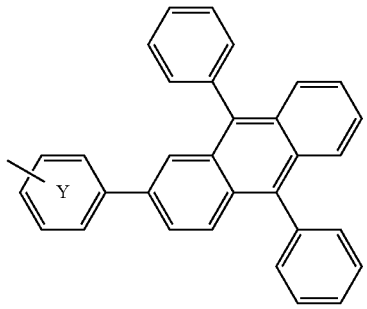
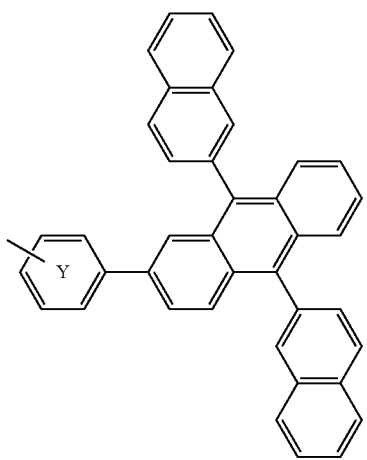
wherein
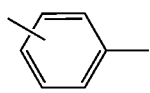
includes one among
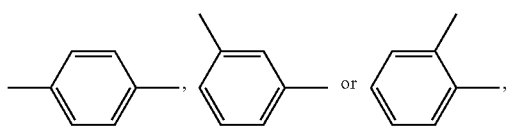

-continued
A-31 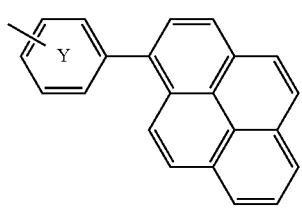
A-32 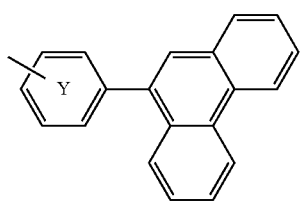
A-33 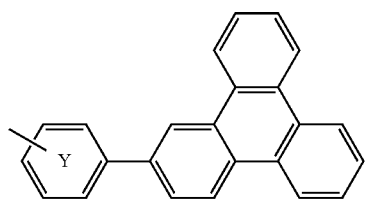
A-34 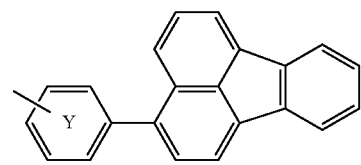
A-35 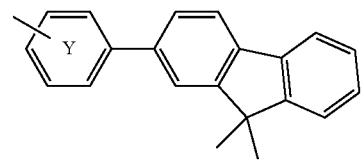
A-36 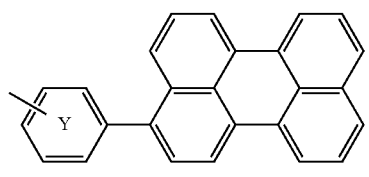
wherein if Y include N in
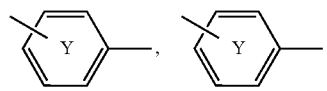
includes one among
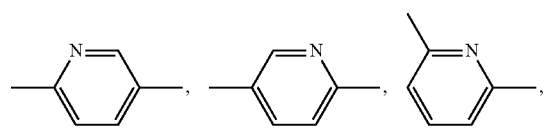
-continued
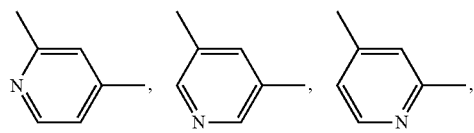
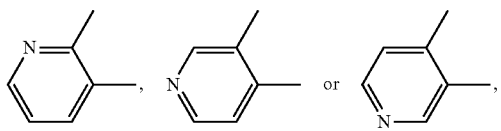
and wherein if Y includes P in
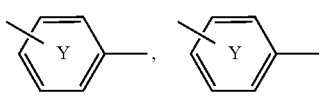
includes one among
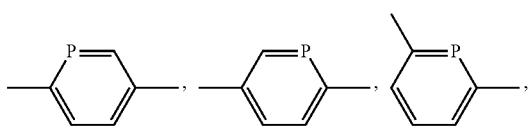
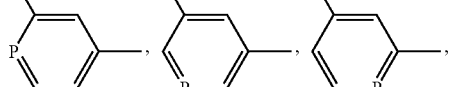
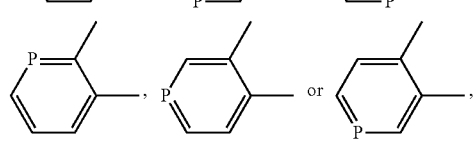
A-37 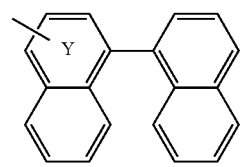
A-38 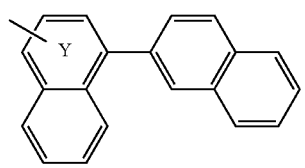
A-39 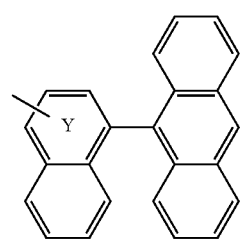

A-40
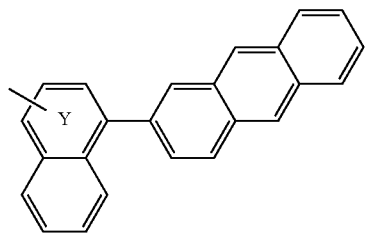
A-41
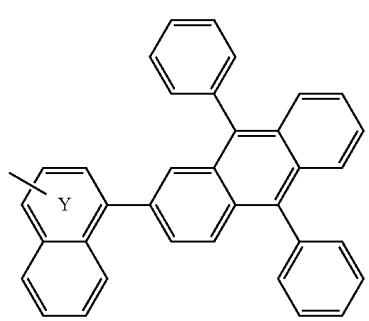
A-42
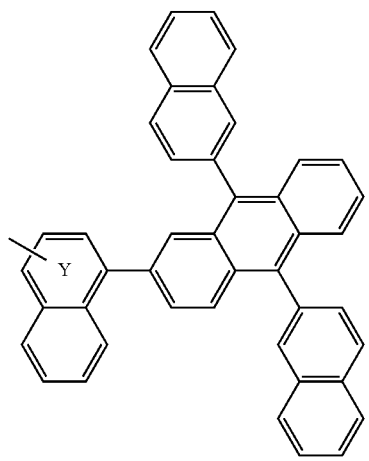
A-43
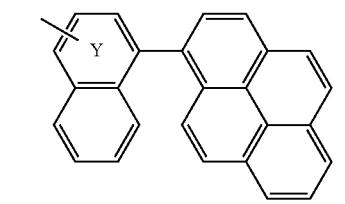
A-44
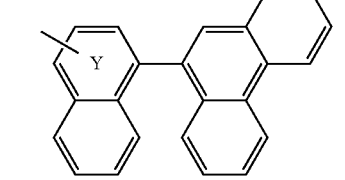
A-45
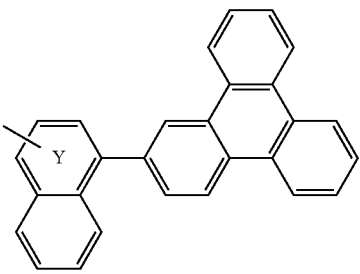
A-46
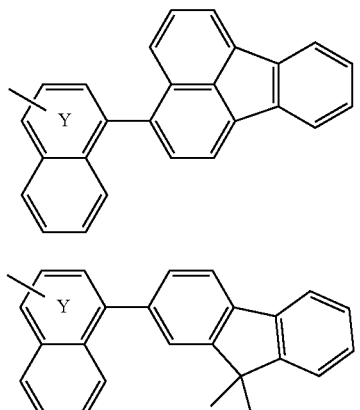
A-47
A-48
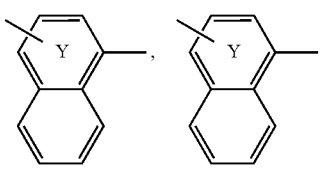
wherein if Y includes N in
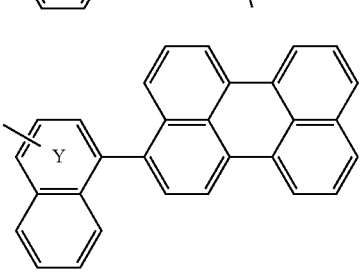
includes one among
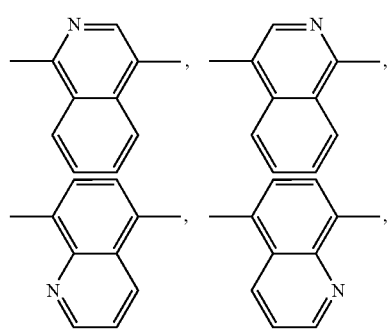

-continued
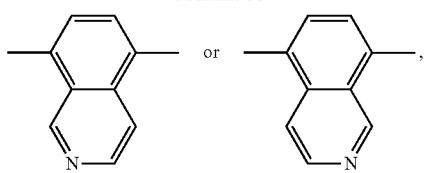
and
Wherein if Y includes P in
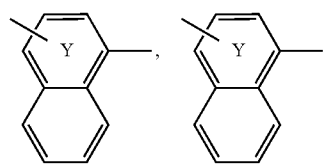
includes one among
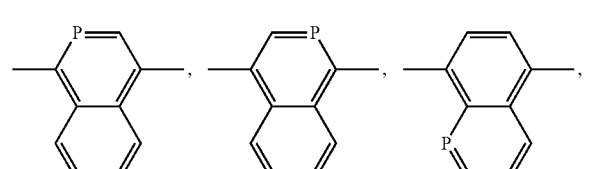
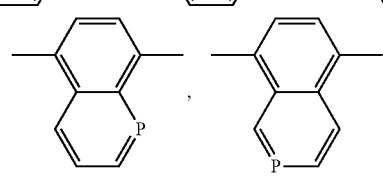
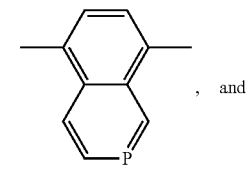
A-49
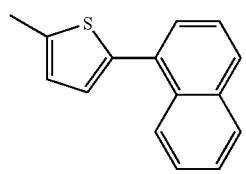
A-50
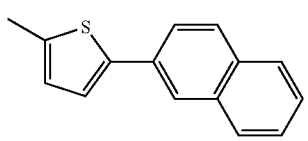
A-51
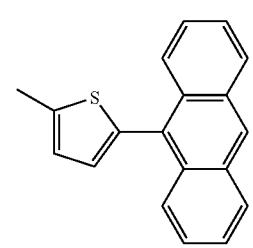
-continued
A-52
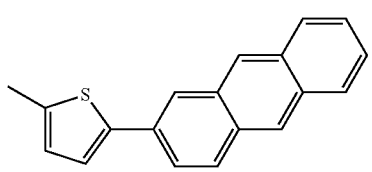
A-53
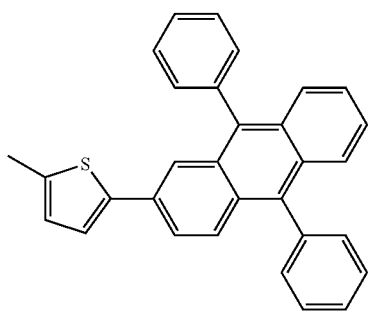
A-54
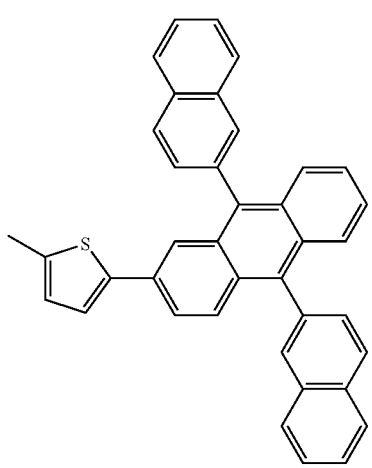
A-55
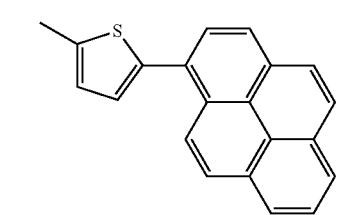
A-56
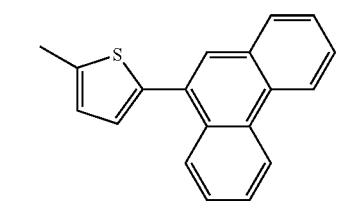
A-57
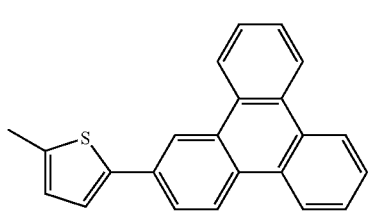

-continued
A-58
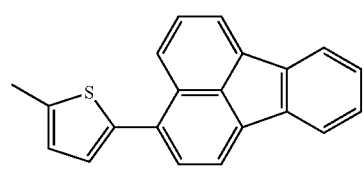
A-59
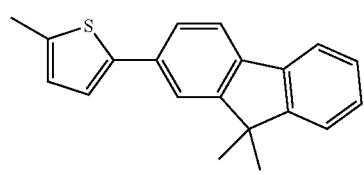
A-60
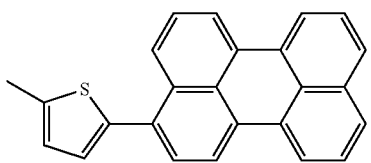
A-61
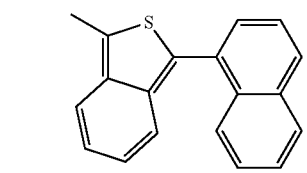
A-62
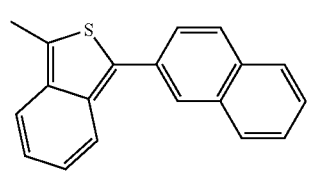
A-63
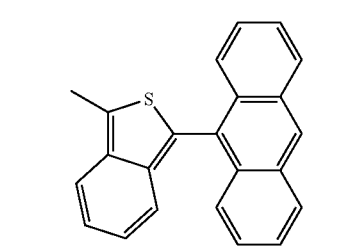
A-64
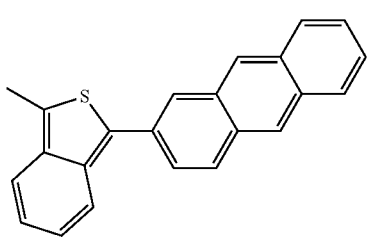
-continued
A-65
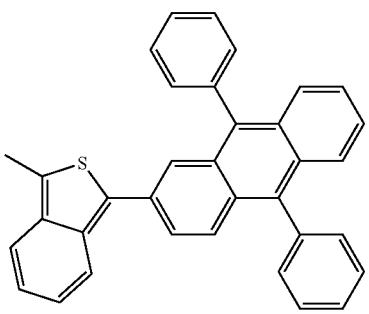
A-66
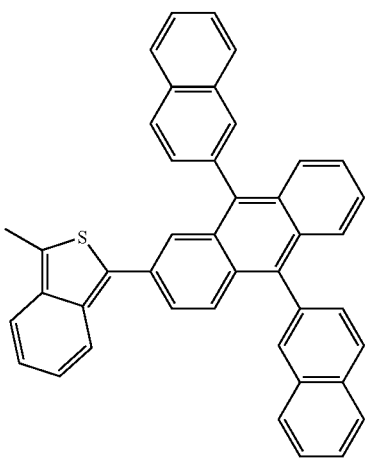
A-67
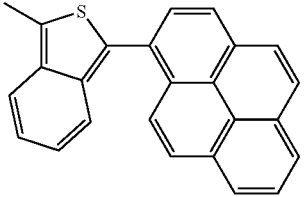
A-68
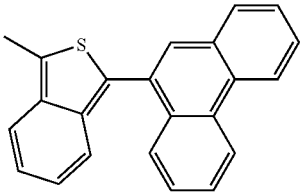
A-69
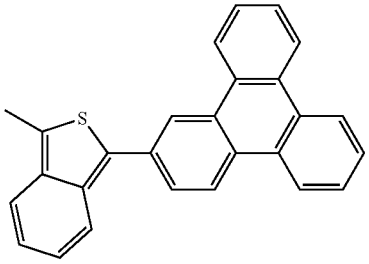

A-70
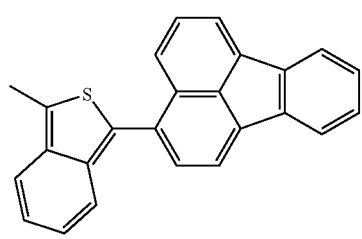
A-71
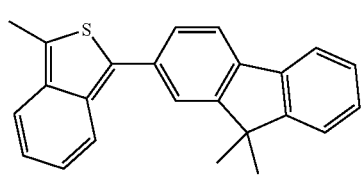
A-72
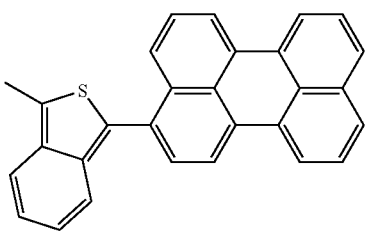
A-73
A-74
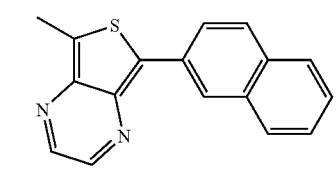
A-75
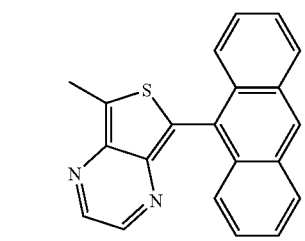
A-76
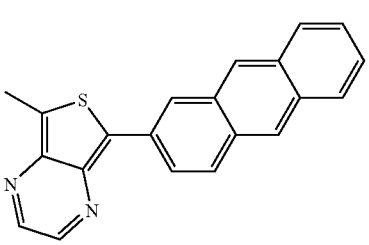
A-77
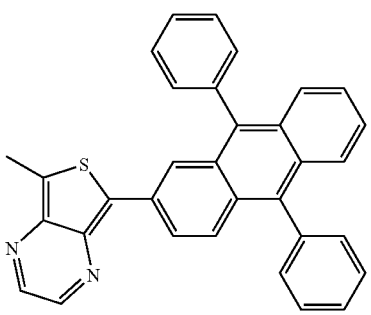
A-78
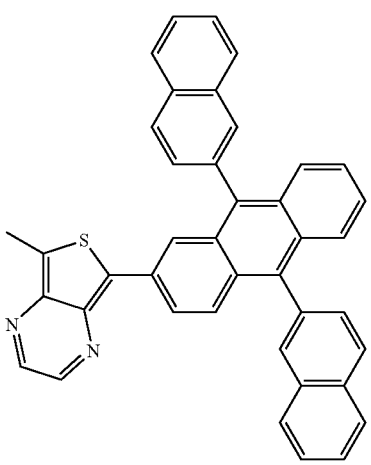
A-79
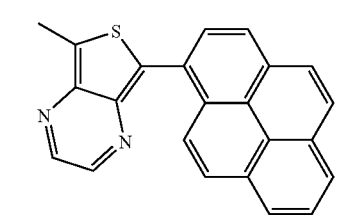
A-80
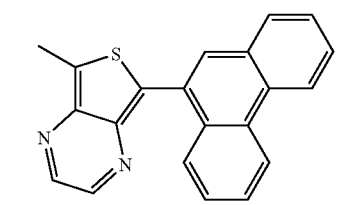
A-81
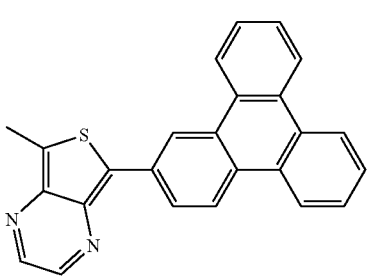

A-82
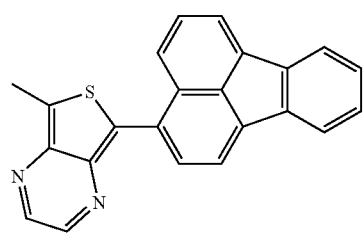
A-83
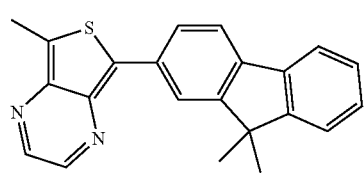
A-84
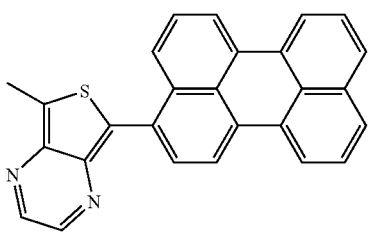
A-88
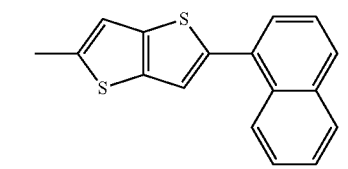
A-89
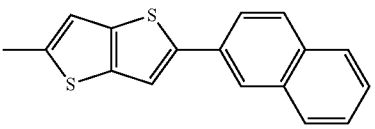
A-90
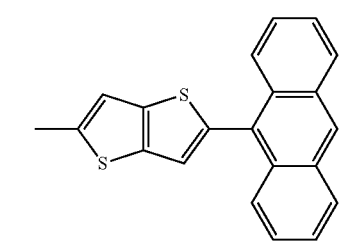
A-91
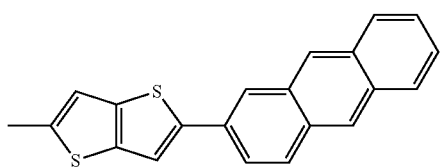
A-92
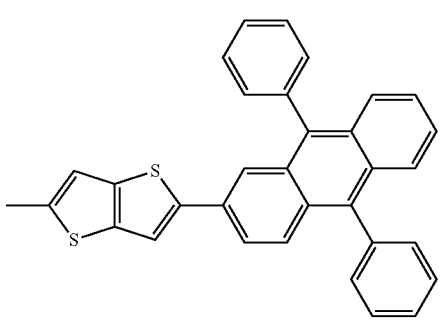
A-93
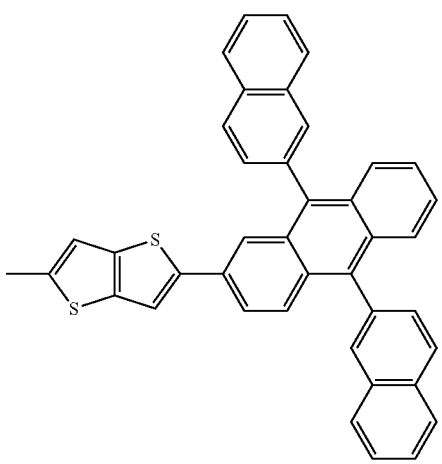
A-94
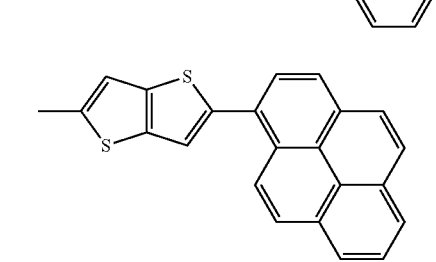
A-95
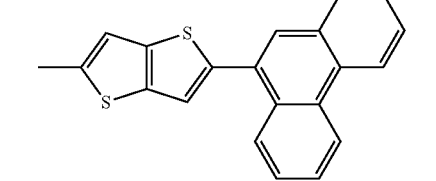
A-96
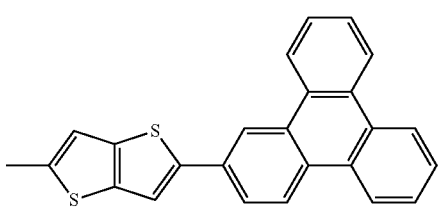
A-98
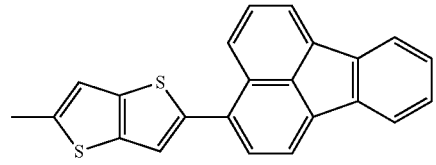

-continued

A-99

A-100

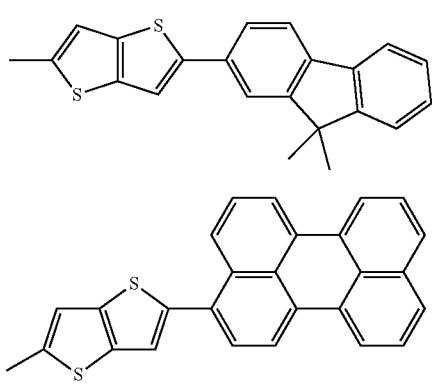

An exemplary embodiment of the present disclosure provides an organic light emitting display device which comprises first and second electrodes facing each other on a substrate; and at least two light emitting parts between the first and second electrodes and each comprising a light emitting layer to emit light of a particular color, the organic light emitting display device further comprising, a charge generation layer for adjusting charge balance between the light emitting parts, and an electron transport layer between the light emitting layer and the charge generation layer, wherein the electron transport layer includes a compound having one or more nitrogen atoms and a substituent with relatively high electron mobility.

The organic light emitting display device having the electron transport layer comprising the compound improves electron injection toward the first electrode and hole injection toward the second electrode, thereby leading to a relative reduction in operating voltage and a relative increase in light emission efficiency.

The compound includes at least three or more nitrogen atoms and the substituent with relatively high electron mobility includes at least one substituent.

The compound is represented by the following Chemical Formula 1:

[Chemical Formula 1]

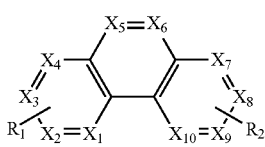

wherein $X_1$ to $X_{10}$ include C atom or N atom.

The compound includes a condensed-ring compound in which $R_1$ and $R_2$ include independently one among hydrogen, heavy hydrogen, a halogen atom, a cyano group, a nitro group, an amino group, an amidino group, hydrazine, hydrazone, a carboxyl group and a salt thereof, a sulfonic acid group and a salt thereof, a phosphate group and a salt thereof, a substituted or unsubstituted alkyl group with 1 to 60 carbon atoms, a substituted or unsubstituted alkenyl group with 2 to 60 carbon atoms, a substituted or unsubstituted alkynyl group with 2 to 60 carbon atoms, a substituted or unsubstituted alkoxy group with 1 to 60 carbon atoms, a substituted or unsubstituted cycloalkyl group with 3 to 60 carbon atoms, an aromatic ring compound with 5 to 50 carbon atoms, and a heterocyclic compound having one or more atoms among N, S, O, or Si with 3 to 50 carbon atoms.

The charge generation layer comprises the same compound as the electron transport layer.

The organic light emitting display device having the charge generation layer or electron transport layer comprising the compound improves electron injection toward the first electrode and hole injection toward the second electrode, compared to an organic light emitting display device having a charge generation layer or electron transport layer without the compound, thereby leading to a relative reduction in operating voltage and a relative increase in light emission efficiency.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
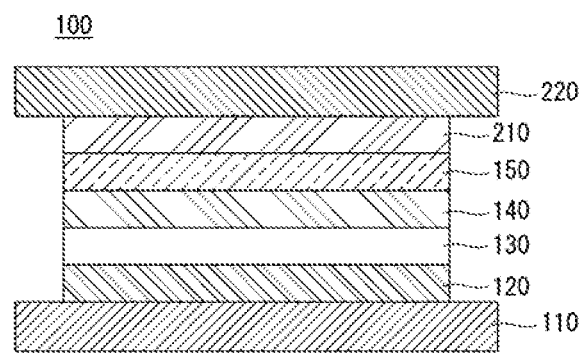
FIG. 1 is a cross-sectional view showing an organic light emitting display device according to a first exemplary embodiment of the present disclosure.

The advantages and features of the present disclosure and methods for accomplishing the same may be understood more readily by reference to the following detailed descriptions of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure is defined by the appended claims.

The shapes, sizes, percentages, angles, numbers, etc. shown in the figures to describe the exemplary embodiments of the present disclosure are merely examples and not limited to those shown in the figures. Like reference numerals denote like elements throughout the specification. In describing the present disclosure, detailed descriptions of related well-known technologies will be omitted to avoid unnecessary obscuring the present disclosure. When the terms 'comprise', 'have', 'consist of' and the like are used, other parts may be added as long as the term 'only' is not used. The singular forms may be interpreted as the plural forms unless explicitly stated.

The elements may be interpreted to include a margin of error even if not explicitly stated.

When the position relation between two parts is described using the terms 'on', 'over', 'under', 'next to' and the like, one or more parts may be between the two parts as long as the term 'immediately' or 'directly' is not used.

When the temporal relationship between two events is described using the terms 'after', 'following', 'next', 'before' and the like, the two events may not occur in succession as long as the term 'immediately' or 'directly' is not used.

It will be understood that, although the terms first, second, etc., may be used to describe various elements, these elements should not be limited by these terms. These terms are only used to distinguish one element from another element. Thus, a first element discussed below could be termed a second element without departing from the technical spirit of the present disclosure.

The features of various exemplary embodiments of the present disclosure may be linked or combined with one another partly or wholly, and may technically interact or work together in various ways. The exemplary embodiments may be carried out independently or in combination with one another.

Hereinafter, various exemplary embodiments of the present disclosure will be described in detail with reference to the accompanying drawings.

FIG. 1 is a cross-sectional view showing an organic light emitting display device according to a first exemplary embodiment of the present disclosure. All the components of the organic light emitting display device according to all embodiments of the present disclosure are operatively coupled and configured.

Referring to FIG. 1, an organic light emitting display according to the first exemplary embodiment of the present disclosure comprises an anode 110, a hole injection layer 120, a hole transport layer 130, a light emitting layer 140, an electron transport layer 150, an electron injection layer 210, and a cathode 220.

The anode 110 is a hole injection electrode, and may be formed of one among ITO (indium tin oxide), IZO (indium zinc oxide), or ZnO (zinc oxide) having a high work function. Also, if the anode 110 is a reflective electrode, the anode 110 may further comprise a reflective layer formed of one among aluminum (Al), silver (Ag), or nickel (Ni) under a layer formed of one among ITO, IZO, or ZnO.

The hole injection layer 120 may function to facilitate hole injection from the anode 110 to the light emitting layer 140, and may be formed of, but is not limited to, one among of CuPc (copper phthalocyanine), PEDOT (poly(3,4)-ethylenedioxythiophene), PANI (polyaniline), and NPD (N,N'-bis(naphthalene-1-yl)-N,N'-bis(phenyl)-2,2'-dimethylbenzidine). The hole injection layer 120 may be 1 to 150 nm thickness. If the hole injection layer 120 is 1 nm thickness or greater, the hole injection properties may be improved, or if the hole injection layer 120 is 150 nm thickness or less, an increase in the thickness of the hole injection layer 120 may be prevented and a rise in operating voltage may be therefore prevented. The hole injection layer 120 may not be included in the elements of the organic light emitting display device, depending on the structure or characteristics of the organic light emitting display device.

The hole transport layer 130 may function to facilitate hole transport, and may be formed of, but is not limited to, one among NPD (N,N'-bis(naphthalene-1-yl)-N,N'-bis(phenyl)-2,2'-dimethylbenzidine), TPD (N,N'-bis-(3-methylphenyl)-N,N'-bis(phenyl)-benzidine), spiro-TAD (2,2'7,7'-tetrakis(N,N-diphenylamino)-9,9'-spirofluorene), and MTDATA (4,4',4''-Tris(N-3-methylphenyl-N-phenylamino)-triphenylamine). The hole transport layer 130 may be 1 to 150 nm thickness. If the hole transport layer 130 is 1 nm thickness or greater, the hole transport properties may be improved, or if the hole transport layer 130 is 150 nm thickness or less, an increase in the thickness of the hole transport layer 130 may be prevented, and a rise in operating voltage may be therefore prevented.

The light emitting layer 140 may emit light of red (R), green (G), blue (B), or yellow (Y), and may be formed of a phosphorescent or fluorescent material.

If the light emitting layer 140 includes a red light emitting layer, it may be formed of a phosphorescent material comprising a host material such as CBP (4,4'-bis(carbazole-9-yl)biphenyl) and a dopant having one among of $Ir(PIQ)_2$ (acac) (bis(1-phenylisoquinoline)acetylacetonate iridium (III)), $Ir(PIQ)_3$(acac) (tris(1-phenylquinoline)acetylacetonate iridiumI(III)), and PtOEP (octaethylporphyrin platinum). Alternatively, the light emitting layer 140 may be formed of, but is not limited to, a fluorescent material comprising $PBD:Eu(DBm)_3(Phen)$ or perylene.

If the light emitting layer 140 includes a green light emitting layer, it may be formed of a phosphorescent material comprising a host material such as CBP(4,4'-bis(carbazole-9-yl)biphenyl) and a dopant material comprising an iridium-based material. Alternatively, the light emitting layer 140 may be formed of, but is not limited to, a fluorescent material having $Alq_3$(tris(8-hydroxyquinolinato) aluminum).

If the light emitting layer 140 includes a blue light emitting layer, it may be formed of a phosphorescent material comprising a host material such as CBP(4,4'-bis(carbazole-9-yl)biphenyl) and a dopant material comprising an iridium-based material. Alternatively, the light emitting layer 140 may be formed of, but is not limited to, a fluorescent material comprising one among spiro-BDAVBi (2,7-bis)4-diphenylamino)styryl)-9,9-spirofluorene), spiro-CBP(2,2',7,7'-tetrakis(carbazol-9-yl)-9,9-spirofluorene), distyrylbenzene (DSB), distyrylarylene (DSA), a PFO polymer, and a PPV polymer.

If the light emitting layer 140 includes a yellow light emitting layer, it may have a single layer structure of a yellow-green light emitting layer or green light emitting layer, or a multilayer structure formed of a yellow-green light emitting layer and a green light emitting layer. Herein, the yellow light emitting layer comprises a yellow-green light emitting layer, a green light emitting layer, or a multilayer structure formed of a yellow-green light emitting layer and a green light emitting layer. This exemplary embodiment will be described by taking as an example a single layer structure of a yellow-green light emitting layer. The yellow light emitting layer may comprise at least one host of CBP(4,4'-bis(carbazol-9-yl)biphenyl) and BAlq(Bis (2-methyl-8-quinolinolate)-4-(phenylphenolato)aluminum) and a phosphorescent yellow-green dopant that emits yellow-green light.

The electron transport layer 150 functions to facilitate electron transport, and affects the lifetime or efficiency of the organic light emitting display device. Thus, the present inventors conducted several tests or experiments to improve the electron injection properties of the electron transport layer. Through a number of tests or experiments which were performed on materials that do not affect the lifetime or efficiency of the organic light emitting display device and that cause no rise in operating voltage, a compound having one or more nitrogen atoms and a substituent with relatively high electron mobility was chosen as an electron transport compound for the electron transport layer. The compound may comprise a phenanthrene derivative. A compound of the present disclosure is rich in electrons by having at least three or more nitrogen atoms, which results in high electron mobility, making electron transport easy. Moreover, the compound of the present disclosure comprises a substituent with relatively high electron mobility. The substituent with relatively high electron mobility may include a long conjugation length and hetero atoms. Thus, the compound of the present disclosure facilitates electron transport from the electron transport layer to the light emitting layer since it has the substituent with a long conjugation length and the hetero atoms.

Accordingly, the electron transport layer 150 includes an electron transport compound represented by the following Chemical Formula 1:

[Chemical Formula 1]

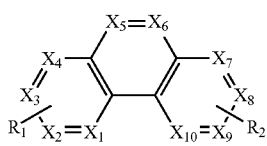

wherein $X_1$ to $X_{10}$ comprise at least three or more N atoms, and $X_1$ to $X_{10}$ with no corresponding N atoms include C atoms, and $R_1$ and $R_2$ include independently one among hydrogen, heavy hydrogen, a halogen atom, a cyano group, a nitro group, an amino group, an amidino group, hydrazine, hydrazone, a carboxyl group and a salt thereof, a sulfonic acid group and a salt thereof, a phosphate group and a salt thereof, a substituted or unsubstituted alkyl group with 1 to 60 carbon atoms, a substituted or unsubstituted alkenyl group with 2 to 60 carbon atoms, a substituted or unsubstituted alkynyl group with 2 to 60 carbon atoms, a substituted or unsubstituted alkoxy group with 1 to 60 carbon atoms, a substituted or unsubstituted cycloalkyl group with 3 to 60 carbon atoms, an aromatic ring compound with 5 to 50 carbon atoms or a heterocyclic compound having one or more atoms among N, S, 0, or Si with 3 to 50 carbon atoms.

The electron transport compound may be one among the following compounds:

Pn-1

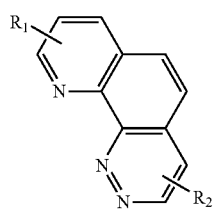

Pn-2

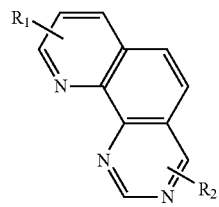

Pn-3

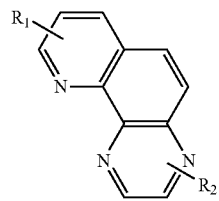

Pn-4

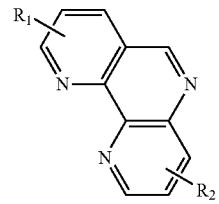

Pn-5

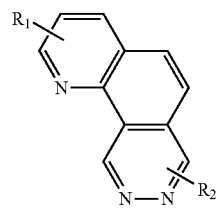

Pn-6

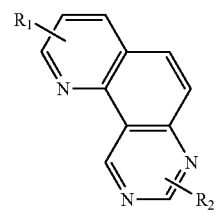

Pn-7

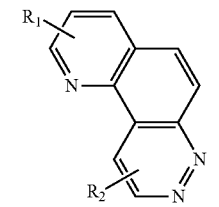

Pn-8

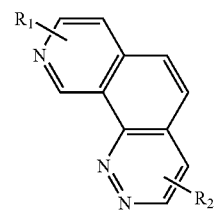

-continued
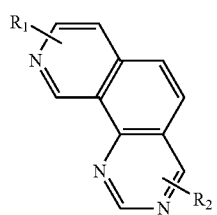 Pn-9
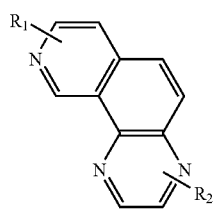 Pn-10
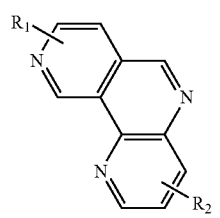 Pn-11
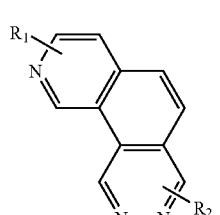 Pn-12
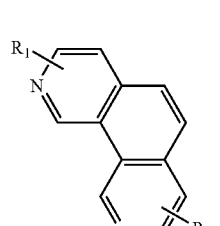 Pn-13
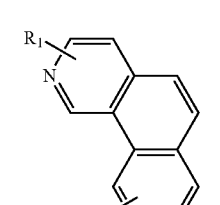 Pn-14
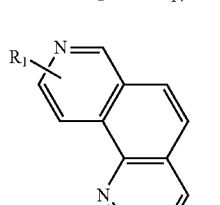 Pn-15
-continued
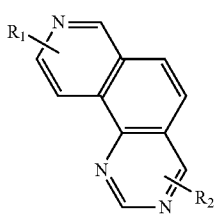 Pn-16
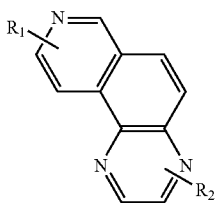 Pn-17
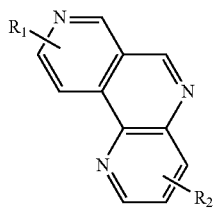 Pn-18
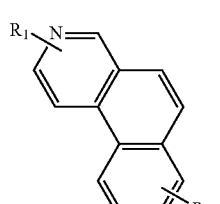 Pn-19
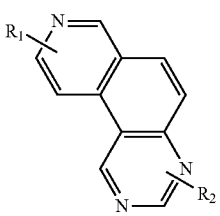 Pn-20
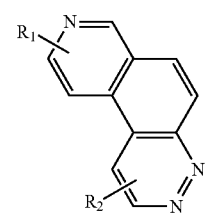 Pn-21
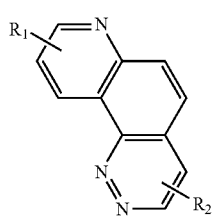 Pn-22

-continued

Pn-23 Pn-24 Pn-25 Pn-26 Pn-27 Pn-28 Pn-29 Pn-30 Pn-31 Pn-32 Pn-33 Pn-34 Pn-35 Pn-36

-continued
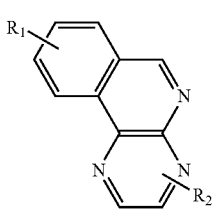
Pn-37
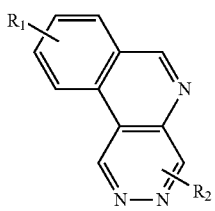
Pn-38
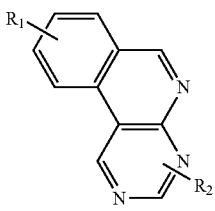
Pn-39
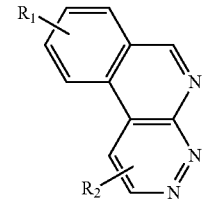
Pn-40
The electron transport compound represented by Chemical Formula 1 may be one among the following compounds:
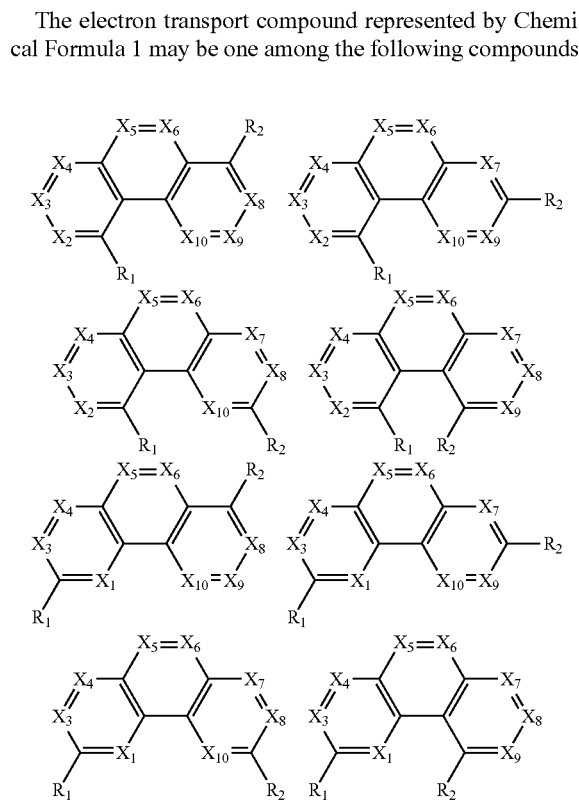
-continued
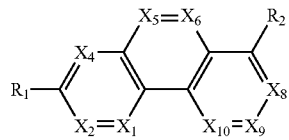
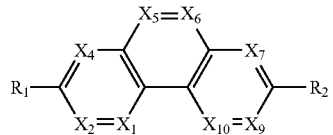
$R_1$ and $R_2$ may be independently one among the following groups:
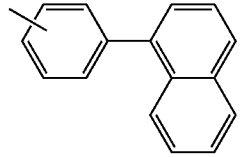
A-01
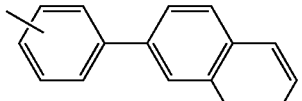
A-02
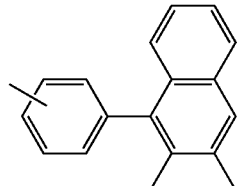
A-03
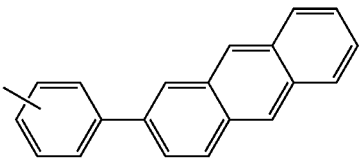
A-04

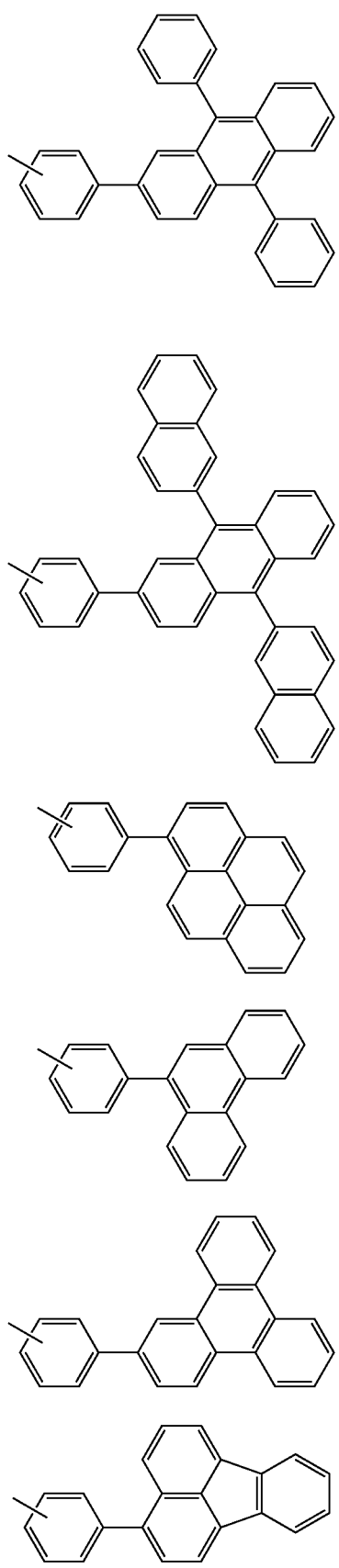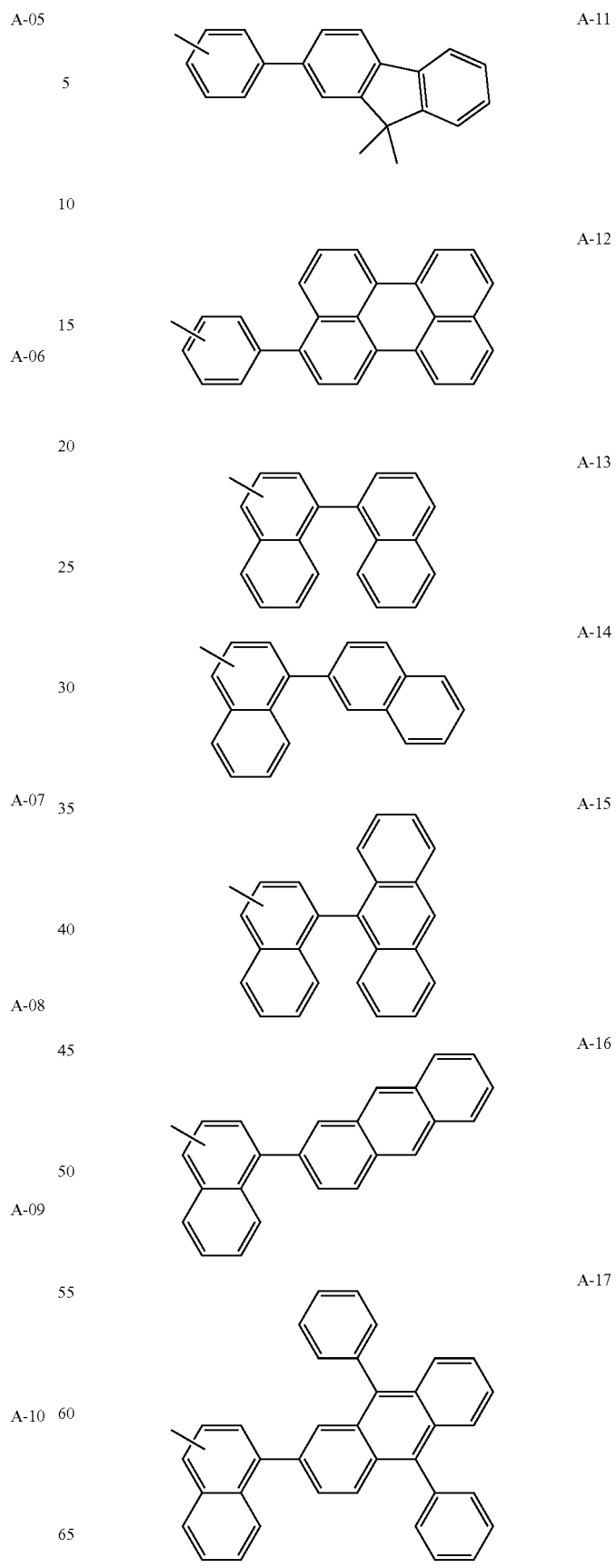

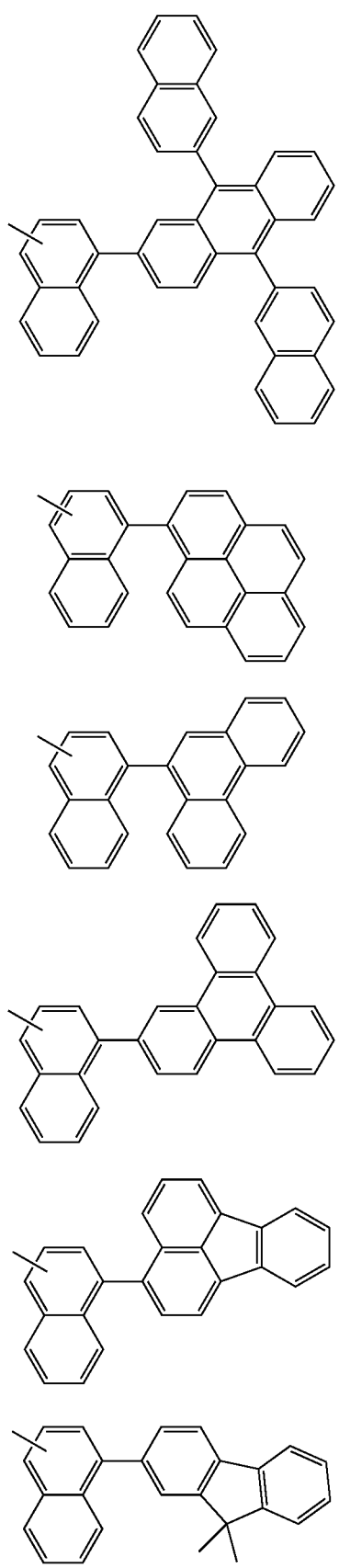
A-18
A-19
A-20
A-21
A-22
A-23
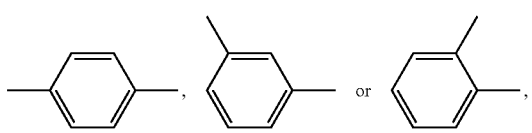
A-24
wherein
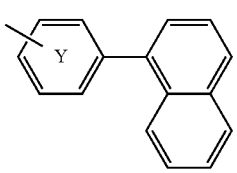
includes one among
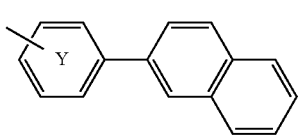,
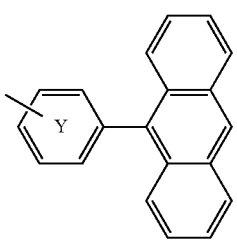
A-25
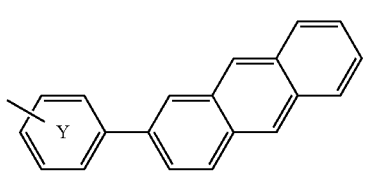
A-26
A-27
A-28

A-29
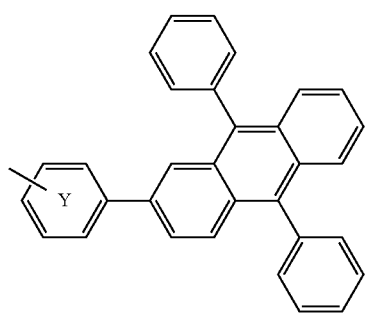
A-30
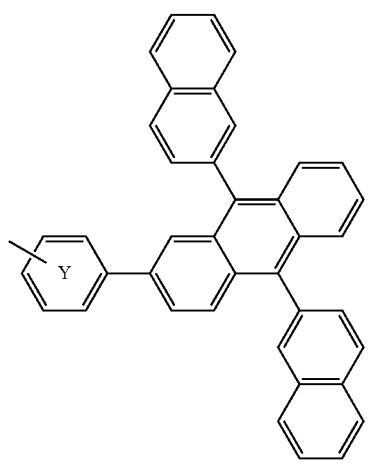
A-31
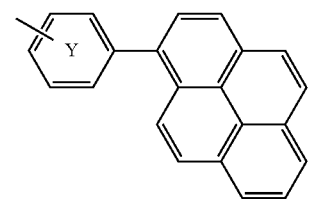
A-32
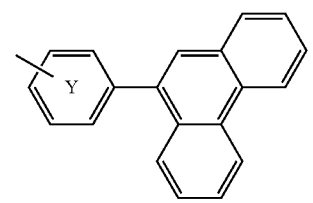
A-33
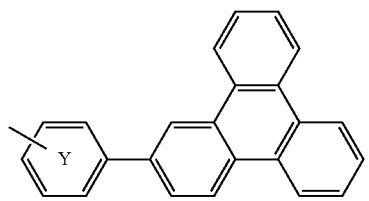
A-34
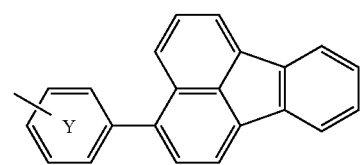
A-35
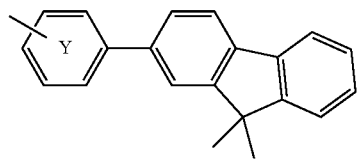
A-36
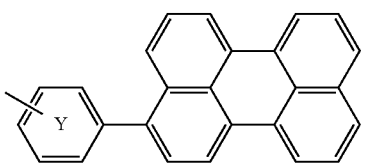
wherein if Y includes N in
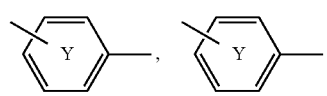
includes one among
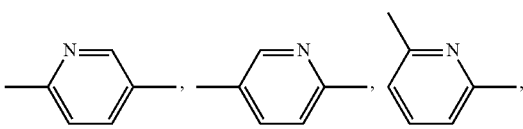
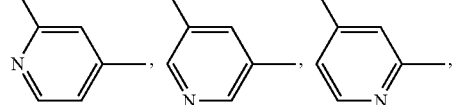
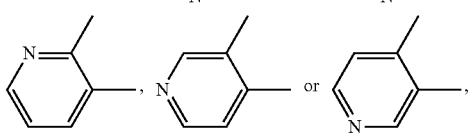
and
Wherein if Y includes P in
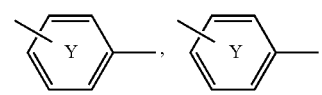
includes one among
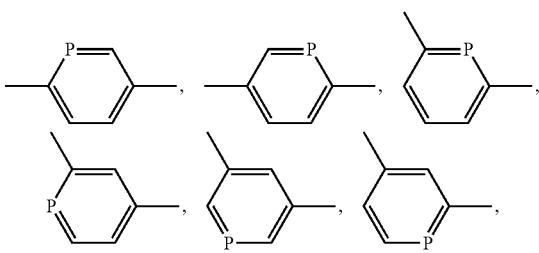

-continued
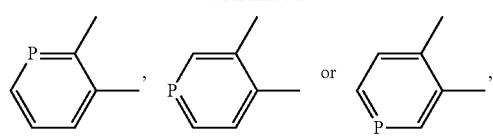
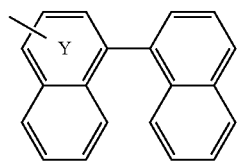
A-37
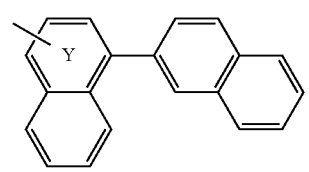
A-38
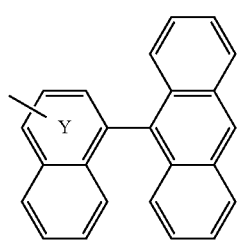
A-39
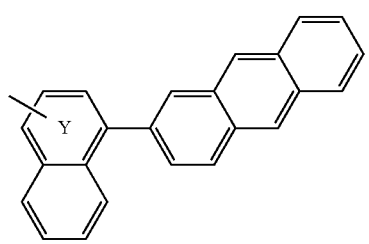
A-40
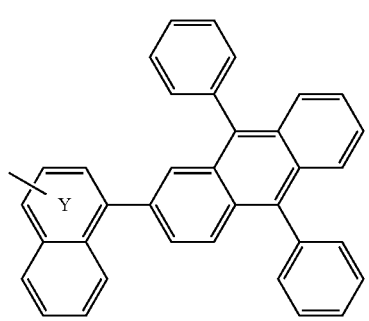
A-41
A-42
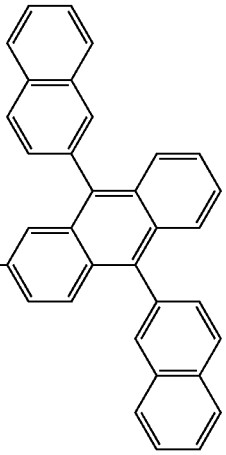
A-43
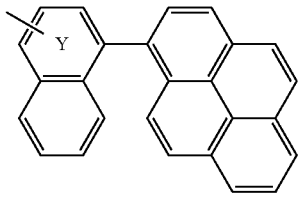
A-44
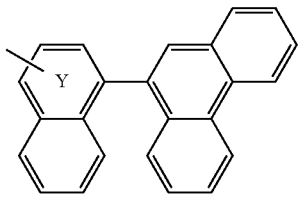
A-45
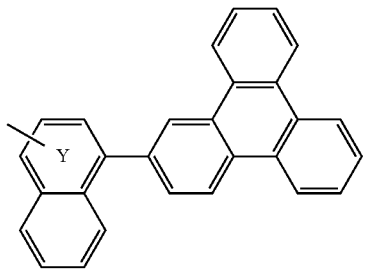
A-46
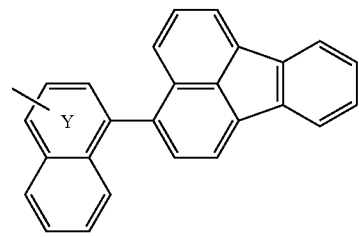
A-47
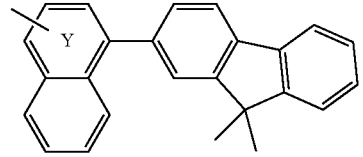

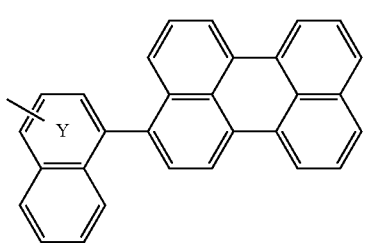
A-48
wherein if Y includes N in
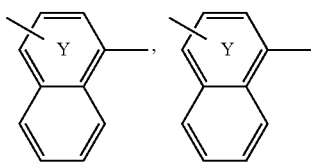
includes one among
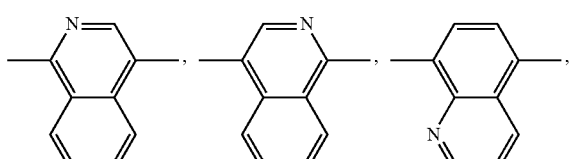
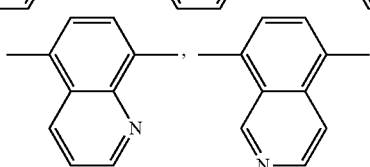
or
and
wherein if Y includes P in
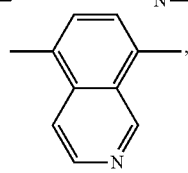
includes one among
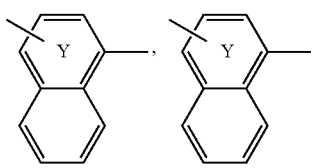
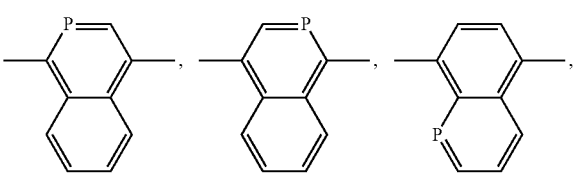
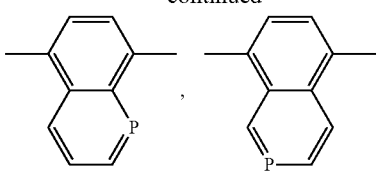
or
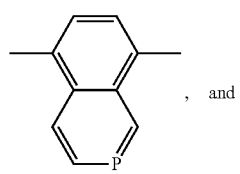
, and
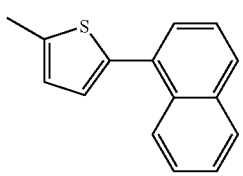
A-49
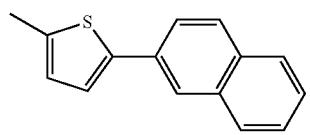
A-50
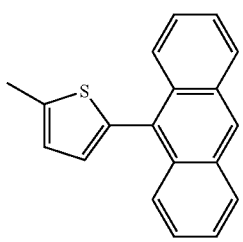
A-51
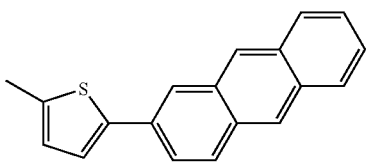
A-52
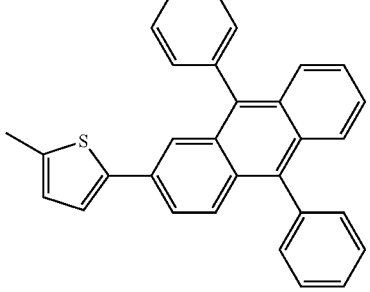
A-53

-continued
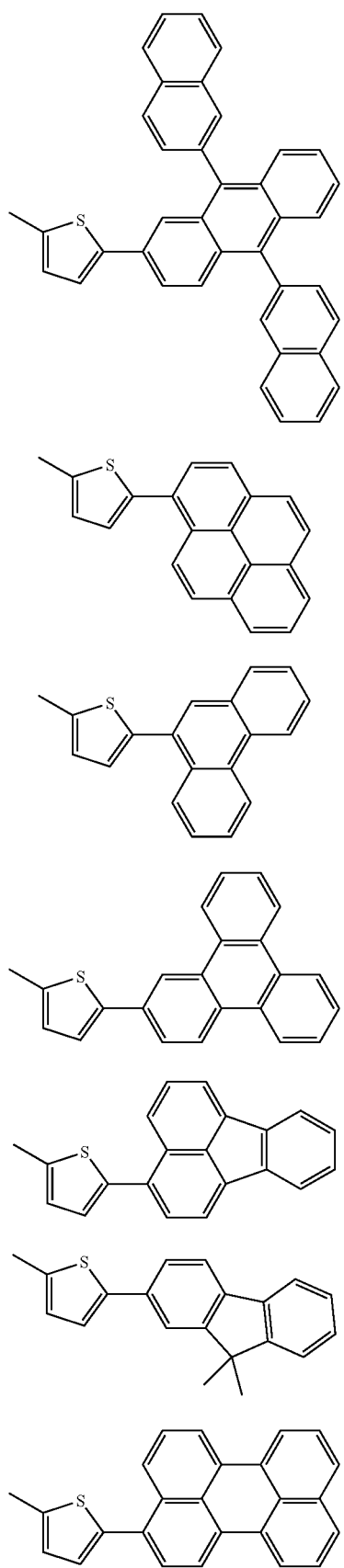
A-54
A-55
A-56
A-57
A-58
A-59
A-60
-continued
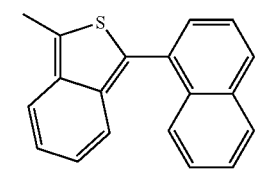
A-61
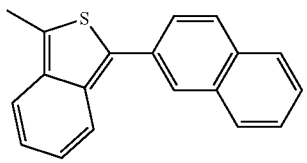
A-62
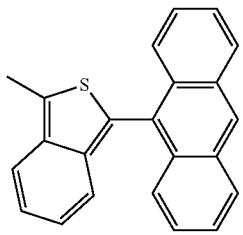
A-63
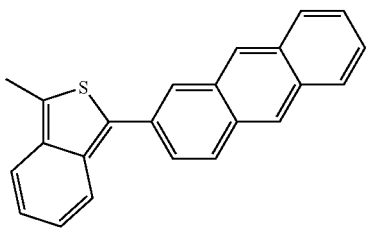
A-64
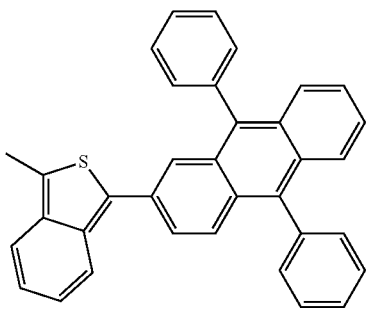
A-65
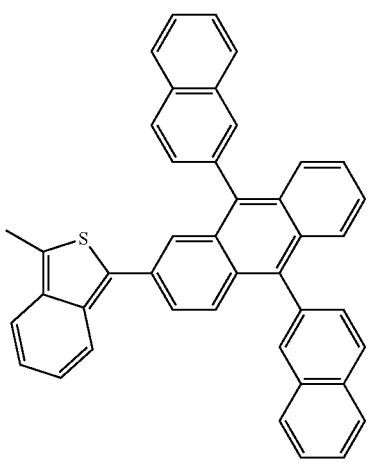
A-66

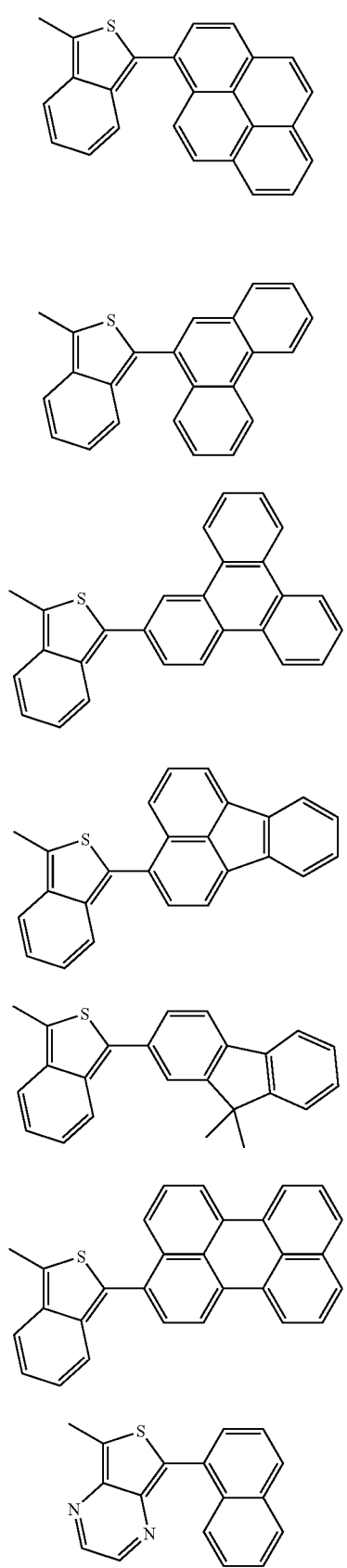
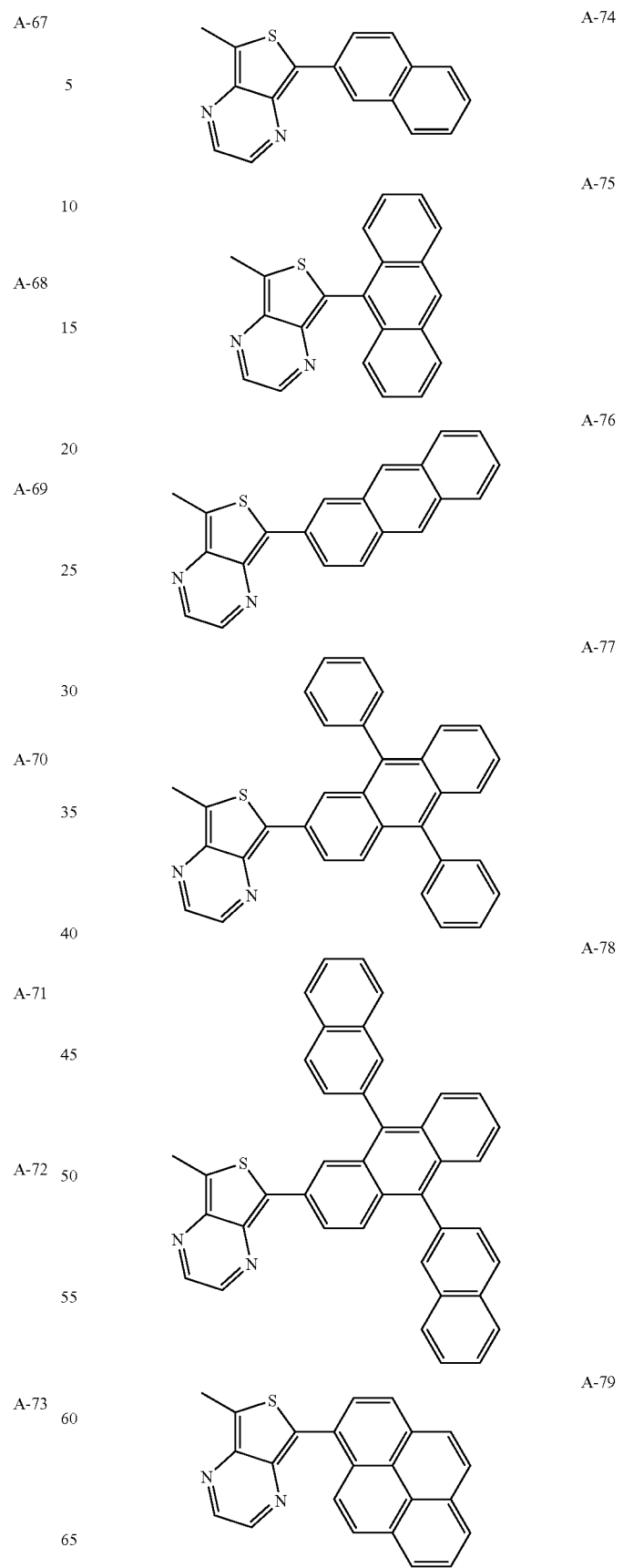

-continued
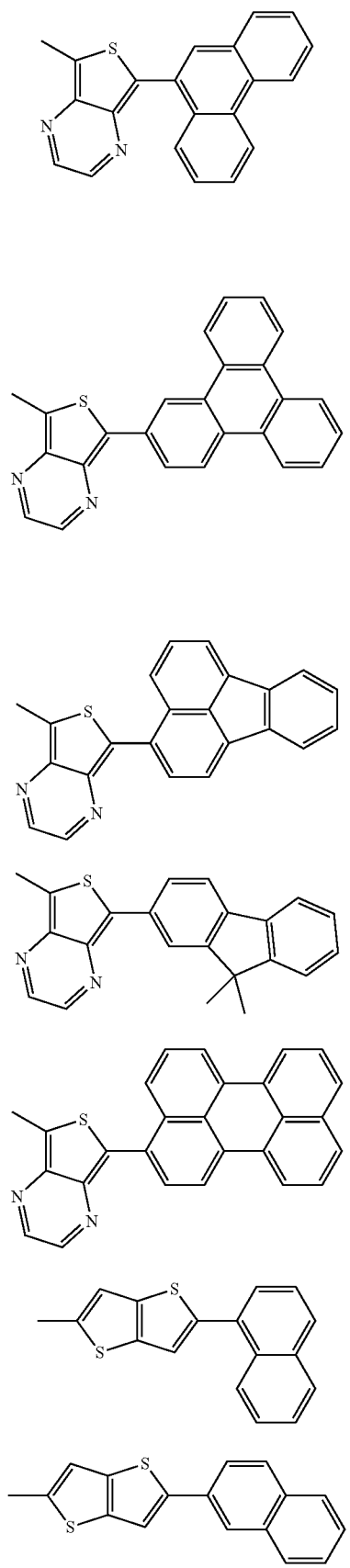
A-80
A-81
A-82
A-83
A-84
A-88
A-89
-continued
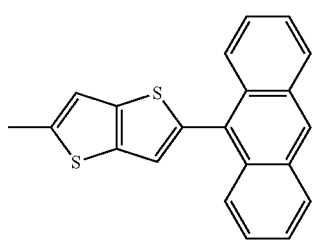
A-90
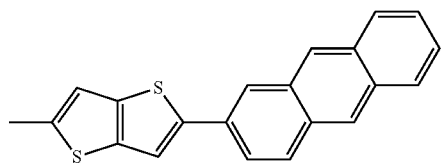
A-91
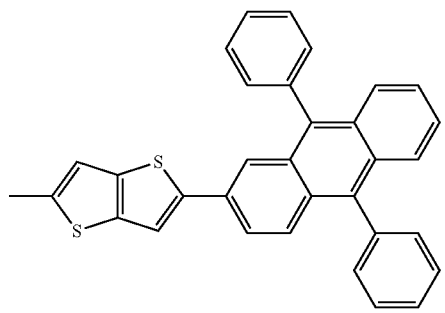
A-92
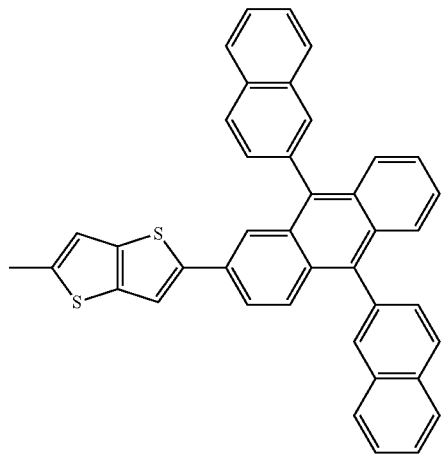
A-93
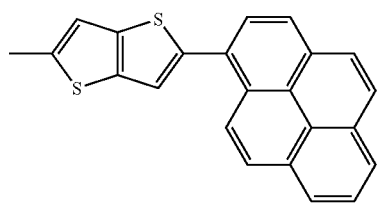
A-94
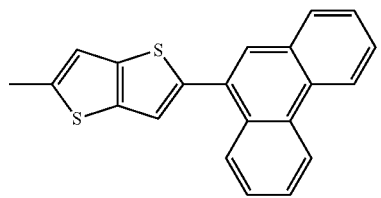
A-95

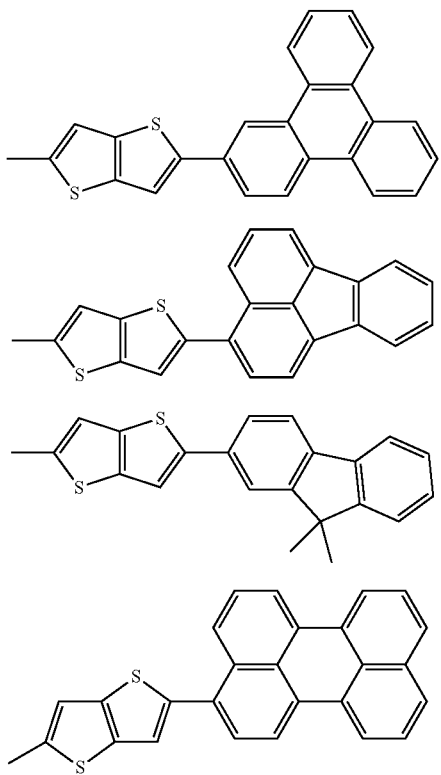

The electron transport layer 150 may be 1 to 150 nm thickness. If the electron transport layer 150 is 1 nm thickness or greater, a degradation of the electron transport properties may be prevented, or if the electron transport layer 150 is 150 nm thickness or less, an increase in the thickness of the electron transport layer 150 may be prevented, and a rise in operating voltage may be therefore prevented.

The electron injection layer 210 functions to facilitate electron transport, and may be formed of, but is not limited to, $Alq_3$ (tris(8-hydroxyquinolinato)aluminum), PBD(2-4-biphenyl)-5-(4-tert-butylphenyl)-1,3,4-oxadiazole), TAZ(3-(4-biphenyl)-4-pheynyl-5-tert-butylphenyl-1,2,4-triazole), or BAlq(Bis(2-methyl-8-quinolinolate)-4-(phenylphenolato)aluminum). On the other hand, the electron injection layer 210 may be formed of a metal compound, and the metal compound may be, for example, but is not limited to, one among LiQ, LiF, NaF, KF, RbF, CsF, FrF, $BeF_2$, $MgF_2$, $CaF_2$, $SrF_2$, $BaF_2$, and $RaF_2$. The electron injection layer 210 may be 1 to 50 nm thickness. If the electron injection layer 210 is 1 nm thickness or greater, a degradation of the electron injection properties may be prevented, or if the electron injection layer 210 is 50 nm thickness or less, an increase in the thickness of the electron injection layer 210 may be prevented, and a rise in operating voltage may be therefore prevented.

The cathode 220 is an electron injection electrode, and may be formed of magnesium (Mg), calcium (Ca), aluminum (Al), silver (Ag), or an alloy thereof, having a low work function. If the organic light emitting display device is a top-emission type or a dual-emission type, the cathode 220 may be formed thin enough to pass light therethrough. If the organic light emitting display device is a bottom-emission type, the cathode 220 may be formed thick enough to reflect light.

As stated above, a compound having one or more nitrogen atoms and a substituent with relatively high electron mobility is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility. Accordingly, the present disclosure allows for efficient charge transfer from the electron transport layer to the light emitting layer and therefore improves the efficiency and performance of the device by using one or more nitrogen atoms and a substituent with relatively high electron mobility as the electron transport layer. In addition, the present disclosure may diminish the problem of low lifetime due to inefficient electron injection since electron transfer from the N-type charge generation layer to the electron transport layer is facilitated. Furthermore, the present disclosure may diminish the problem of the rise in operating voltage caused when electrons injected into the N-type charge generation layer move to the electron transport layer due to the difference in LUMO energy level between the electron transport layer and the N-type charge generation layer.

Figure 2:
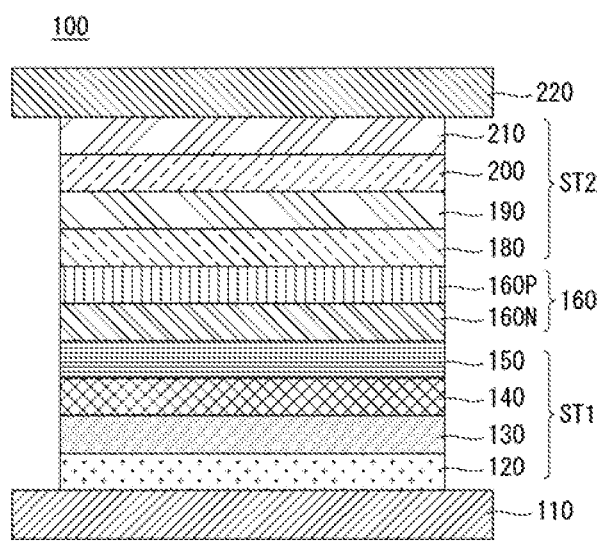
FIG. 2 is a cross-sectional view showing an organic light emitting display device according to a second exemplary embodiment of the present disclosure.

FIG. 2 is a view showing an organic light emitting display device according to a second exemplary embodiment of the present disclosure. The same elements as the first exemplary embodiment are denoted by the same reference numerals, so descriptions of these elements will be omitted below.

Referring to FIG. 2, an organic light emitting display device 100 of the present disclosure comprises a light emitting parts ST1 and ST2 and a charge generation layer 160 between the light emitting parts ST1 and ST2.

The first light emitting part ST1 is a single light emitting diode unit, and comprises a first light emitting layer 140. The first light emitting layer 140 may emit light one among red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising a hole injection layer 120, a first hole transport layer 130, a first light emitting layer 140, and a first electron transport layer 150 is formed on the anode 110. The hole injection layer 120 may not be included in the elements of the first light emitting part ST1, depending on the structure or characteristics of the device.

Like the above-described first exemplary embodiment, the first electron transport layer 150 may include one or more nitrogen atoms and a substituent with relatively high electron mobility. A compound of the present disclosure is rich in electrons by having at least three or more nitrogen atoms, which results in high electron mobility, making electron transport easy. Moreover, the compound of the present disclosure facilitates electron transport from the electron transport layer to the light emitting layer since it includes a substituent with relatively high electron mobility. Accordingly, the first electron transport layer 150 of the present disclosure allows for efficient charge transfer from the N-type charge generation layer to the light emitting layer.

A charge generation layer (CGL) 160 is on the first light emitting part ST1. The first light emitting part ST1 and the second light emitting part ST2 are connected by the charge generation layer 160. The charge generation layer 160 may be a PN-junction charge generation layer formed by joining an N-type charge generation layer 160N and a P-type charge generation layer 160P. The PN junction charge generation layer 160 generates a charge, or injects the charge, i.e., electrons and holes, separately into the light emitting layer. That is, the N-type charge generation layer 160N transfers electrons to the electron transport layer 150 and the electron transport layer 150 supplies the electrons to the first light emitting layer 140 adjacent to the anode, and the P-type charge generation layer 160P transfers holes to the second hole transport layer 180 and the hole transport layer 180 supplies the holes to a second light emitting layer of the second light emitting part ST2. As such, the organic light emitting display device with a plurality of light emitting layers can further increase its light emission efficiency and lower its operating voltage. Accordingly, the charge generation layer 160 has a major effect on the organic light emitting display device's characteristics, i.e., light emission efficiency and operating voltage.

Thus, the present inventors conducted several tests or experiments to improve the electron injection properties of the N-type charge generation layer. Also, the difference in LUMO energy level between the electron transport layer and the N-type charge generation layer causes a rise in operating voltage when the electrons injected into the N-type charge generation layer move to the electron transport layer. Accordingly, the above-described compounds were used as the N-type charge generation layer through several tests or experiments, in order to select materials for the electron transport layer and N-type charge generation layer that can reduce operating voltage and improve efficiency. A compound having one or more nitrogen atoms and a substituent with relatively high electron mobility according to the present disclosure includes at least three or more nitrogen (N) atoms which are rich in electrons, which results in high electron mobility, making electron transport easy. Moreover, a compound of the present disclosure includes $sp^2$ hybrid orbital nitrogen (N), and the nitrogen is bound to an alkali metal or alkali earth metal, i.e., a dopant for the N-type charge generation layer, thereby forming a gap state. This gap state may facilitate transfer of electrons from the N-type charge generation layer to the electron transport layer.

On the other hand, if the N-type charge generation layer 160N is not formed of the above-described compounds, it may be formed of a metal or an N-doped organic material. The metal may be one material among Li, Na, K, Rb, Cs, Mg, Ca, Sr, Ba, La, Ce, Sm, Eu, Tb, Dy, and Yb. An N-type dopant and host for the N-doped organic material may be commonly-used materials. For example, the N-type dopant may be an alkali metal, an alkali metal compound, an alkali earth metal, or an alkali earth metal compound. Specifically, the N-type dopant may be one among Li, Cs, K, Rb, Mg, Na, Ca, Sr, Eu, and Yb. The percentage of the dopant to be mixed is between 1 and 8% relative to 100% for the host. The dopant may have a work function of 2.5 eV or greater. The host material may be an organic material that has a nitrogen-containing hetero ring, with 20 to 60 carbon atoms, for example, one among tris(8-hydroxyquinolinato)aluminum, triazine, a benzazole derivative, and a silole derivative.

The P-type charge generation layer 160P may be formed of a metal or a P-doped organic material. The metal may be one or more alloys of Al, Cu, Fe, Pb, Zn, Au, Pt, W, In, Mo, Ni, and Ti. A P-type dopant and host for the P-doped organic material may be commonly-used materials. For example, the P-type dopant may be one material of $F_4$-TCNQ(2,3,5,6-tetrafluoro-7,7,8,8,-tetracyano-quinodemethane), a derivative of tetracyanoquinodemethane, iodine, $FeCl_3$, $FeF_3$, and $SbCl_5$. The host may be one material among NPB (N,N'-bis(naphthalene-1-yl)-N,N'-bis(phenyl)-benzidine), TPD(N, N'-bis-(3-methylphenyl)-N,N'-bis(phenyl)-benzidine), and TNB(N,N,N'N'-tetranaphthalenyl-benzidine).

The second light emitting part ST2 comprising a second hole transport layer 180, a second light emitting layer 190, a second electron transport layer 200, and an electron injection layer 210 is on the charge generation layer 160. The second hole transport layer 180 and the second electron transport layer 200 may have the same composition as the hole injection layer 120, the first hole transport layer 130, and the first electron transport layer 150 of the above-described first light emitting part ST1, respectively, or have different compositions from their compositions.

The second light emitting layer 190 may emit light of red, green, or blue: for example, it may be a yellow light emitting layer in this exemplary embodiment. The yellow light emitting layer may have a single layer structure of a yellow-green light emitting layer or green light emitting layer, or a multilayer structure formed of a yellow-green light emitting layer and a green light emitting layer. Here, the second light emitting layer 190 comprises a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. This exemplary embodiment will be described by taking as an example a single layer structure of a second light emitting layer that emits yellow-green light. The second light emitting layer 190 may include at least one host of CBP(4,4'-bis(carbazol-9-yl)biphenyl) and BAlq(Bis(2-methyl-8-quinolinolate)-4-(phenylphenolato)aluminum) and a phosphorescent yellow-green dopant that emits yellow-green light. But it is not limited thereto.

The second light emitting part ST2 comprises the second hole transport layer 180 between the charge generation layer 160 and the second light emitting layer 190, and the second electron transport layer 200 and electron injection layer 210 that are on the second light emitting layer 190. Accordingly, the second light emitting part ST2 comprising the second hole transport layer 180, the second light emitting layer 190, the second electron transport layer 200, and the electron injection layer 210 is formed on the first charge generation layer 160. The cathode 220 is formed on the second light emitting part ST2 to constitute the organic light emitting display device according to the second exemplary embodiment of the present disclosure.

Although the second exemplary embodiment of the present disclosure has been described with an example in which the first electron transport layer 150 and the N-type charge generation layer 160N each comprises a compound of the present disclosure, the present disclosure is not limited thereto, and at least one among the first electron transport layer 150, the second electron transport layer 200, and the N-type charge generation layer 160N may comprise a compound of the present disclosure.

As stated above, a compound having one or more nitrogen atoms and a substituent with relatively high electron mobility according to the present disclosure is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility. Accordingly, the organic light emitting display device of the present disclosure allows for efficient charge transfer from the N-type charge generation layer to the light emitting layer by using a compound of the present disclosure as at least one of the electron transport layers included in the light emitting parts.

Moreover, a compound having one or more nitrogen atoms and a substituent with relatively high electron mobility according to the present disclosure includes $sp^2$ hybrid orbital nitrogen (N), and the nitrogen is bound to an alkali metal or alkali earth metal, i.e., a dopant for the N-type charge generation layer, thereby forming a gap state. This gap state may facilitate transfer of electrons from the N-type charge generation layer to the electron transport layer. Accordingly, the organic light emitting display device of the present disclosure may facilitate transfer of electrons from the N-type charge generation layer to the electron transport layer by using a compound of the present disclosure as the N-type charge generation layer.

Figure 3:
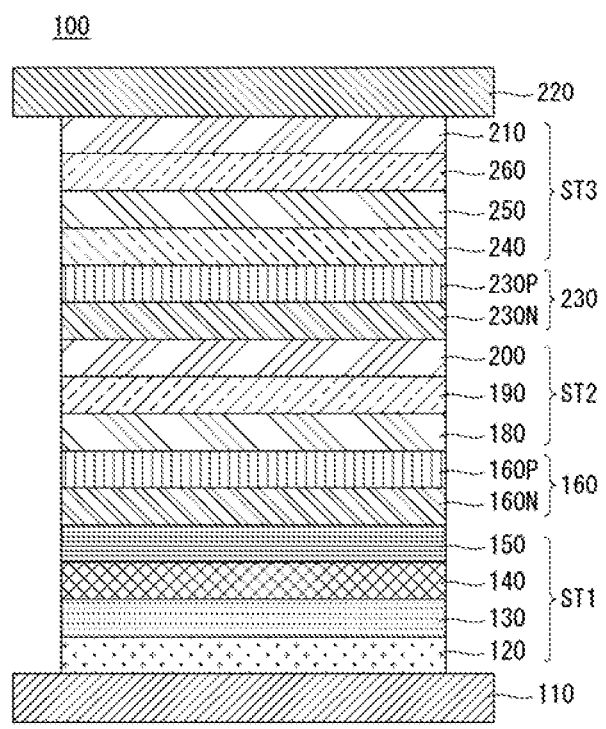
FIG. 3 is a cross-sectional view showing an organic light emitting display device according to a third exemplary embodiment of the present disclosure.

FIG. 3 is a view showing an organic light emitting display device according to a third exemplary embodiment of the present disclosure. The same elements as the first and second exemplary embodiments are denoted by the same reference numerals, so descriptions of these elements will be omitted or brief below.

Referring to FIG. 3, an organic light emitting display device 100 of the present disclosure comprises a plurality of light emitting parts ST1, ST2, and ST3 between an anode 110 and a cathode 220, and a first charge generation layer 160 and a second charge generation layer 230 that are between the light emitting parts ST1, ST2, and ST3. Although this exemplary embodiment has been illustrated and described with an example where three light emitting parts are between the anode 110 and the cathode 220, the present disclosure is not limited to this example and four or more light emitting parts may be between the anode 110 and the cathode 220.

More specifically, the first light emitting part ST1 is a single light emitting diode unit, and comprises a first light emitting layer 140. The first light emitting layer 140 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The first light emitting part ST1 comprises a hole injection layer 120 and a first hole transport layer 130 that are between the anode 110 and the first light emitting layer 140, and a first electron transport layer 150 on the first light emitting layer 140. Accordingly, the first light emitting part ST1 comprising the hole injection layer 120, first hole transport layer 130, first light emitting layer 140, and first electron transport layer 150 is formed on the anode 110. The hole injection layer 120 may not be included in the elements of the first light emitting part ST1, depending on the structure or characteristics of the device.

The first charge generation layer 160 is on the first light emitting part ST1. The first charge generation layer 160 is a PN-junction charge generation layer, formed by joining an N-type charge generation layer 160N and a P-type charge generation layer 160P, which generate a charge, or inject the charge, i.e., electrons and holes, separately into the light emitting layers, respectively.

The second light emitting part ST2 comprising a second light emitting layer 190 is on the first charge generation layer 160. The second light emitting layer 190 may emit light of red, green, or blue: for example, it may be a yellow light emitting layer in this exemplary embodiment. The yellow light emitting layer may comprise a yellow-green light emitting layer, a green light emitting layer, or a multilayer structure formed of a yellow-green light emitting layer and a green light emitting layer, of a yellow light emitting layer and a red light emitting layer, of a green light emitting layer and a red light emitting layer, or of a yellow-green light emitting layer and a red light emitting layer. The second light emitting part ST2 further comprises a second hole transport layer 180 between the first charge generation layer 160 and the second light emitting layer 190, and a second electron transport layer 200 on the second light emitting layer 190. Accordingly, the second light emitting part ST2 comprising the second hole transport layer 180, the second light emitting layer 190, and the second electron transport layer 200 is formed on the first charge generation layer 160.

Like the above-described first exemplary embodiment, the second electron transport layer 200 of the present disclosure may be formed of an electron transport compound. A compound having one or more nitrogen atoms and a substituent with relatively high electron mobility according to the present disclosure is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility. Accordingly, the electron transport layer of the present disclosure allows for efficient transfer of electrons from the N-type charge generation layer to the light emitting layer.

The second charge generation layer 230 is on the second light emitting part ST2. The second charge generation layer 230 is a PN-junction charge generation layer, formed by joining an N-type charge generation layer 230N and a P-type charge generation layer 230P, which generate a charge, or inject the charge, i.e., electrons and holes, separately into the light emitting layers, respectively.

The N-type charge generation layer 230N of the second charge generation layer 230 according to the present disclosure may be formed of a compound having one or more nitrogen atoms and a substituent with relatively high electron mobility. This compound includes at least three or more nitrogen (N) atoms which are rich in electrons, which results in high electron mobility, making electron transport easy. Moreover, a compound of the present disclosure includes $sp^2$ hybrid orbital nitrogen (N), and the nitrogen is bound to an alkali metal or alkali earth metal, i.e., a dopant for the N-type charge generation layer, thereby forming a gap state. This gap state may facilitate transfer of electrons from the N-type charge generation layer to the electron transport layer.

The third light emitting part ST3 comprising a third light emitting layer 250 is on the second charge generation layer 230. The third light emitting layer 250 may emit light of red, green, or blue: for example, it may be a blue light emitting layer in this exemplary embodiment. The blue light emitting layer comprises one among a blue light emitting layer, a dark blue light emitting layer, and a sky blue light emitting layer. Alternatively, the first light emitting layer 140 may be formed of a blue light emitting layer and a red light emitting layer, of a blue light emitting layer and a yellow-green light emitting layer, or of a blue light emitting layer and a green light emitting layer.

The third light emitting part ST3 further comprises a third hole transport layer 240 between the second charge generation layer 230 and the third light emitting layer 250, and a third electron transport layer 260 and an electron injection layer 210 that are on the third light emitting layer 250. The third electron transport layer 260 has the same composition as the aforementioned the first electron transport layer 150, so its description will be omitted. Accordingly, the third light emitting part ST3 comprising the third hole transport layer 240, the third light emitting layer 250, the third electron transport layer 260, and the electron injection layer 210 is formed on the second charge generation layer 230. The cathode 220 is formed on the third light emitting part ST3 to constitute the organic light emitting display device according to the third exemplary embodiment of the present disclosure.

Although the third exemplary embodiment of the present disclosure has been described with an example in which the second electron transport layer 200 and the N-type charge generation layer 230N of the second charge generation layer 230 each comprise a compound of the present disclosure, the present disclosure is not limited thereto, and at least one among the first electron transport layer 150, the second electron transport layer 200, the third electron transport layer 260, the N-type charge generation layer 160N of the first charge generation layer 160, and the N-type charge generation layer 230N of the second charge generation layer 230 may comprise a compound of the present disclosure.

As stated above, a compound having one or more nitrogen atoms and a substituent with relatively high electron mobility according to the present disclosure is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility. Accordingly, the organic light emitting display device of the present disclosure allows for efficient transfer of electrons from the N-type charge generation layer to the light emitting layer by using a compound of the present disclosure as at least one of the electron transport layers included in the light emitting parts.

Moreover, a compound having on or more nitrogen atoms and a substituent with relatively high electron mobility according to the present disclosure includes $sp^2$ hybrid orbital nitrogen (N), and the nitrogen is bound to an alkali metal or alkali earth metal, i.e., a dopant for the N-type charge generation layer, thereby forming a gap state. This gap state may facilitate transfer of electrons from the N-type charge generation layer to the electron transport layer. Accordingly, the organic light emitting display device of the present disclosure may facilitate transfer of electrons from the N-type charge generation layer to the electron transport layer by using a compound of the present disclosure as the N-type charge generation layer.

Accordingly, the organic light emitting display device of the present disclosure allows for efficient transfer of electrons from the N-type charge generation layer to the light emitting layer and therefore improves the efficiency and performance of the device by using a compound having one or more nitrogen atoms and a substituent with relatively high electron mobility as at least one among the electron transport layers in the light emitting parts and the N-type charge generation layers. In addition, the present disclosure may diminish the problem of low lifetime due to inefficient electron injection since electron transfer from the N-type charge generation layer to the electron transport layer is facilitated. Furthermore, the present disclosure may diminish the problem of the rise in operating voltage caused when electrons injected into the N-type charge generation layer move to the electron transport layer due to the difference in LUMO energy level between the electron transport layer and the N-type charge generation layer.

Figure 4:
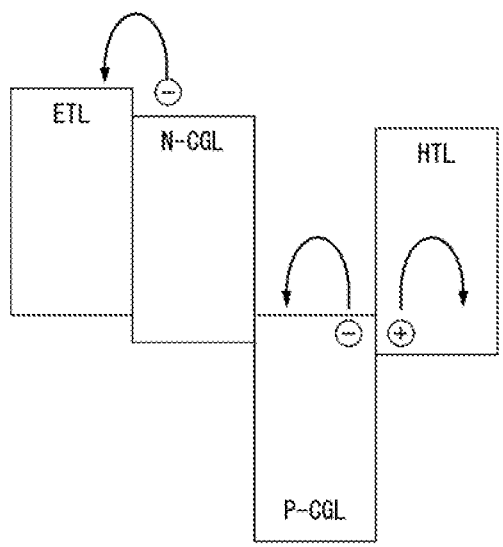
FIG. 4 is an energy band diagram of an organic light emitting display device according to an exemplary embodiment of the present disclosure.

FIG. 4 is an energy band diagram of an organic light emitting display device according to an exemplary embodiment of the present disclosure.

Referring to FIG. 4, an organic light emitting display device of the present disclosure comprises a hole transport layer HTL, a P-type charge generation layer P-CGL, an N-type charge generation layer N-CGL, and an electron transport layer ETL. The N-type charge generation layer N-CGL supplies electrons to the electron transport layer ETL adjacent to it, and the P-type charge generation layer P-CGL supplies holes to the hole transport layer HTL adjacent to it. The N-type charge generation layer N-CGL includes $sp^2$ hybrid orbital nitrogen as a compound of the present disclosure, and the nitrogen is bound to an alkali metal or alkali earth metal, i.e., a dopant for the N-type charge generation layer, thereby forming a gap state. This gap state may facilitate transfer of electrons from the N-type charge generation layer N-CGL to the electron transport layer.

The electron transport layer ETL is a compound having one or more nitrogen atoms and a substituent with relatively high electron mobility, and the compound is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility. Accordingly, the electron injection to the light emitting layer may be improved, thereby improving light emission efficiency and reducing the operating voltage of the device.

Hereinafter, synthesis examples of electron transport compounds of the present disclosure will be described in detail. However, the following examples are only for illustration, and the present disclosure is not limited thereto.

Synthesis of Compound Pn2-A07

1) Synthesis of 2-(4-bromophenyl)pyrido[2,3-f] quinoxaline

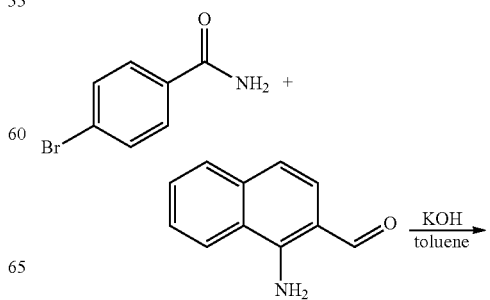

-continued

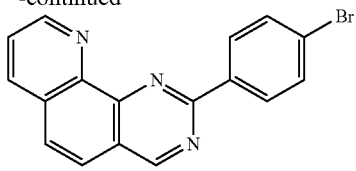

4-bromobenzamide (10 g, 50 mmol) and 8-aminoquinoline-7-carbaldehyde (10.32 g, 60 mmol) were dissolved in 50 mL of toluene and 50 mL of ethanol in a 250-ml three-necked round-bottom flask under a nitrogen atmosphere, and then potassium hydroxide (KOH) (5.6 g, 100 mmol) dissolved in 50 mL of ethanol was added to the mixture for 5 minutes. The reaction solution was refluxed and stirred for 24 hours. After the reaction, the reaction solution was cooled to room temperature and extracted with methylene chloride, and then subjected to column chromatography using methylene chloride/methanol (100:1) as the eluent to separate and purify a compound (6.3 g, yield: 37.5%).

2) Synthesis of Pn2-A07

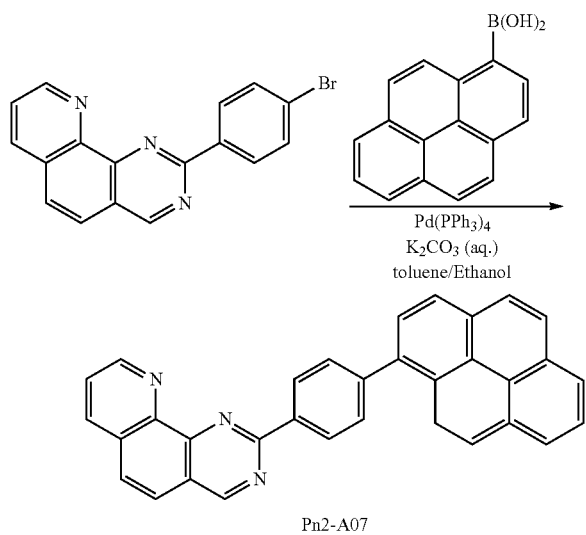

2-(4-bromophenyl)pyrido[2,3-f]quinoxaline (6.3 g 18.74 mmol), pyren-1-yl-boronic acid (5.53 g 22.49 mmol), Tetrakis(triphenylphosphine)palladium(0) (Pd(PPh$_3$)$_4$) (0.65 g 0.56 mmol), 4M potassium carbonate (K$_2$CO$_3$) (15 ml), 40 ml of toluene, and 15 ml of ethanol were put into a 250-ml three-necked round-bottom flask under a nitrogen atmosphere, and then refluxed and stirred for 12 hours. After the reaction, 50 mL of distilled water was added, and the mixture was stirred for 1 hour and then vacuum-filtered. The obtained solid was dried and then purified by column chromatography using methylene chloride/methanol (100:1) as the eluent to obtain Pn2-A07 (7.3 g, yield: 85%)

Hereinafter, embodiments for the manufacture of an organic light emitting display device according to the present disclosure will be disclosed. However, the following materials for the electron transport layer do not limit the scope of the present disclosure.

Comparative Example 1

A monolithic organic light emitting display device was manufactured by forming, on an ITO substrate, a hole injection layer, a hole transport layer, a yellow light emitting layer, an electron transport layer, an electron injection layer, and a cathode. Here, the electron transport layer was formed of an anthracene compound.

Embodiment 1

It has the same elements as the above-described Comparative Example 1, and the electron transport layer was formed of the following compound Pn2-A07.

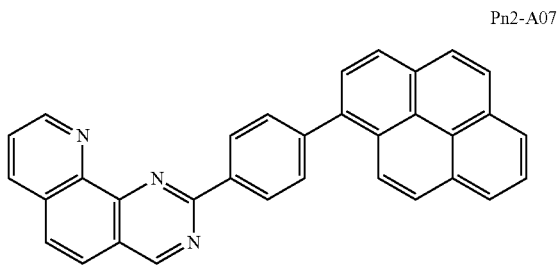 [SMILES: c1cnc2c(c1)ccc1cnc(-c3ccc(-c4ccc5ccc6cccc7ccc4c5c67)cc3)nc12]

Comparative Example 2

An organic light emitting display device was manufactured by forming, on an ITO substrate, a first light emitting part comprising a blue light emitting layer and a first electron transport layer, a second light emitting layer comprising a charge generation layer, yellow light emitting layer, and second electron transport layer, a third light emitting part comprising a charge generation layer, blue light emitting layer, and third electron transport layer, and a cathode. Here, the first to third electron transport layers were formed of an anthracene compound.

Embodiment 2

It has the same elements as the above-described Comparative Example 2, and the second electron transport layer was formed from the above Compound Pn2-A07.

The materials for the electron transport layer in the above Comparative Examples and Embodiments do not limit the scope of the present disclosure.

The operating voltage and efficiency of the devices manufactured according to the above-described Comparative Examples and Embodiments were measured and shown in the following Table 1. (The measurements taken in Embodiments were expressed as a percentage relative to those taken in Comparative Examples corresponding to 100%, and the devices manufactured according to Comparative Examples and Embodiments were driven at an operating current of 10 mA/cm$^2$).

Figure 5:
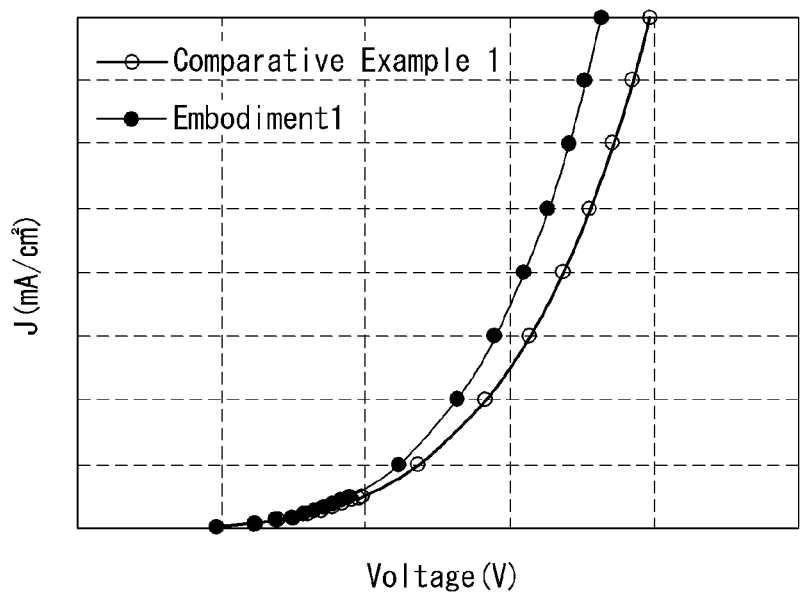
FIG. 5 is a graph of the current density vs. voltage of organic light emitting display devices according to Comparative Example 1 and Embodiment 1 of the present disclosure.
Figure 6:
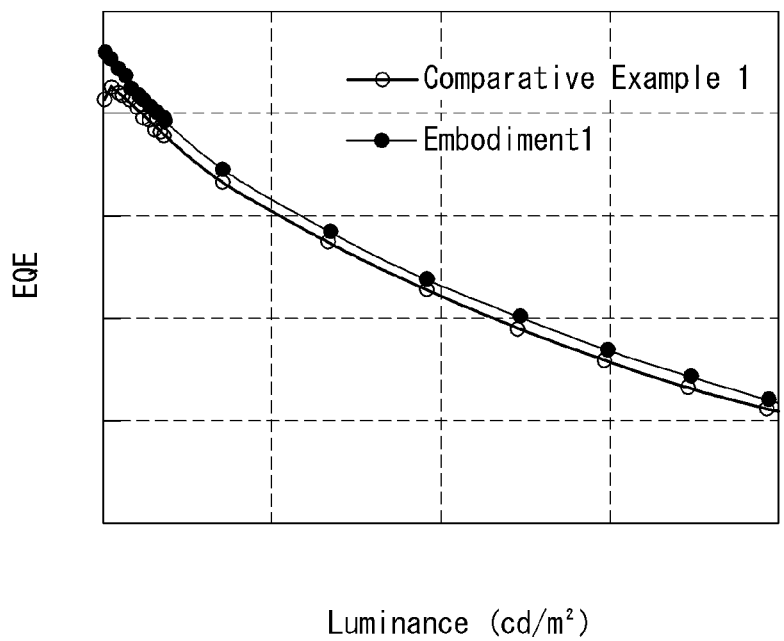
FIG. 6 is a graph of the efficiency vs. luminance of organic light emitting display devices according to Comparative Example 1 and Embodiment 1 of the present disclosure.

The current density vs voltage of the organic light emitting display devices manufactured according to Comparative Example 1 and Embodiment 1 was measured and shown in FIG. 5, and the efficiency vs luminance was measured and shown in FIG. 6. Also, the current density vs voltage of the organic light emitting display devices manufactured according to Comparative Example 2 and Embodiment 2 was measured and shown in FIG. 7, and the efficiency vs luminance was measured and shown in FIG. 8.

While Comparative Examples and Embodiments use a yellow-green light emitting layer as an example of the light emitting layer, the light emitting layer or electron transport layer included in a light emitting part that emits light of other colors also may be used.

TABLE 1

|  | Operating Voltage | Efficiency |
| --- | --- | --- |
| Comparative Example 1 | 100% | 100% |
| Embodiment 1 | 96.87% | 100.96% |
| Comparative Example 2 | 100% | 100% |
| Embodiment 2 | 99.15% | 103.21% |

Referring to Table 1 and FIGS. 5 and 6, for a monolithic OLED structure, Embodiment 1 using Compound Pn2-A07 as the electron transport layer showed a 3.13% decrease in operating voltage and a 0.96% increase in efficiency, compared to Comparative Example 1 using an anthracene compound as the electron transport layer.

Figure 7:
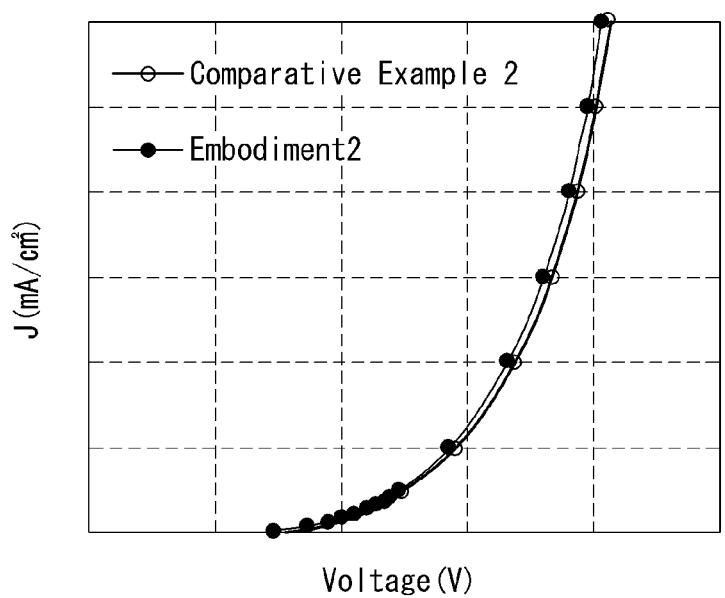
FIG. 7 is a graph of the current density vs. voltage of organic light emitting display devices according to Comparative Example 2 and Embodiment 2 of the present disclosure.
Figure 8:
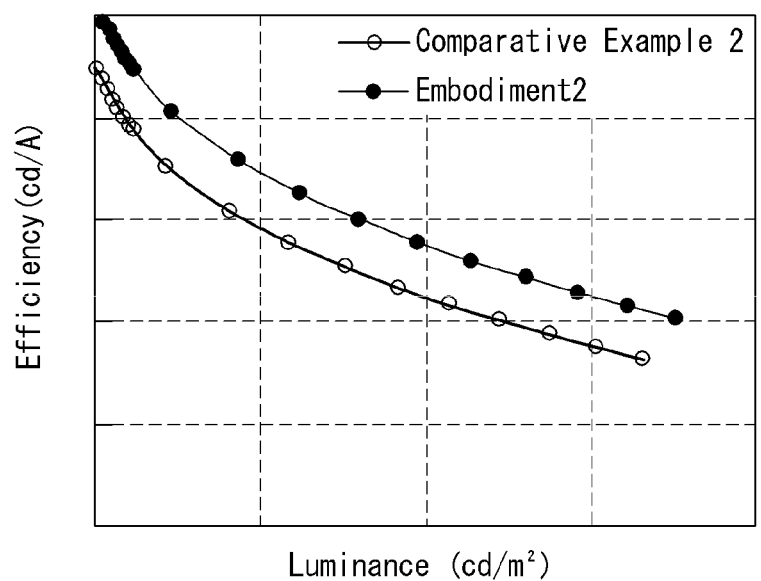
FIG. 8 is a graph of the efficiency vs. luminance of organic light emitting display devices according to Comparative Example 2 and Embodiment 2 of the present disclosure.

Referring to Table 1 and FIGS. 7 and 8, for a stacked OLED structure, Embodiment 2 using Compound Pn2-A07 as the second electron transport layer showed a 0.85% decrease in operating voltage and a 3.21% increase in efficiency, compared to Comparative Example 2 using an anthracene compound as the first to third electron transport layers.

From these results, it can be found out that the use of Compound Pn2-A07 as the electron transport layer reduced the operating voltage of the device and increased the efficiency of the device.

As stated above, the present disclosure includes a compound having one or more nitrogen atoms and a substituent with relatively high electron mobility as at least one of the electron transport layers. This compound is rich in electrons by having at least three or more nitrogen atoms, which results in high electron mobility, making electron transport easy. Moreover, a compound of the present disclosure facilitates electron transport from the electron transport layer to the light emitting layer since it includes a substituent with relatively high electron mobility.

Moreover, an organic light emitting display device according to an exemplary embodiment of the present disclosure includes a compound having one or more nitrogen atoms and a substituent with relatively high electron mobility as at least one of the N-type charge generation layers. This compound includes $sp^2$ hybrid orbital nitrogen (N), and the nitrogen is bound to an alkali metal or alkali earth metal, i.e., a dopant for the N-type charge generation layer, thereby forming a gap state. This gap state may facilitate transfer of electrons from the N-type charge generation layer to the electron transport layer. Accordingly, the organic light emitting display device of the present disclosure may facilitate transfer of electrons from the N-type charge generation layer to the electron transport layer by using a compound of the present disclosure as the N-type charge generation layer.

Accordingly, the organic light emitting display device of the present disclosure allows for efficient electron transfer from the N-type charge generation layer to the light emitting layer and therefore improves the efficiency and performance of the device by using a compound having one or more nitrogen atoms and a substituent with relatively high electron mobility as at least one among the electron transport layers included in the light emitting parts and the N-type charge generation layers. In addition, the present disclosure may diminish the problem of low lifetime due to inefficient electron injection since electron transfer from the N-type charge generation layer to the electron transport layer is facilitated. Furthermore, the present disclosure may diminish the problem of the rise in operating voltage caused when electrons injected into the N-type charge generation layer move to the electron transport layer due to the difference in LUMO energy level between the electron transport layer and the N-type charge generation layer.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device comprising:
at least one light emitting part between an anode and a cathode, and including at least one organic layer and a light emitting layer,
wherein the at least one organic layer includes a compound having three or more nitrogen atoms and a substituent with high electron mobility,
wherein the compound is represented by the following Chemical Formula 1:

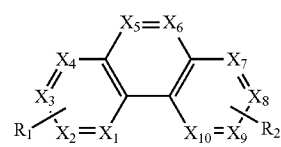

[Chemical Formula 1]

wherein $X_1$ to $X_{10}$ comprise at least three or more N atoms, and $X_1$ to $X_{10}$ with no corresponding N atoms include C atoms, and $R_1$ and $R_2$ include independently one among hydrogen, heavy hydrogen, a halogen atom, a cyano group, a nitro group, an amino group, an amidino group, hydrazine, hydrazone, a carboxyl group and a salt thereof, a sulfonic acid group and a salt thereof, a phosphate group and a salt thereof, a substituted or unsubstituted alkyl group with 1 to 60 carbon atoms, a substituted or unsubstituted alkenyl group with 2 to 60 carbon atoms, a substituted or unsubstituted alkynyl group with 2 to 60 carbon atoms, a substituted or unsubstituted alkoxy group with 1 to 60 carbon atoms, a substituted or unsubstituted cycloalkyl group with 3 to 60 carbon atoms, an aromatic ring compound with 5 to 50 carbon atoms or a heterocyclic compound having one or more atoms among N, S, O, or Si with 3 to 50 carbon atoms, and wherein $R_1$ and $R_2$ include independently one among the following groups:

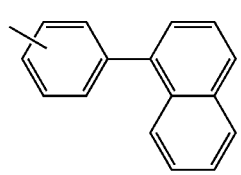

A-01

-continued
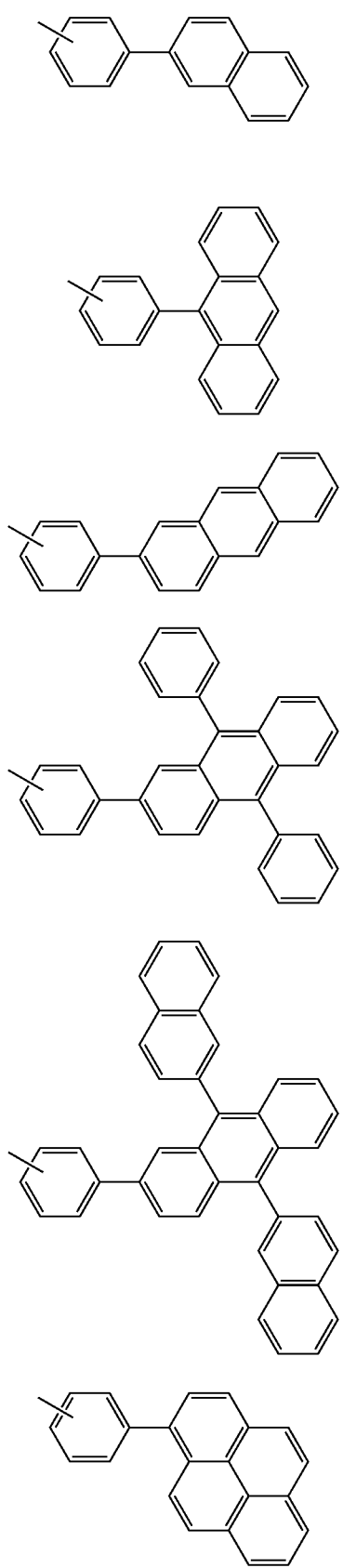
A-02
A-03
A-04
A-05
A-06
A-07
-continued
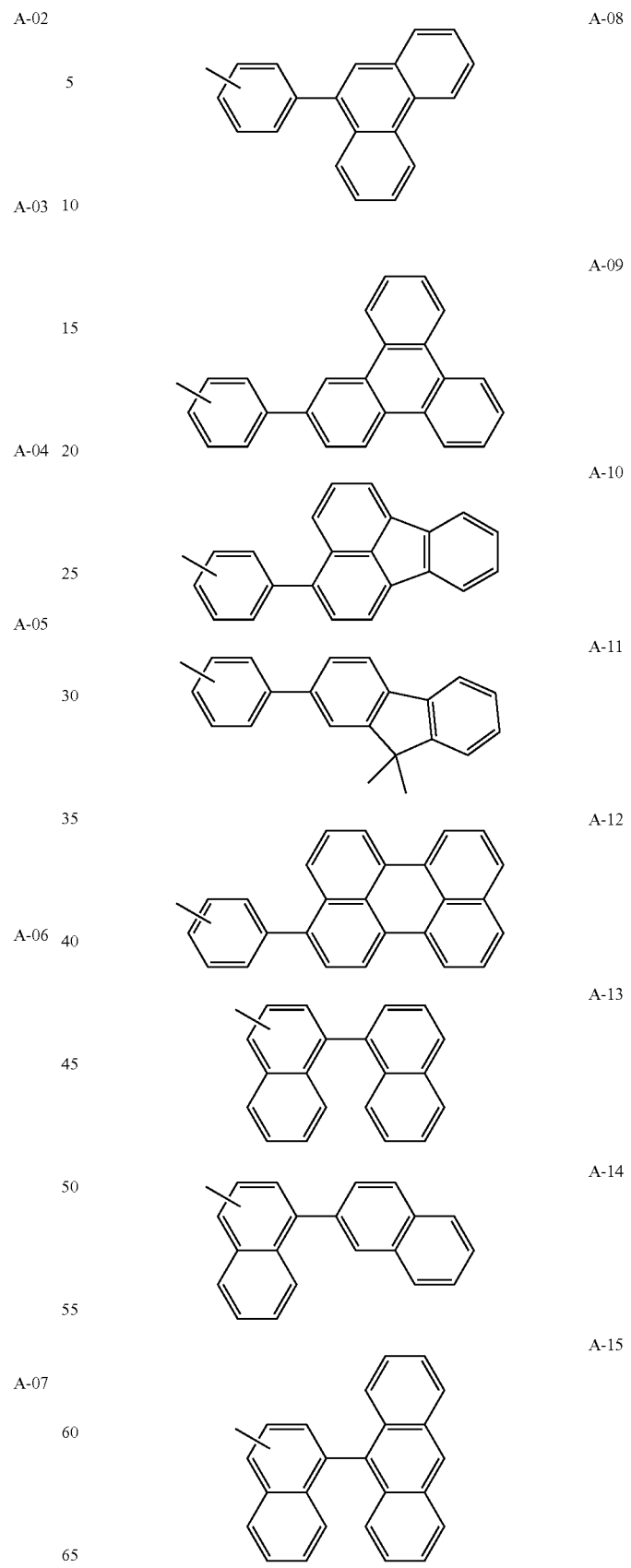
A-08
A-09
A-10
A-11
A-12
A-13
A-14
A-15

A-16
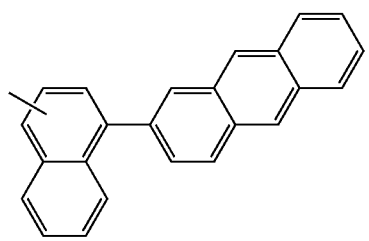
A-17
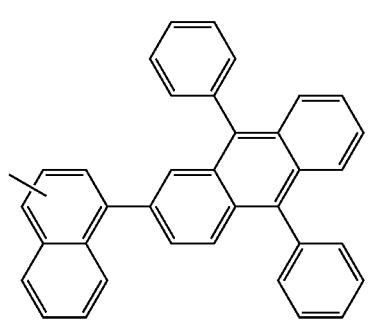
A-18
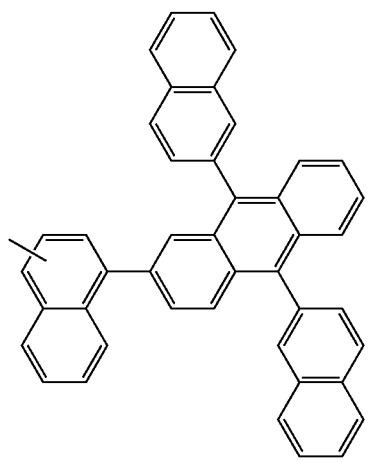
A-19
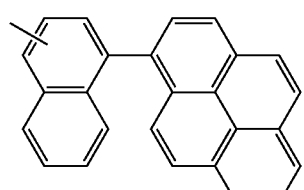
A-20
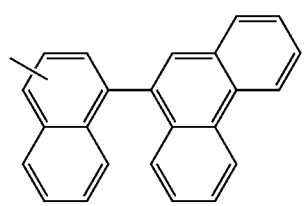
A-21
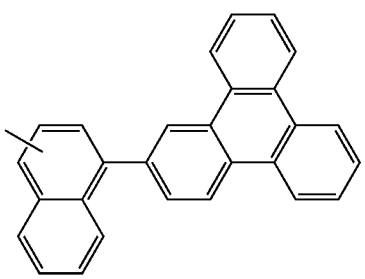
A-22
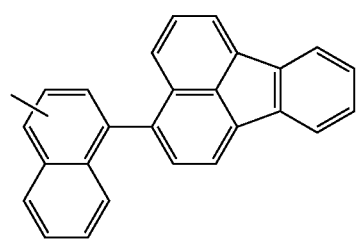
A-23
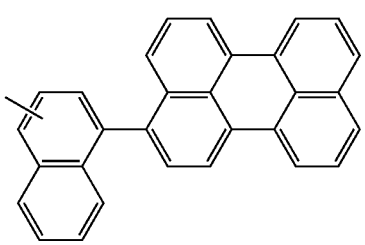
A-24
wherein
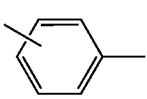
includes one among
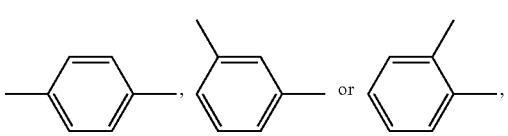
A-25

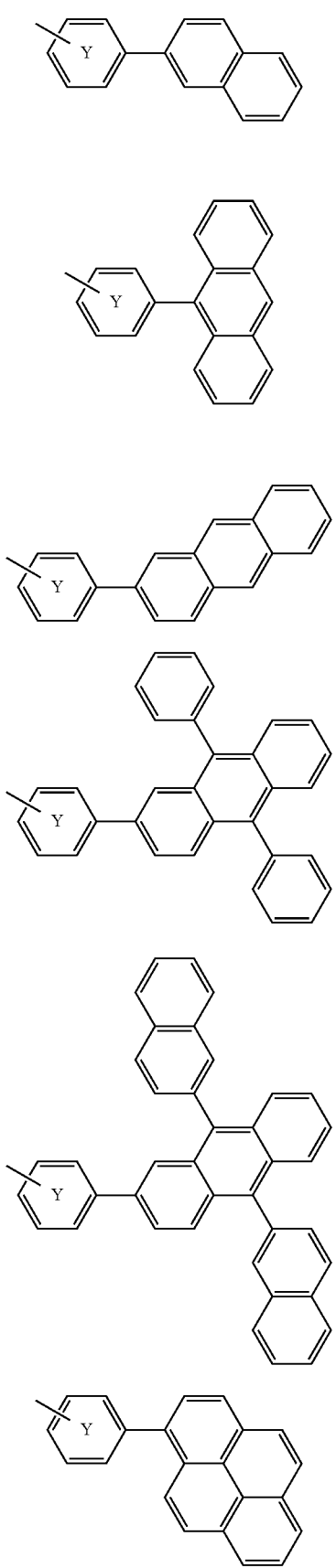
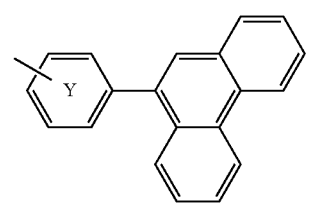
A-32
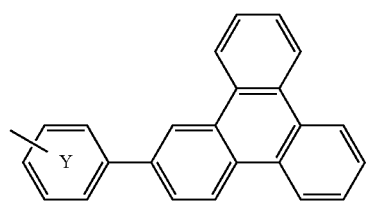
A-33
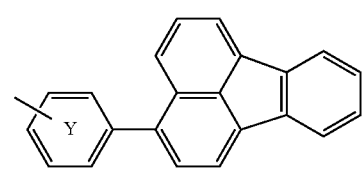
A-34
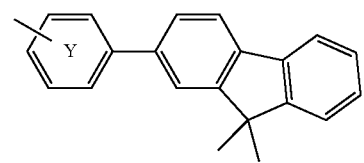
A-35
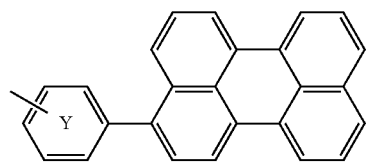
A-36
wherein if Y is N in
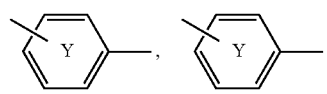
includes one among
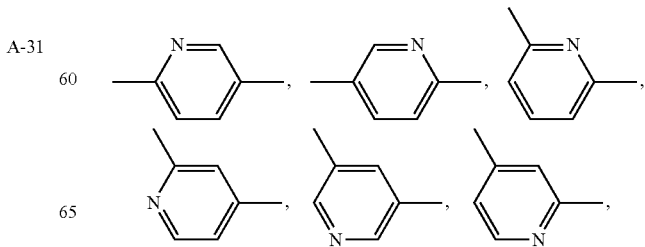

-continued
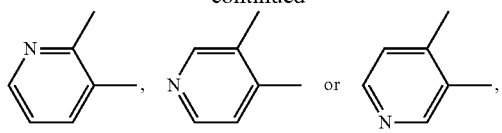
and
wherein if Y is P in
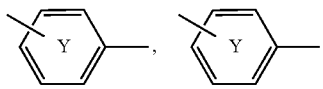
includes one among
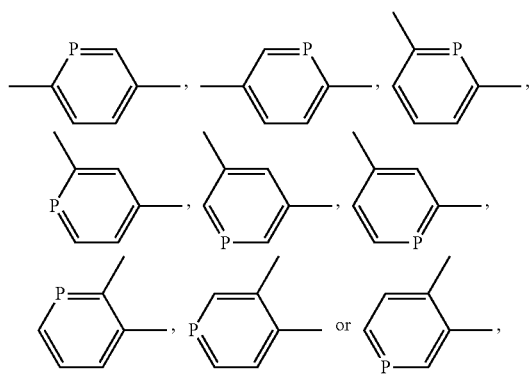
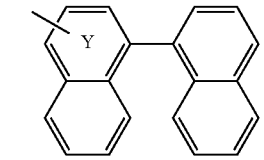
A-37
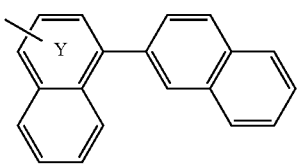
A-38
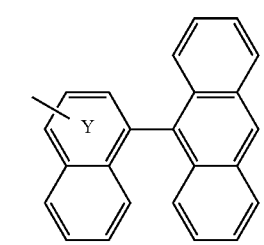
A-39
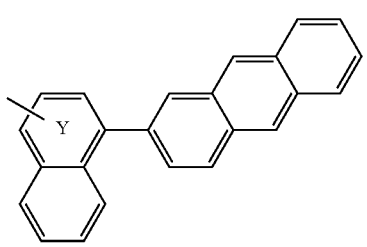
A-40
-continued
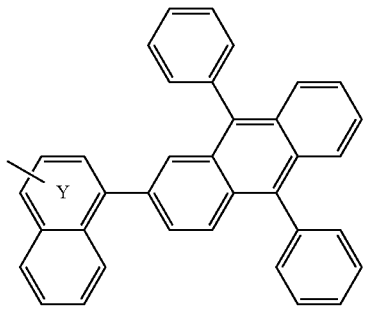
A-41
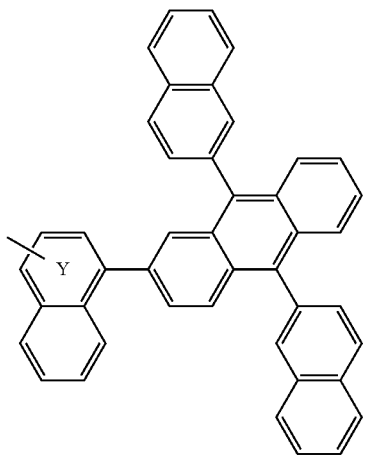
A-42
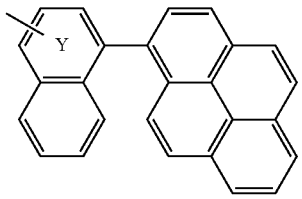
A-43
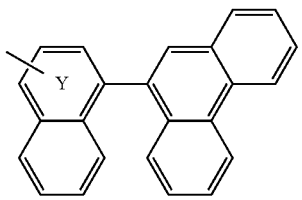
A-44
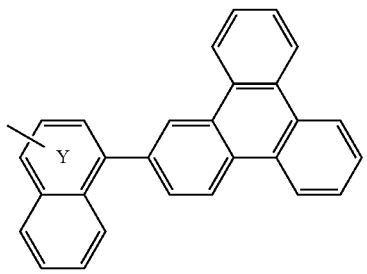
A-45

-continued
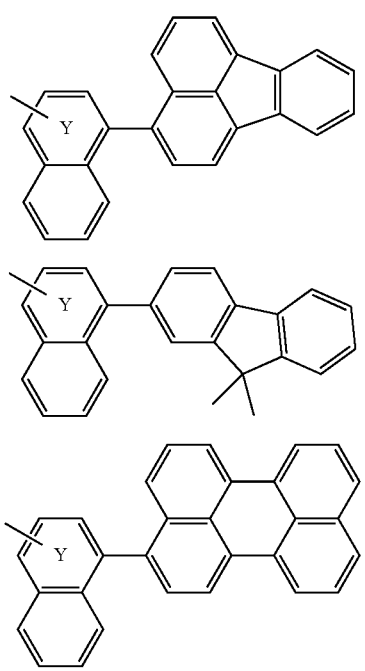
wherein if Y is N
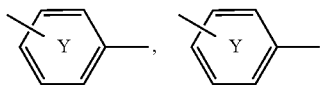
includes one among
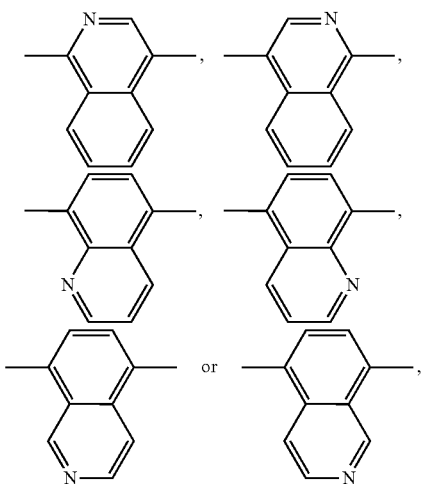
and
wherein if Y is P in
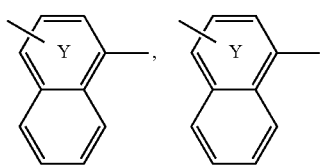
includes one among
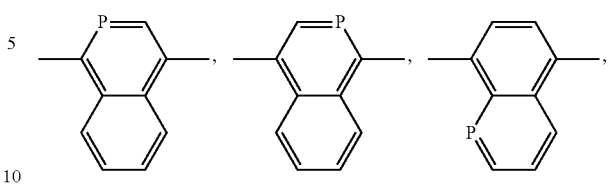
A-46
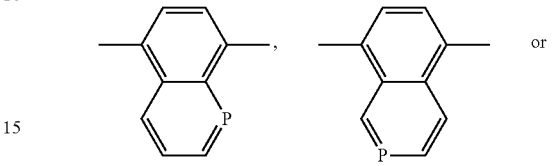
A-47
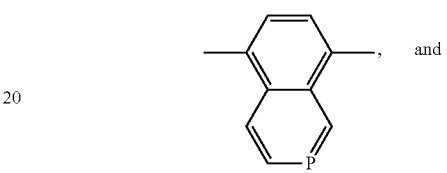
A-48
and
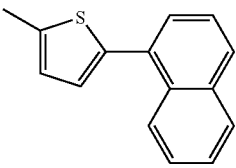
A-49
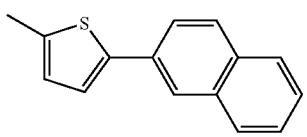
A-50
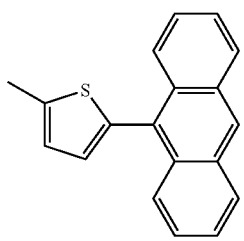
A-51
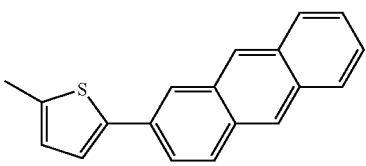
A-52
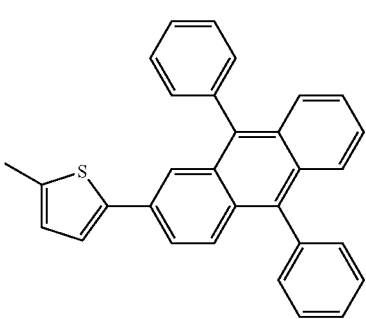
A-53

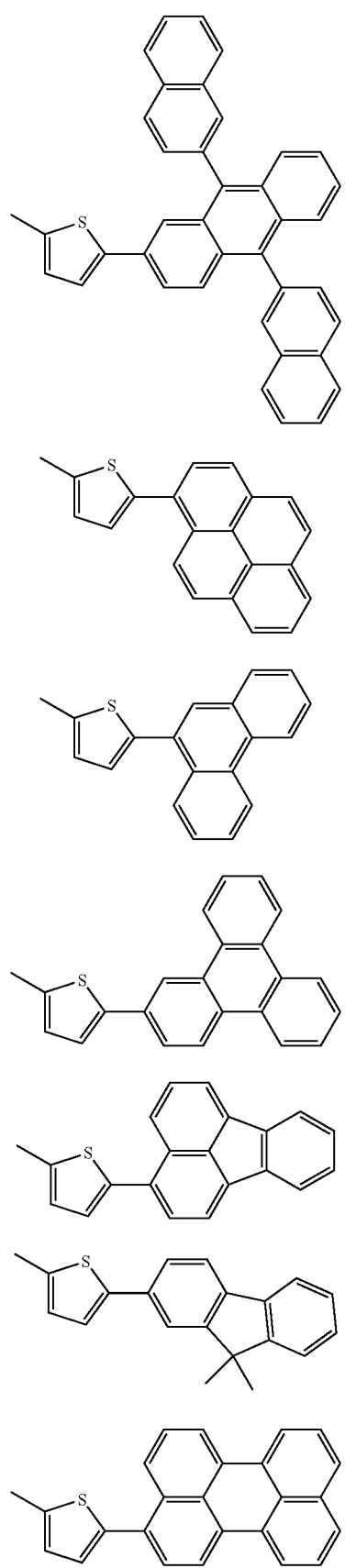
A-54
A-55
A-56
A-57
A-58
A-59
A-60
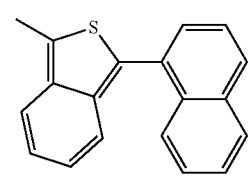
A-61
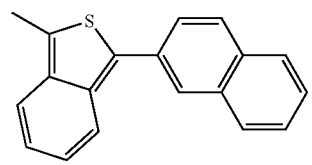
A-62
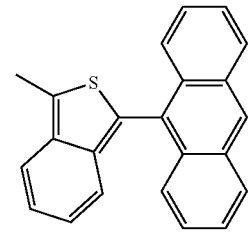
A-63
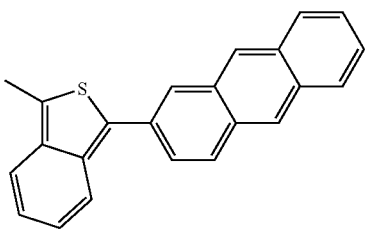
A-64
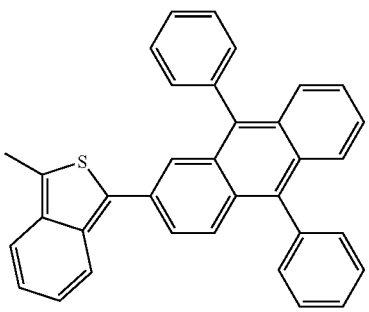
A-65
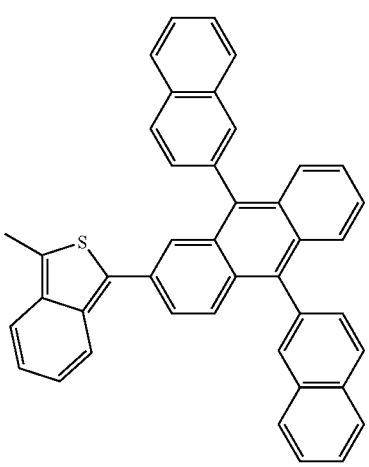
A-66

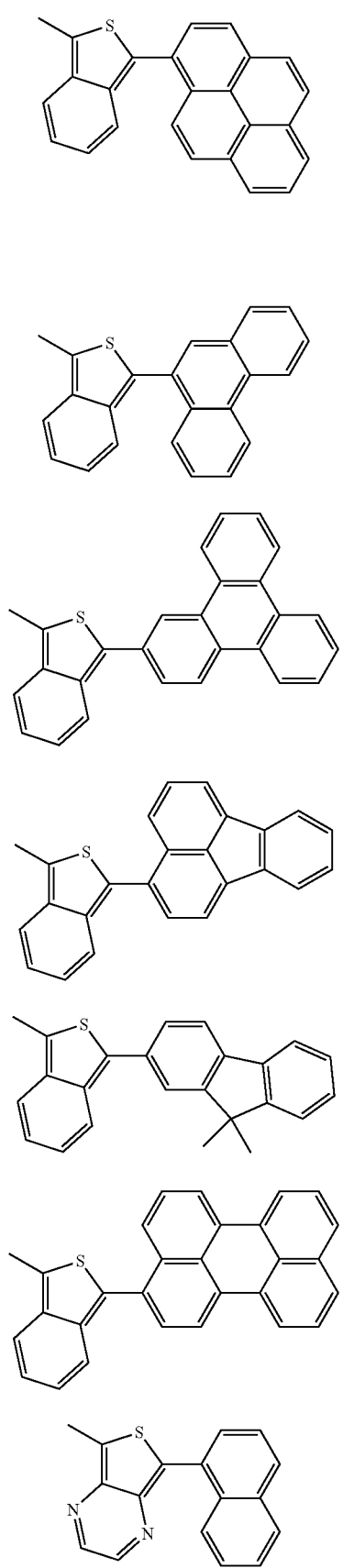
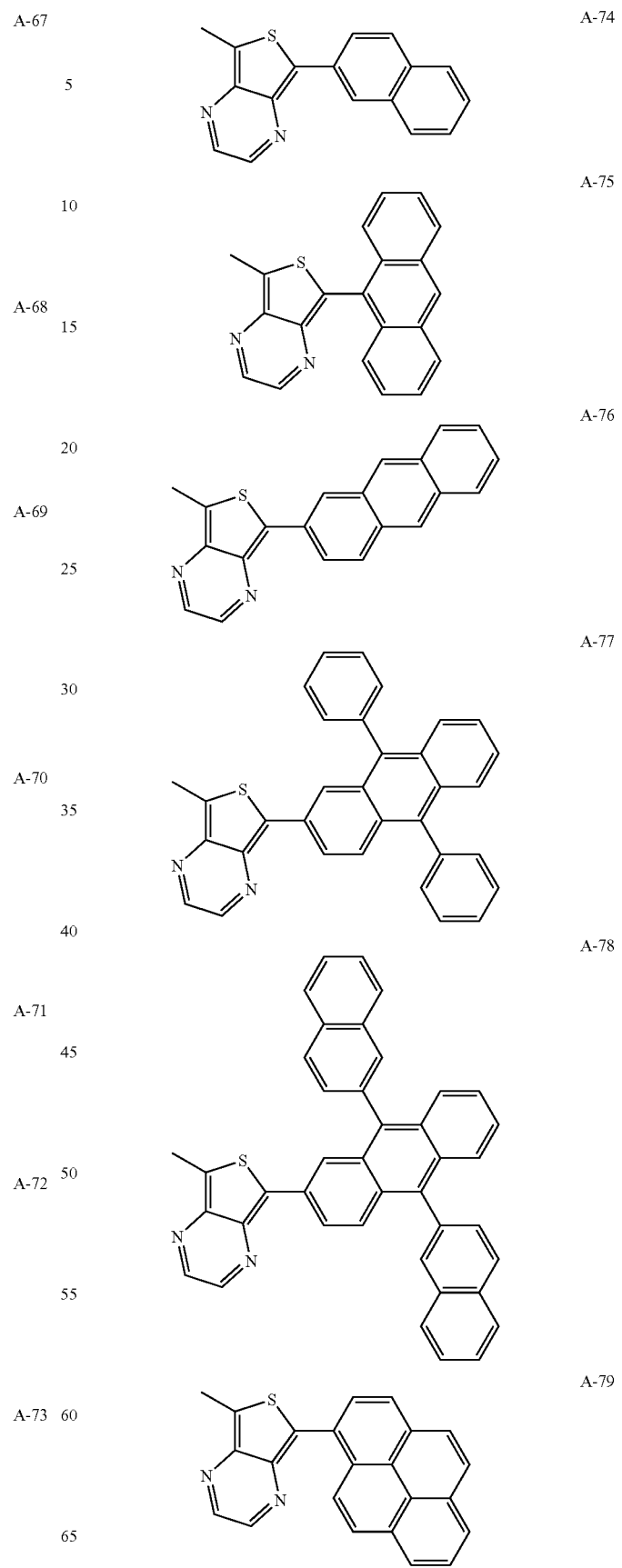

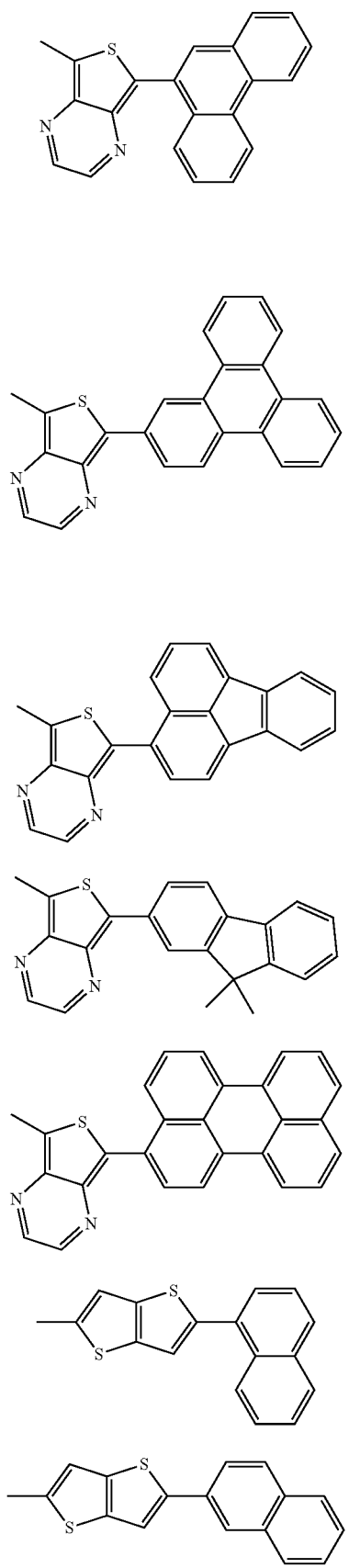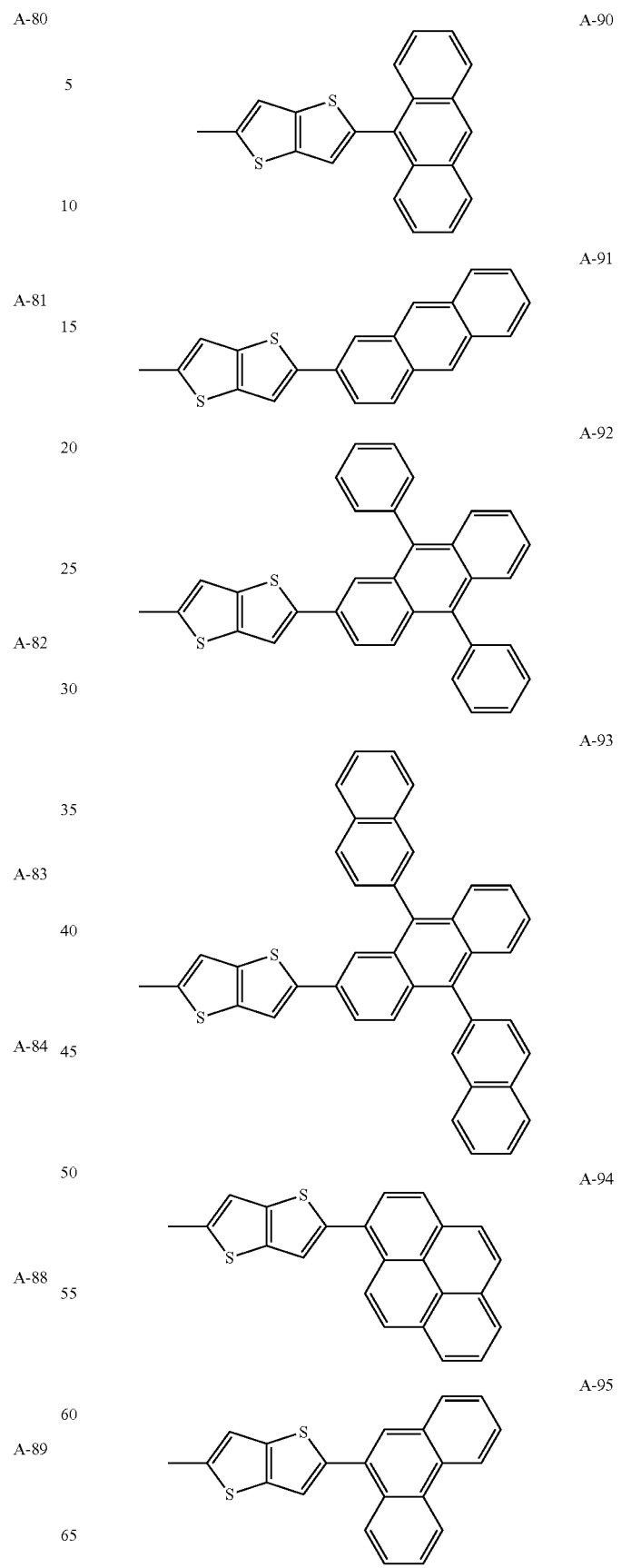

-continued

A-96
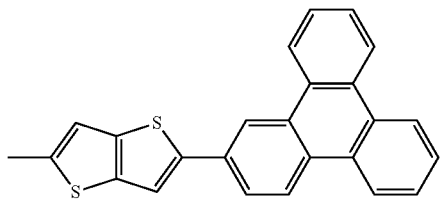

A-98
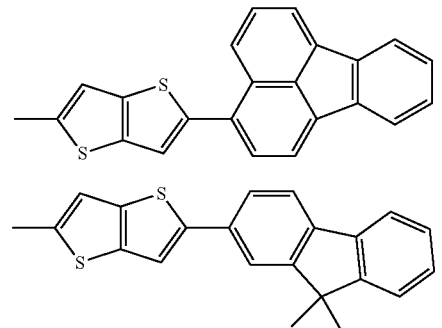

A-99

A-100
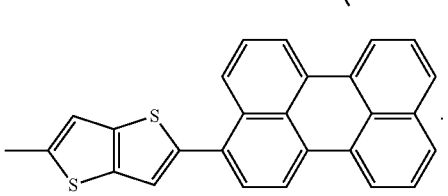

2. The organic light emitting display device of claim 1, wherein the at least one organic layer includes at least one electron transport layer or at least one N-type charge generation layer.

3. The organic light emitting display device of claim 1, wherein the compound includes at least three or more nitrogen atoms and the substituent with high electron mobility includes at least one substituent, and the at least three or more nitrogen atoms or the at least one substituent with high electron mobility enables electron transfer from the organic layer to the light emitting layer.

4. The organic light emitting display device of claim 1, wherein the at least one light emitting part comprises two or more light emitting parts, and any one of the two or more light emitting parts includes a blue light emitting part, and another one of the two or more light emitting parts includes a yellow-green light emitting part.

5. The organic light emitting display device of claim 4, wherein the at least one organic layer includes an electron transport layer that included in the yellow-green light emitting part.

6. The organic light emitting display device of claim 1, wherein the compound includes one among the following compounds:

Pn-1
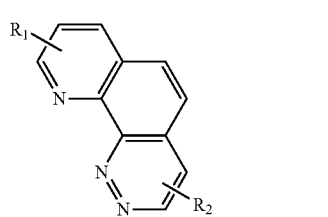

-continued

Pn-2
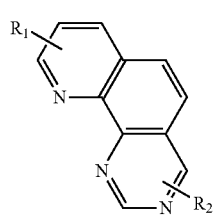

Pn-3
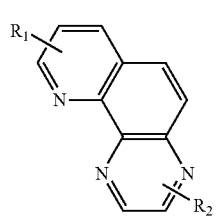

Pn-4
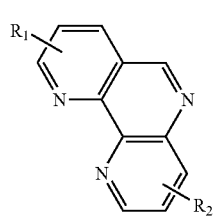

Pn-5
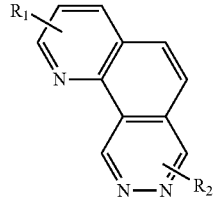

Pn-6
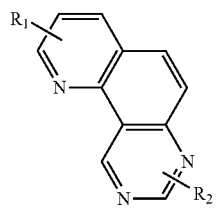

Pn-7
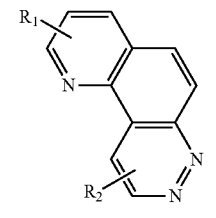

Pn-8
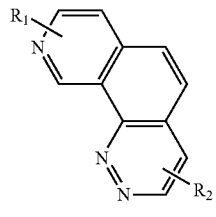

| | |
|---|---|
| 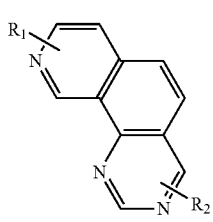 Pn-9 | 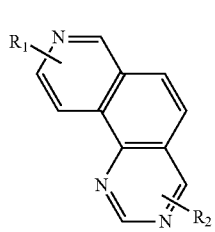 Pn-16 |
| 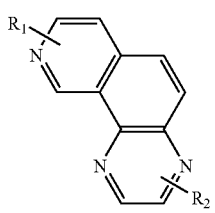 Pn-10 | 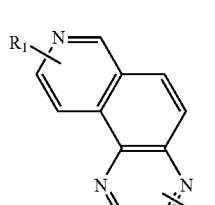 Pn-17 |
| 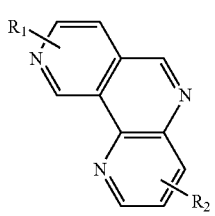 Pn-11 | 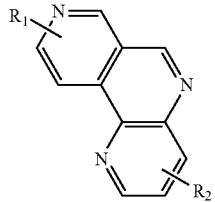 Pn-18 |
| 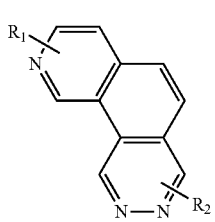 Pn-12 | 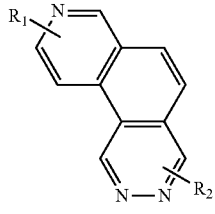 Pn-19 |
| 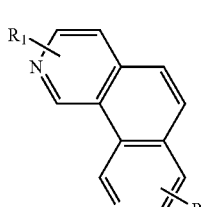 Pn-13 | 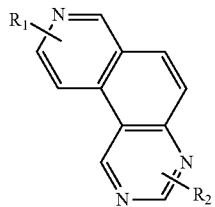 Pn-20 |
| 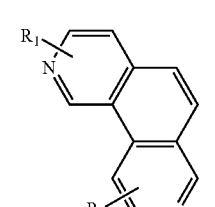 Pn-14 | 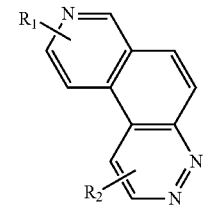 Pn-21 |
| 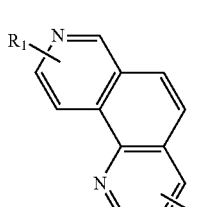 Pn-15 | 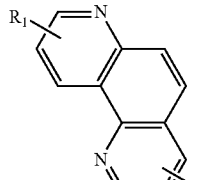 Pn-22 |

Pn-23
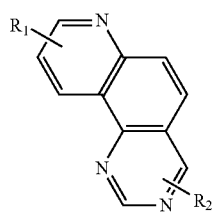
Pn-24
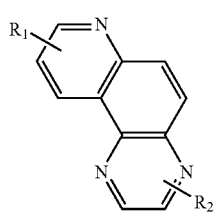
Pn-25
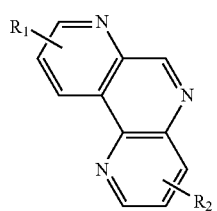
Pn-26
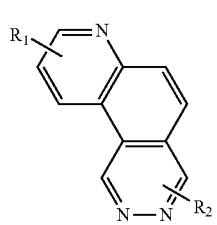
Pn-27
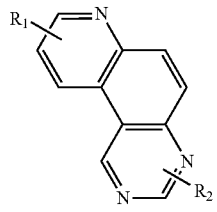
Pn-28
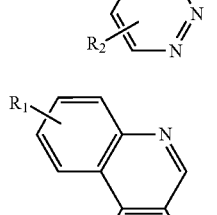
Pn-29
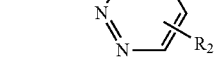
Pn-30
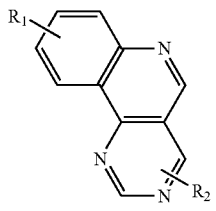
Pn-31
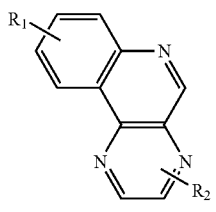
Pn-32
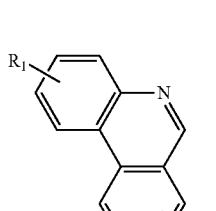
Pn-33
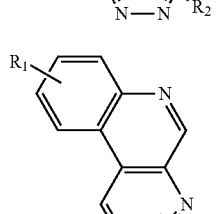
Pn-34
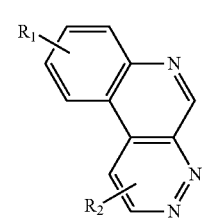
Pn-35
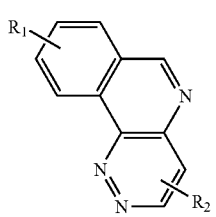
Pn-36
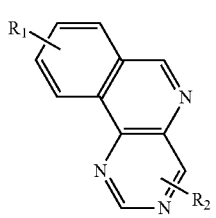

Pn-37

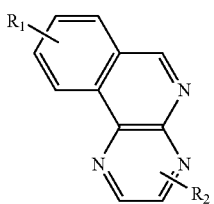

Pn-38

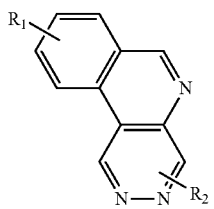

Pn-39

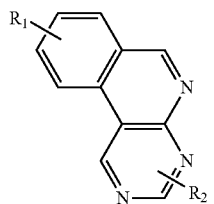

Pn-40

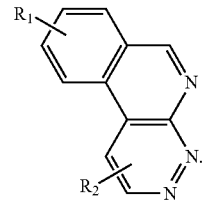

7. The organic light emitting display device of claim 1, wherein the compound includes one among the following compounds:

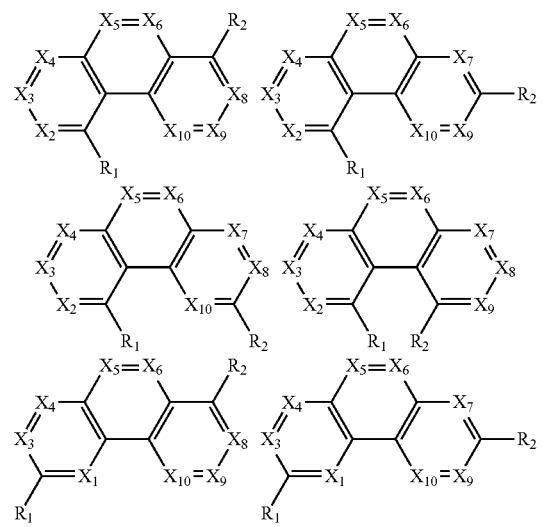

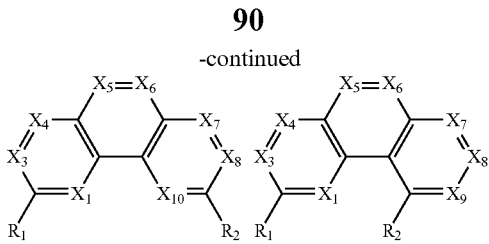

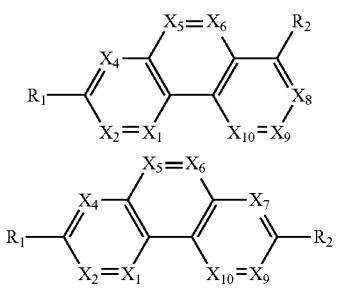

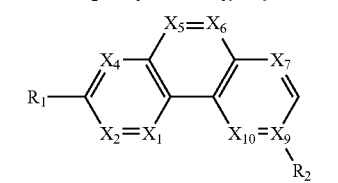

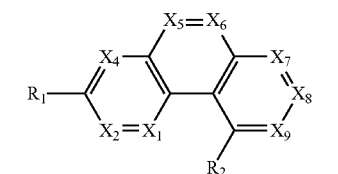

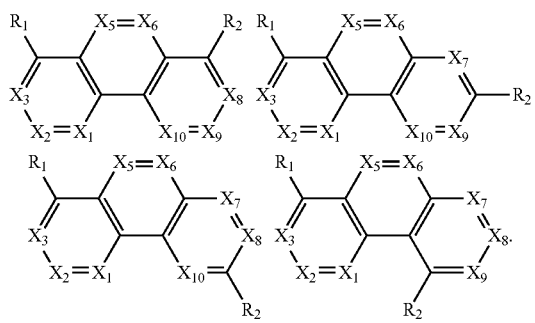

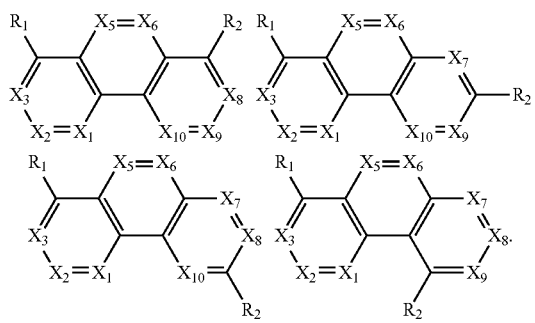

8. An organic light emitting display device comprising:

first and second electrodes facing each other on a substrate; and at least two light emitting parts between the first and second electrodes and each comprising a light emitting layer to emit light of a particular color, the organic light emitting display device further comprising:

a charge generation layer for adjusting charge balance between the light emitting parts; and an electron transport layer between the light emitting layer and the charge generation layer, wherein the electron transport layer includes a compound having three or more nitrogen-atoms and a substituent with high electron mobility, wherein the compound is represented by the following Chemical Formula 1:

[Chemical Formula 1]

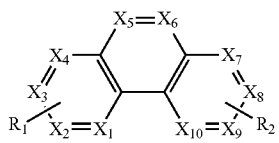

wherein $X_1$ to $X_{10}$ comprise at least three or more N atoms, and $X_1$ to $X_{10}$ with no corresponding N atoms include C atoms, and $R_1$ and $R_2$ include independently one among hydrogen, heavy hydrogen, a halogen atom, a cyano group, a nitro group, an amino group, an amidino group, hydrazine, hydrazone, a carboxyl group and a salt thereof, a sulfonic acid group and a salt thereof, a phosphate group and a salt thereof, a substituted or unsubstituted alkyl group with 1 to 60 carbon atoms, a substituted or unsubstituted alkenyl group with 2 to 60 carbon atoms, a substituted or unsubstituted alkynyl group with 2 to 60 carbon atoms, a substituted or unsubstituted alkoxy group with 1 to 60 carbon atoms, a substituted or unsubstituted cycloalkyl group with 3 to 60 carbon atoms, an aromatic ring compound with 5 to 50 carbon atoms or a heterocyclic compound having one or more atoms among N, S, O, or Si with 3 to 50 carbon atoms, and wherein $R_1$ and $R_2$ include independently one among the following groups:

A-01
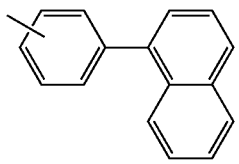

A-02
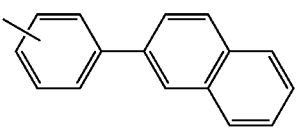

A-03
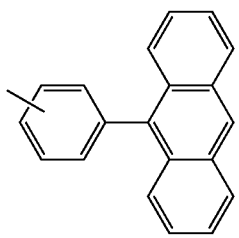

A-04
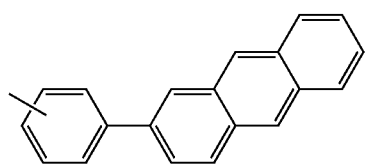

A-05
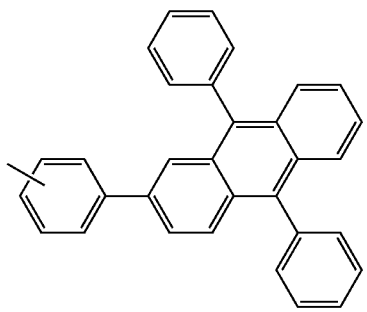

A-06
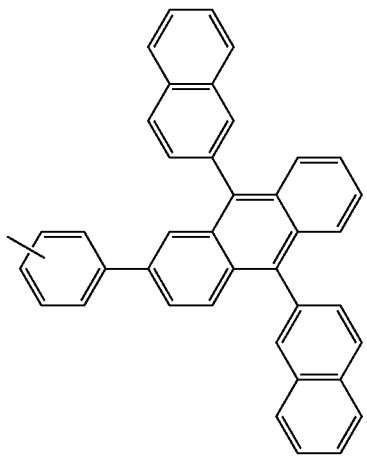

A-07
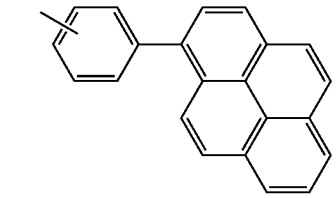

A-08
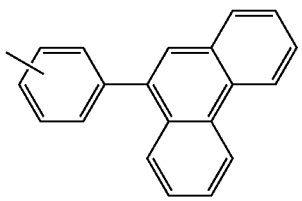

A-09
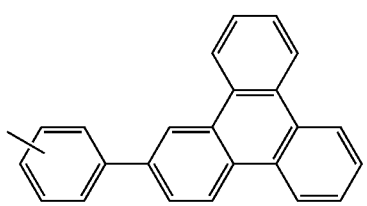

A-10
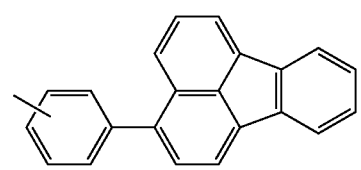

-continued
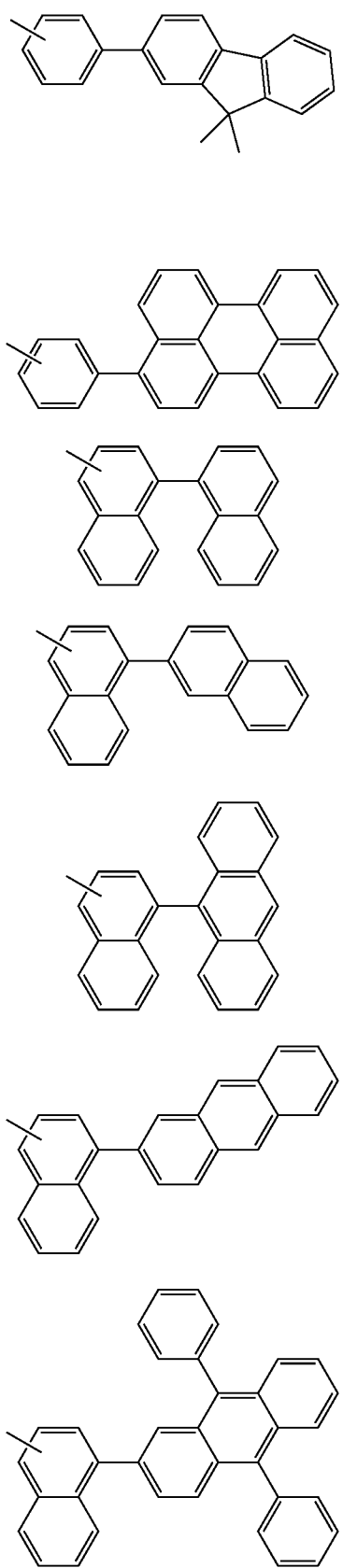
A-11
A-12
A-13
A-14
A-15
A-16
A-17
-continued
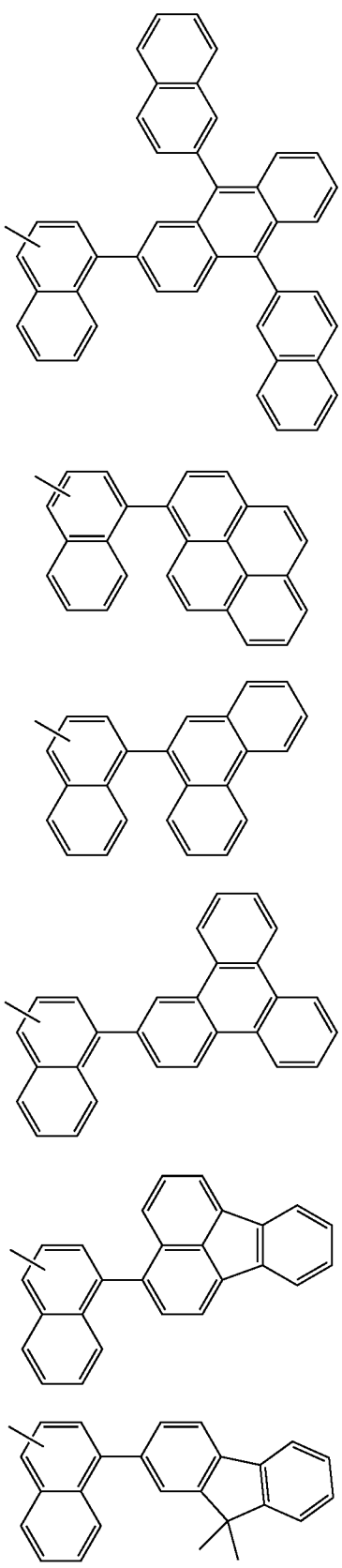
A-18
A-19
A-20
A-21
A-22
A-23

A-24
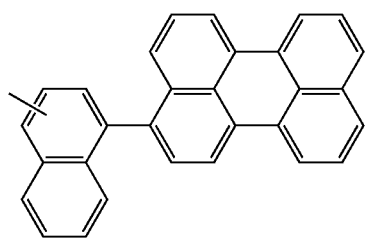
wherein
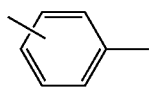
includes one among
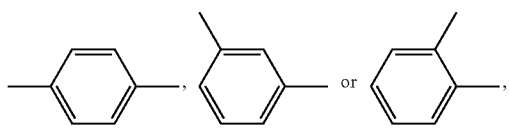
A-25
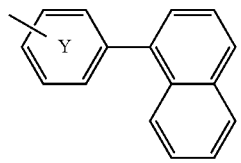
A-26
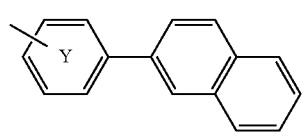
A-27
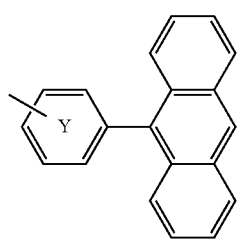
A-28
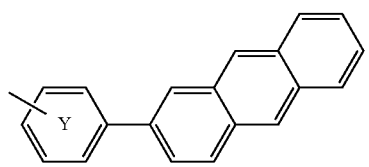
A-29
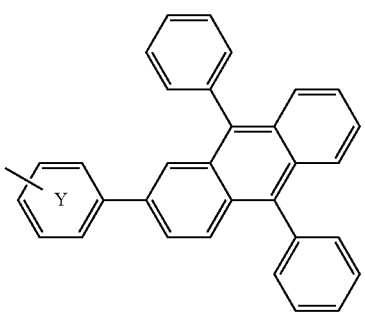
A-30
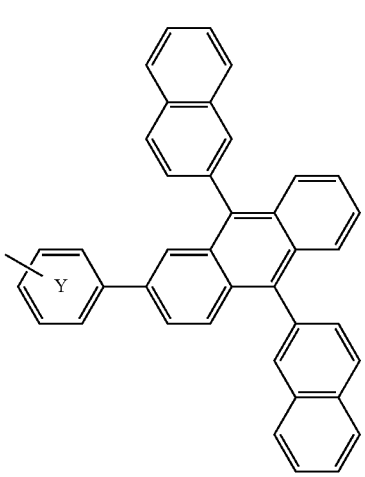
A-31
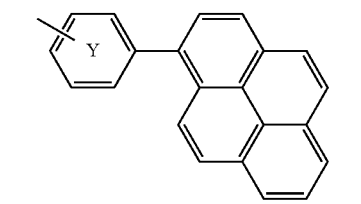
A-32
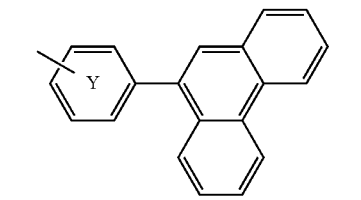
A-33
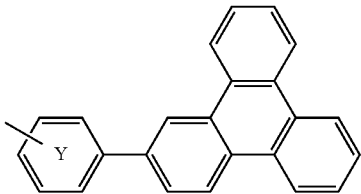
A-34
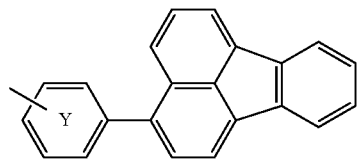

A-35 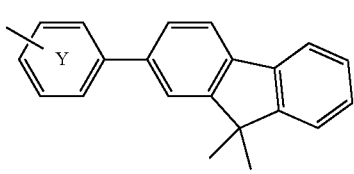
A-36 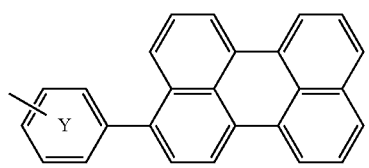
wherein if Y is N in
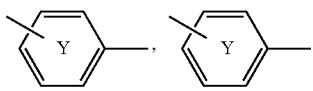
includes one among
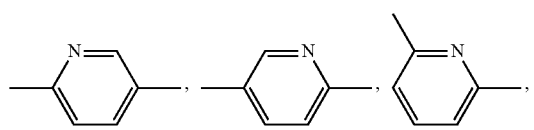
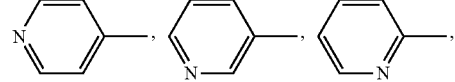
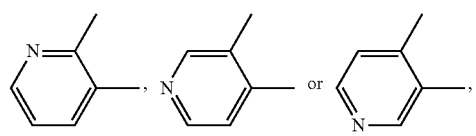
and
wherein if Y is P in
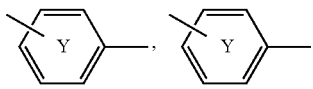
includes one among
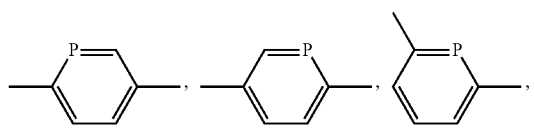
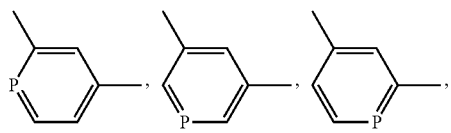
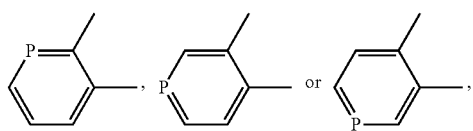
A-37 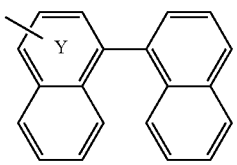
A-38 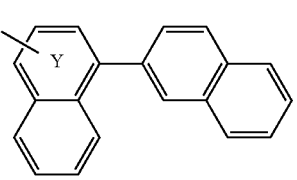
A-39 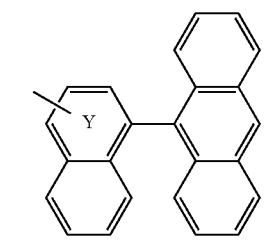
A-40 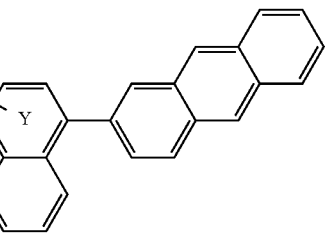
A-41 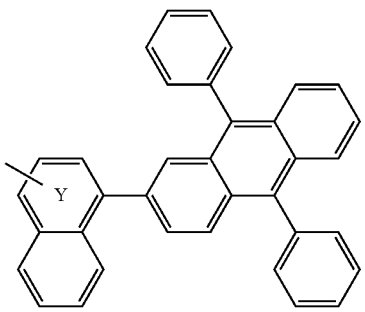

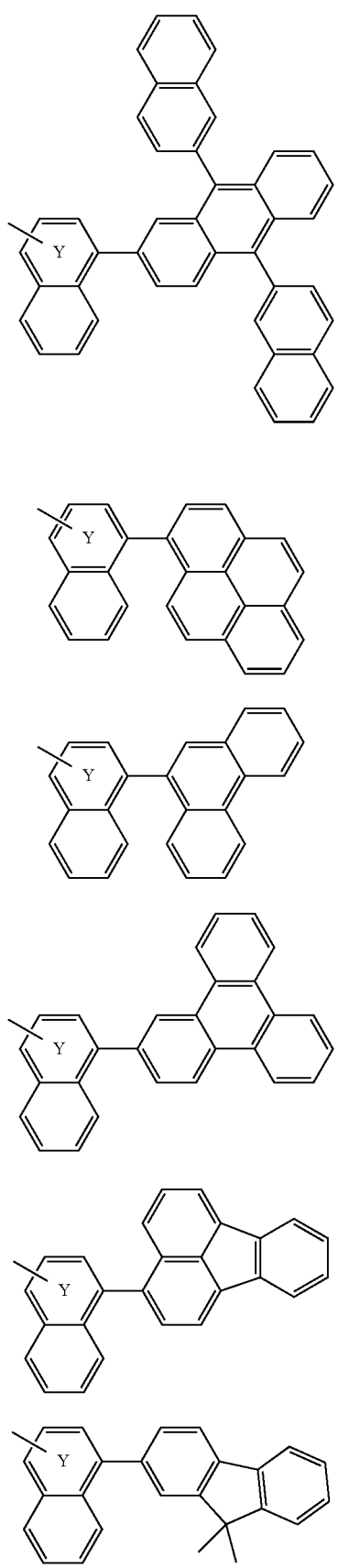
A-42
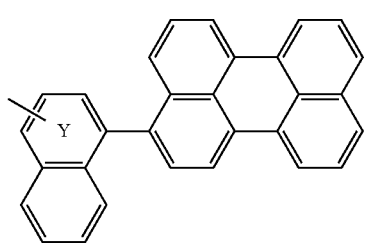
wherein if Y is N
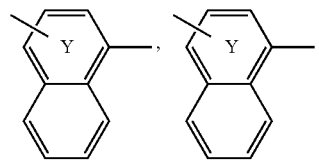
includes one among
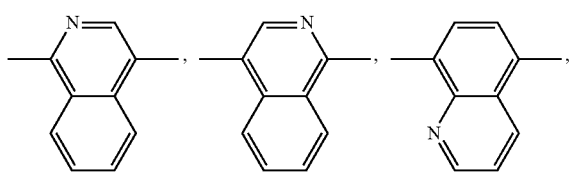
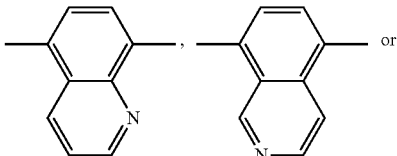
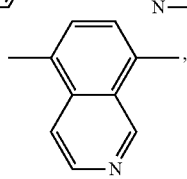
and
wherein if Y is P in
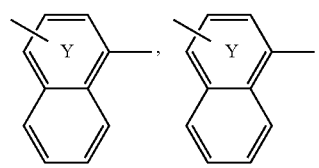
includes one among
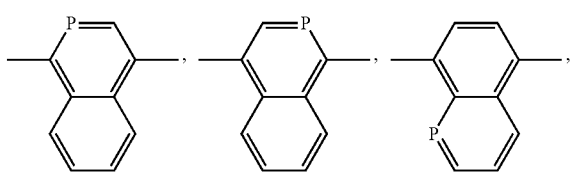

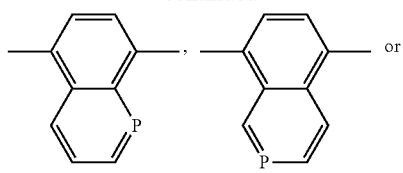
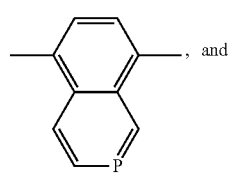
A-49
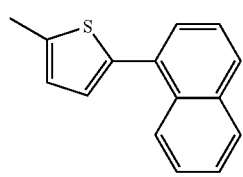
A-50
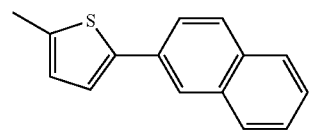
A-51
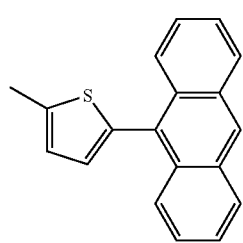
A-52
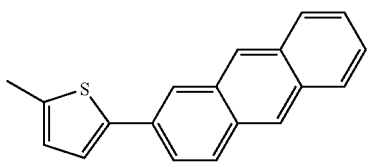
A-53
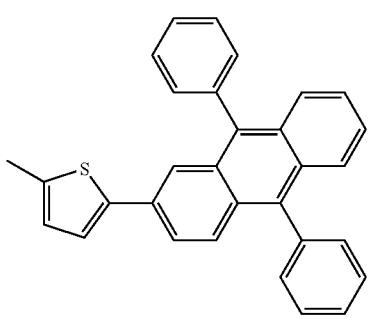
A-54
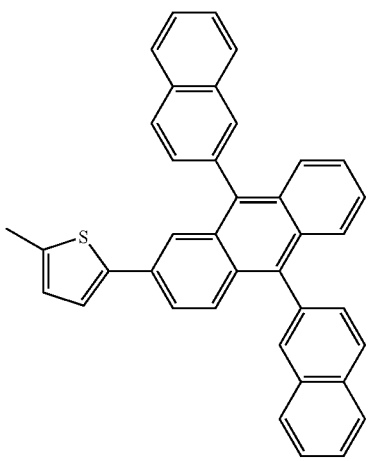
A-55
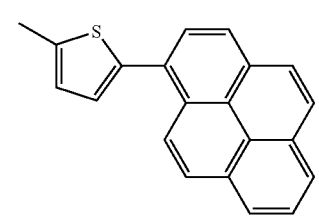
A-56
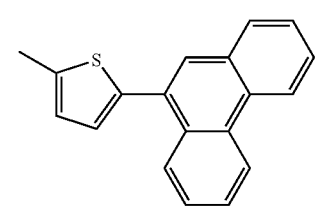
A-57
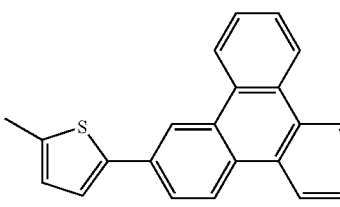
A-58
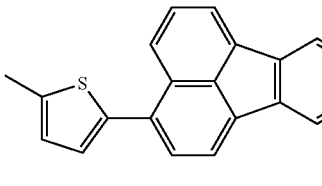
A-59
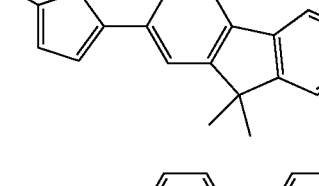
A-60
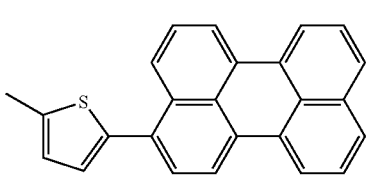

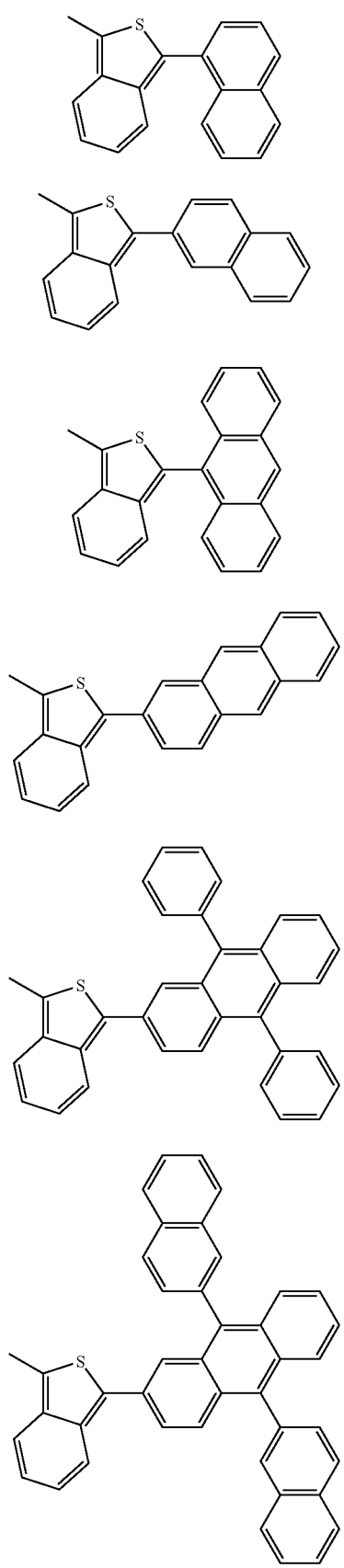
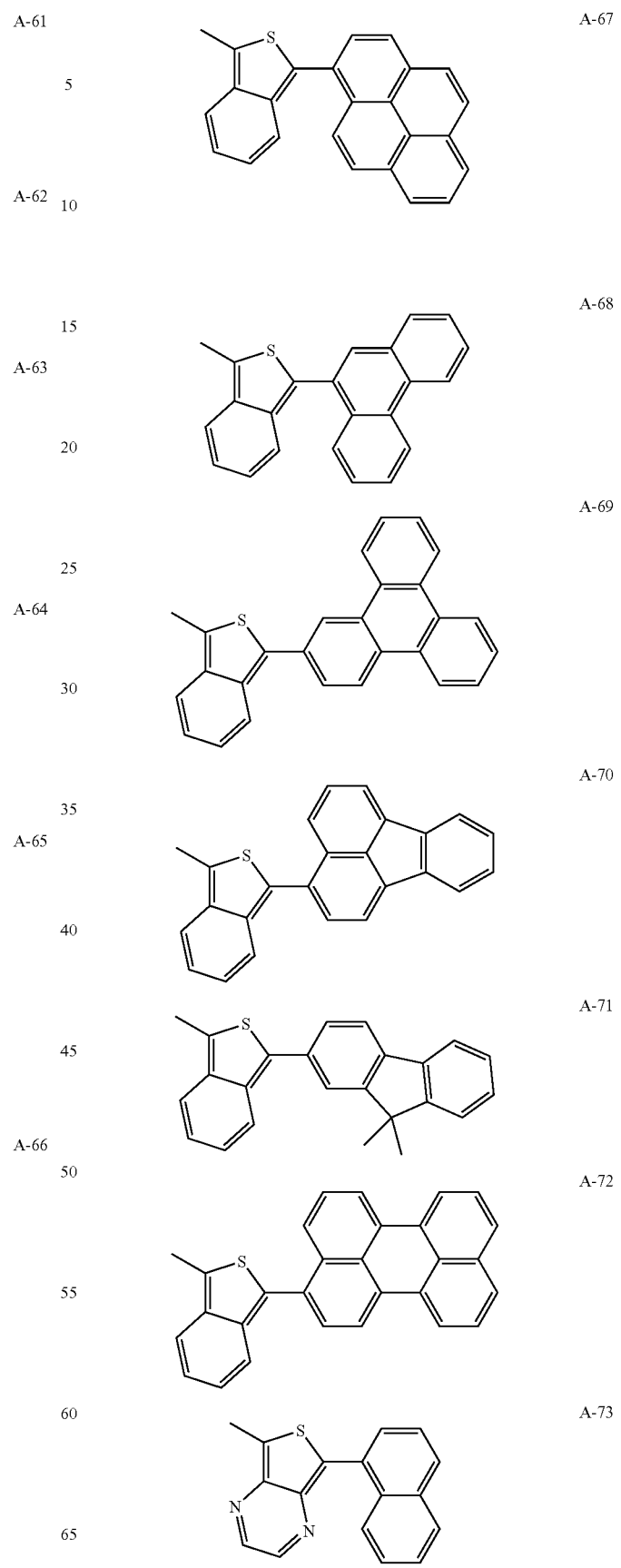

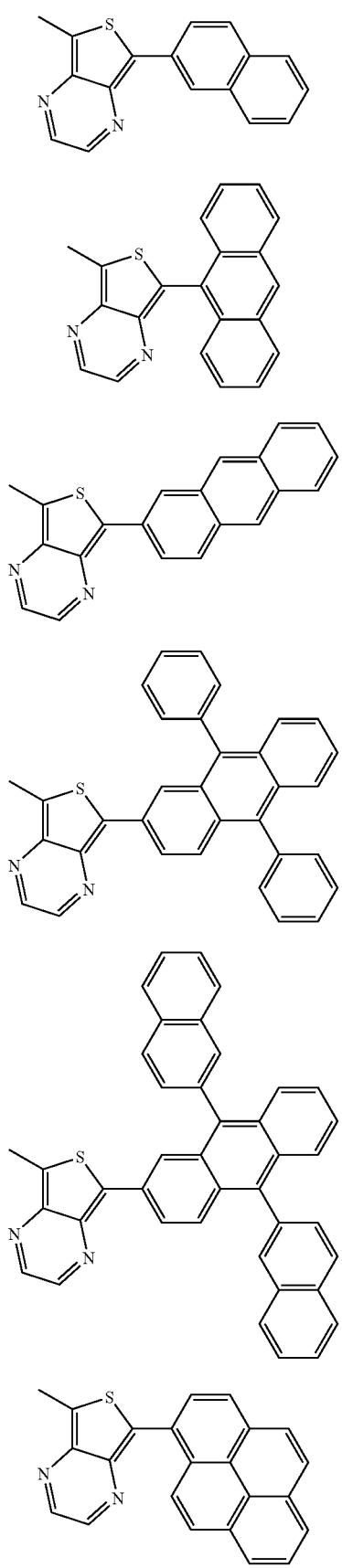
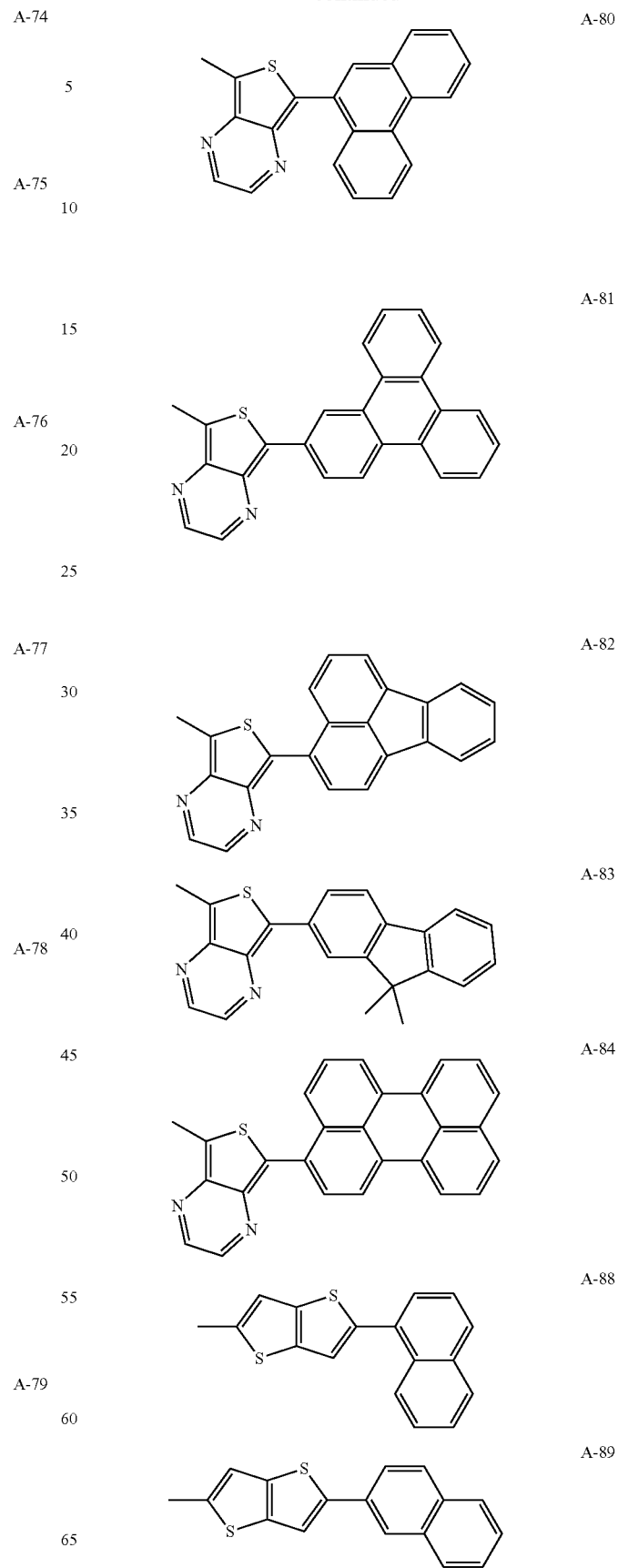

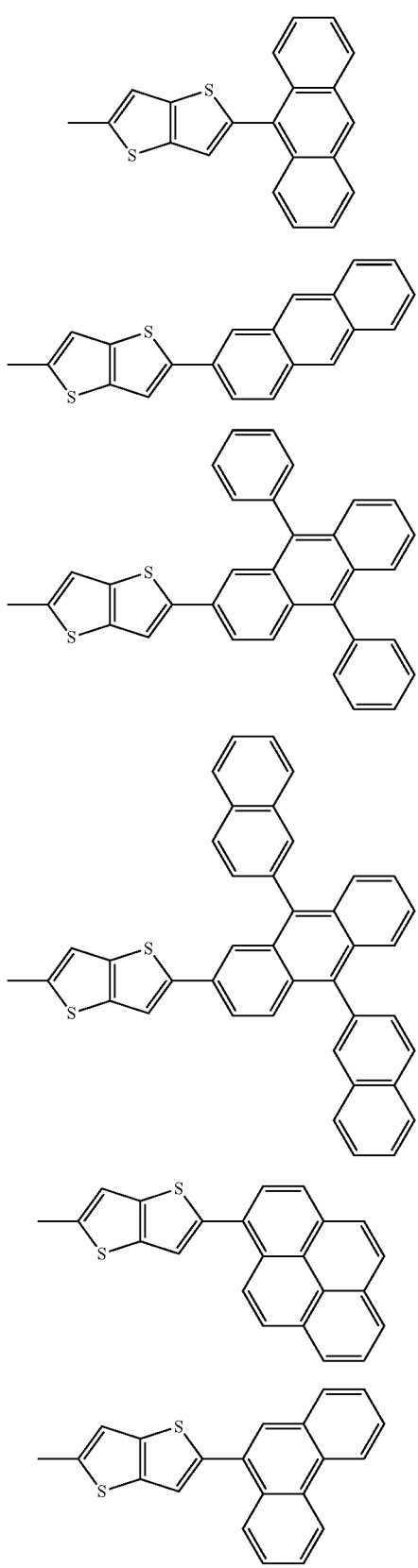

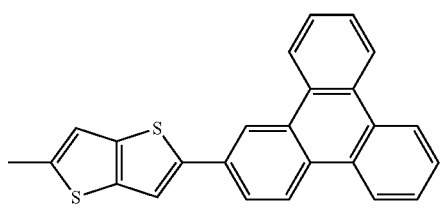

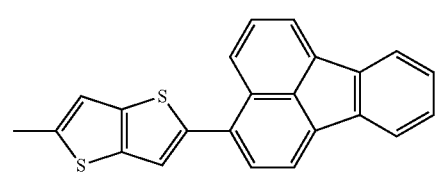

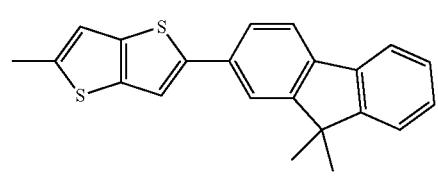

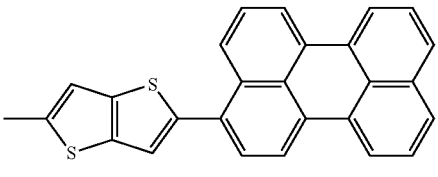

9. The organic light emitting display device of claim 8, wherein the organic light emitting display device having the electron transport layer comprising the compound improves electron injection toward the first electrode and hole injection toward the second electrode, thereby leading to a reduction in operating voltage and an increase in light emission efficiency.

10. The organic light emitting display device of claim 8, wherein the compound includes at least three or more nitrogen atoms and the substituent with high electron mobility includes at least one substituent.

11. The organic light emitting display device of claim 8, wherein the charge generation layer comprises the same compound as the electron transport layer.

12. The organic light emitting display device of claim 11, wherein the organic light emitting display device having the charge generation layer or electron transport layer comprising the compound improves electron injection toward the first electrode and hole injection toward the second electrode, thereby leading to a relative reduction in operating voltage and a relative increase in light emission efficiency.

* * * * *